US006260949B1

(12) United States Patent
Smith et al.

(10) Patent No.: US 6,260,949 B1
(45) Date of Patent: Jul. 17, 2001

(54) PHOTORESIST COMPOSITIONS FOR INK JET PRINTHEADS

(75) Inventors: Thomas W. Smith, Penfield; David J. Luca, Rochester; Kathleen M. McGrane, Webster, all of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/590,927

(22) Filed: Jun. 9, 2000

Related U.S. Application Data

(62) Division of application No. 09/217,330, filed on Dec. 21, 1998, now Pat. No. 6,139,920.

(51) Int. Cl.[7] ............................ B41J 2/015; G03F 7/038; C08L 63/10; C08L 61/16; C08L 71/12; C08L 79/06; C08L 81/06
(52) U.S. Cl. ............................ 347/44; 347/20; 347/45; 430/270.1; 430/280.1; 522/100; 522/111; 522/142; 522/143; 522/79; 522/146; 525/391; 525/392; 525/396; 525/401; 525/471
(58) Field of Search ........................ 522/35, 79, 100, 522/103, 109, 110, 111, 112, 142, 162, 163, 164, 165, 166; 525/391, 396, 401, 404, 407, 471; 528/87; 427/510, 520; 216/27; 347/44, 20, 45; 264/494, 496; 430/270.1, 280.1

(56) References Cited

U.S. PATENT DOCUMENTS

| 4,086,209 | * | 4/1978 | Hara et al. . |
| 4,667,010 | * | 5/1987 | Eldin . |
| 4,739,032 | * | 4/1988 | Jones . |
| 5,449,704 | * | 9/1995 | Thompson et al. . |
| 5,578,417 | * | 11/1996 | Noguchi et al. . |
| 5,738,799 | * | 4/1998 | Hawkins et al. . |
| 5,849,460 | * | 12/1998 | Kawai et al. . |
| 5,958,995 | * | 9/1999 | Narang et al. . |

FOREIGN PATENT DOCUMENTS 0 663 411 A1 * 7/1995 (EP) .
0 827 033 A2 * 3/1998 (EP) .

OTHER PUBLICATIONS

P. Roberts–McDaniel et al., "Poly(arylene ether co–imidazoles)s as Toughness Modifiers for Epoxy Resins", POlymer Preprints, pp. 543–544. (No date).*

* cited by examiner

Primary Examiner—Susan W. Berman
(74) Attorney, Agent, or Firm—Judith L. Byorick

(57) ABSTRACT

Disclosed is a composition comprising a blend of (a) a thermally reactive polymer selected from the group consisting of resoles, novolacs, thermally reactive polyarylene ethers, and mixtures thereof; and (b) a photoreactive epoxy resin that is photoreactive in the absence of a photocationic initiator.

21 Claims, 3 Drawing Sheets

PHOTORESIST COMPOSITIONS FOR INK JET PRINTHEADS

This application is a divisional of application Ser. No. 09,217,330, filed Dec. 21, 1998 now U.S. Pat. No. 6,139,920.

BACKGROUND OF THE INVENTION

The present invention is directed to curable compositions having improved characteristics. The present invention is also directed to improved photoresist compositions and to improved thermal ink jet printheads. One embodiment of the present invention is directed to a composition comprising a blend of (a) a thermally reactive polymer selected from the group consisting of resoles, novolacs, thermally reactive polyarylene ethers, and mixtures thereof; and (b) a photoreactive epoxy resin that is photoreactive in the absence of a photocationic initiator. Another embodiment of the present invention is directed to a process which comprises the steps of (a) providing a composition comprising (i) a thermally reactive polymer selected from the group consisting of resoles, novolacs, thermally reactive polyarylene ethers, and mixtures thereof; and (ii) a photoreactive epoxy resin that is photoreactive in the absence of a photocationic initiator; (b) exposing the composition to actinic radiation, thereby causing the photoreactive epoxy resin to become crosslinked or chain extended; and (c) subsequent to step (b), heating the composition to a temperature sufficient to cause crosslinking or chain extension of the thermally reactive polymer. Yet another embodiment of the present invention is directed to a photoexposed and thermally cured composition comprising a substantially homogeneous blend of at least one crosslinked or chain extended thermally reactive polymer selected from the group consisting of resoles, novolacs, thermally reactive polyarylene ethers, and mixtures thereof and at least one crosslinked or chain extended photoreactive epoxy resin that is photoreactive in the absence of a photocationic initiator. Still another embodiment of the present invention is directed to an ink jet printhead which comprises (i) an upper substrate, and (ii) a lower substrate in which one surface thereof has an array of heating elements and addressing electrodes formed thereon, said lower substrate having an insulative layer deposited on the surface thereof and over the heating elements and addressing electrodes and patterned to form recesses therethrough to expose the heating elements and terminal ends of the addressing electrodes, said upper and lower substrates being bonded together to form a thermal ink jet printhead having droplet emitting nozzles defined by the upper substrate, the insulative layer on the lower substrate, and the heating elements in the lower substrate, wherein at least one of said upper substrate and said insulative layer comprises a material formed by crosslinking or chain extending a composition comprising a blend of (a) a thermally reactive polymer selected from the group consisting of resoles, novolacs, thermally reactive polyarylene ethers, and mixtures thereof; and (b) a photoreactive epoxy resin that is photoreactive in the absence of a photocationic initiator. Another embodiment of the present invention is directed to a process for forming an ink jet printhead which comprises: (a) providing a lower substrate in which one surface thereof has an array of heating elements and addressing electrodes having terminal ends formed thereon; (b) depositing onto the surface of the lower substrate having the heating elements and addressing electrodes thereon a layer comprising a photopatternable polymer; (c) exposing the layer to actinic radiation in an imagewise pattern such that the photopatternable polymer in exposed areas becomes crosslinked or chain extended and the photopatternable polymer in unexposed areas does not become crosslinked or chain extended, wherein the unexposed areas correspond to areas of the lower substrate having thereon the heating elements and the terminal ends of the addressing electrodes; (d) removing the photopatternable polymer from the unexposed areas, thereby forming recesses in the layer, said recesses exposing the heating elements and the terminal ends of the addressing electrodes; (e) providing an upper substrate comprising a supporting substrate and, coated thereon, a material formed by crosslinking or chain extending a composition comprising a blend of (i) a thermally reactive polymer selected from the group consisting of resoles, novolacs, thermally reactive polyarylene ethers, and mixtures thereof; and (ii) a photoreactive epoxy resin that is photoreactive in the absence of a photocationic initiator, and (f) bonding the upper substrate to the lower substrate to form a thermal ink jet printhead having droplet emitting nozzles defined by the upper substrate, the photopatternable polymer on the lower substrate, and the heating elements in the lower substrate. Yet another embodiment of the present invention is directed to a process which comprises the steps of: (a) depositing a layer comprising a composition comprising a blend of (i) a thermally reactive polymer selected from the group consisting of resoles, novolacs, thermally reactive polyarylene ethers, and mixtures thereof; and (ii) a photoreactive epoxy resin that is photoreactive in the absence of a photocationic initiator onto a lower substrate in which one surface thereof has an array of heating elements and addressing electrodes having terminal ends formed thereon, said polymer being deposited onto the surface having the heating elements and addressing electrodes thereon; (b) exposing the layer to actinic radiation in an imagewise pattern such that the photoreactive epoxy resin in the layer in exposed areas becomes crosslinked or chain extended and the photoreactive epoxy resin in the layer in unexposed areas does not become crosslinked or chain extended, wherein the unexposed areas correspond to areas of the lower substrate having thereon the heating elements and the terminal ends of the addressing electrodes; (c) removing the composition from the unexposed areas, thereby forming recesses in the layer, said recesses exposing the heating elements and the terminal ends of the addressing electrodes; (d) subsequent to step (c), heating the layer to a temperature sufficient to cause crosslinking or chain extension of the thermally reactive polymer of the layer composition; (e) providing an upper substrate; and (f) bonding the upper substrate to the lower substrate to form a thermal ink jet printhead having droplet emitting nozzles defined by the upper substrate, the photoexposed and thermally cured polymer blend composition on the lower substrate, and the heating elements in the lower substrate.

In microelectronics applications, there is a great need for low dielectric constant, high glass transition temperature, thermally stable, photopatternable materials for use as interlayer dielectric layers and as passivation layers which protect microelectronic circuitry. Poly(imides) are widely used to satisfy these needs; these materials, however, have disadvantageous characteristics such as relatively high water sorption and hydrolytic instability. There is thus a need for high performance materials which can be effectively photopatterned and developed at high resolution.

One particular application for such materials is the fabrication of ink jet printheads. Ink jet printing systems generally are of two types: continuous stream and drop-on-demand. In continuous stream ink jet systems, ink is emitted in a continuous stream under pressure through at least one orifice or nozzle. The stream is perturbed, causing it to break up into droplets at a fixed distance from the orifice. At the break-up point, the droplets are charged in accordance with digital data signals and passed through an electrostatic field which adjusts the trajectory of each droplet in order to direct it to a gutter for recirculation or a specific location on a recording medium. In drop-on-demand systems, a droplet is expelled from an orifice directly to a position on a recording medium in accordance with digital data signals. A droplet is not formed or expelled unless it is to be placed on the recording medium.

Since drop-on-demand systems require no ink recovery, charging, or deflection, the system is much simpler than the continuous stream type. There are different types of drop-on-demand ink jet systems. One type of drop-on-demand system has as its major components an ink filled channel or passageway having a nozzle on one end and a piezoelectric transducer near the other end to produce pressure pulses. The relatively large size of the transducer prevents close spacing of the nozzles, and physical limitations of the transducer result in low ink drop velocity. Low drop velocity seriously diminishes tolerances for drop velocity variation and directionality, thus impacting the system's ability to produce high quality copies. Drop-on-demand systems which use piezoelectric devices to expel the droplets also suffer the disadvantage of a slow printing speed.

Another type of drop-on-demand system is known as thermal ink jet, or bubble jet, and produces high velocity droplets and allows very close spacing of nozzles. The major components of this type of drop-on-demand system are an ink filled channel having a nozzle on one end and a heat generating resistor near the nozzle. Printing signals representing digital information originate an electric current pulse in a resistive layer within each ink passageway near the orifice or nozzle, causing the ink in the immediate vicinity to vaporize almost instantaneously and create a bubble. The ink at the orifice is forced out as a propelled droplet as the bubble expands. When the hydrodynamic motion of the ink stops, the process is ready to start all over again. With the introduction of a droplet ejection system based upon thermally generated bubbles, commonly referred to as the "bubble jet" system, the drop-on-demand ink jet printers provide simpler, lower cost devices than their continuous stream counterparts, and yet have substantially the same high speed printing capability.

The operating sequence of the bubble jet system begins with a current pulse through the resistive layer in the ink filled channel, the resistive layer being in close proximity to the orifice or nozzle for that channel. Heat is transferred from the resistor to the ink. The ink becomes superheated far above its normal boiling point, and for water based ink, finally reaches the critical temperature for bubble formation or nucleation of around 280° C. Once nucleated, the bubble or water vapor thermally isolates the ink from the heater and no further heat can be applied to the ink. This bubble expands until all the heat stored in the ink in excess of the normal boiling point diffuses away or is used to convert liquid to vapor, which removes heat due to heat of vaporization. The expansion of the bubble forces a droplet of ink out of the nozzle, and once the excess heat is removed, the bubble collapses. At this point, the resistor is no longer being heated because the current pulse has passed and, concurrently with the bubble collapse, the droplet is propelled at a high rate of speed in a direction towards a recording medium. The surface of the printhead encounters a severe cavitational force by the collapse of the bubble, which tends to erode it. Subsequently, the ink channel refills by capillary action. This entire bubble formation and collapse sequence occurs in about 10 microseconds. The channel can be refired after 100 to 500 microseconds minimum dwell time to enable the channel to be refilled and to enable the dynamic refilling factors to become somewhat dampened. Thermal ink jet equipment and processes are well known and are described in, for example, U.S. Pat. Nos. 4,601,777, 4,251, 824, 4,410,899, 4,412,224, 4,532,530, and 4,774,530, the disclosures of each of which are totally incorporated herein by reference.

In ink jet printing, a printhead is usually provided having one or more ink-filled channels communicating with an ink supply chamber at one end and having an opening at the opposite end, referred to as a nozzle. These printheads form images on a recording medium such as paper by expelling droplets of ink from the nozzles onto the recording medium. The ink forms a meniscus at each nozzle prior to being expelled in the form of a droplet. After a droplet is expelled, additional ink surges to the nozzle to reform the meniscus.

In thermal ink jet printing, a thermal energy generator, usually a resistor, is located in the channels near the nozzles a predetermined distance therefrom. The resistors are individually addressed with a current pulse to momentarily vaporize the ink and form a bubble which expels an ink droplet. As the bubble grows, the ink bulges from the nozzle and is contained by the surface tension of the ink as a meniscus. The rapidly expanding vapor bubble pushes the column of ink filling the channel towards the nozzle. At the end of the current pulse the heater rapidly cools and the vapor bubble begins to collapse. However, because of inertia, most of the column of ink that received an impulse from the exploding bubble continues its forward motion and is ejected from the nozzle as an ink drop. As the bubble begins to collapse, the ink still in the channel between the nozzle and bubble starts to move towards the collapsing bubble, causing a volumetric contraction of the ink at the nozzle and resulting in the separation of the bulging ink as a droplet. The acceleration of the ink out of the nozzle while the bubble is growing provides the momentum and velocity of the droplet in a substantially straight line direction towards a recording medium, such as paper.

Ink jet printheads include an array of nozzle and have commonly been formed of silicon wafers using orientation dependent etching (ODE) techniques. The resulting nozzle are generally triangular in cross-section. Thermal ink jet printheads made by using the above-mentioned ODE techniques typically comprise a channel plate which contains a plurality of nozzle-defining channels located on a lower surface thereof bonded to a heater plate having a plurality of resistive heater elements formed on an upper surface thereof and arranged so that a heater element is located in each channel. The upper surface of the heater plate typically includes an insulative layer which is patterned to form recesses exposing the individual heating elements. This insulative layer is referred to as a "pit layer" and is sandwiched between the channel plate and heater plate. For examples of printheads employing this construction, see U.S. Pat. Nos. 4,774,530 and 4,829,324, the disclosures of each of which are totally incorporated herein by reference. Additional examples of thermal ink jet printheads are disclosed in, for example, U.S. Pat. Nos. 4,835,553, 5,057,853, and 4,678,529, the disclosures of each of which are totally incorporated herein by reference.

U.S. Pat. No. 5,739,254, filed Aug. 29, 1996, and U.S. Pat. No. 5,753,783, filed Aug. 28, 1997, entitled "Process for Haloalkylation of High Performance Polymers," with the named inventors Timothy J. Fuller, Ram S. Narang, Thomas W. Smith, David J. Luca, and Raymond K. Crandall, and European Patent Publication 0,826,700, the disclosures of each of which are totally incorporated herein by reference, disclose a process which comprises reacting a polymer of the general formula

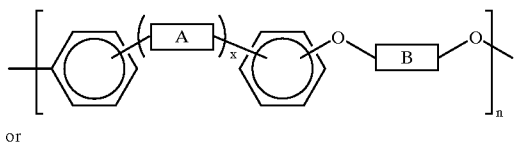

or

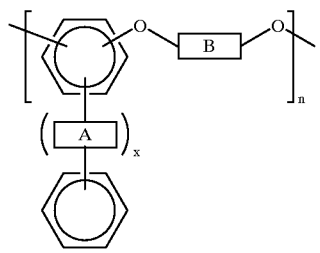

wherein x is an integer of 0 or 1, A is one of several specified groups, such as

B is one of several specified groups, such as

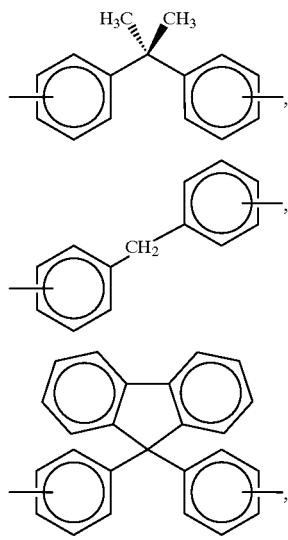

or mixtures thereof, and n is an integer representing the number of repeating monomer units, with an acetyl halide and dimethoxymethane in the presence of a halogen-containing Lewis acid catalyst and methanol, thereby forming a haloalkylated polymer. In a specific embodiment, the haloalkylated polymer is then reacted further to replace at least some of the haloalkyl groups with photosensitivity-imparting groups. Also disclosed is a process for preparing a thermal ink jet printhead with the aforementioned polymer.

U.S. Pat. No. 5,761,809, filed Aug. 29, 1996, entitled "Processes for Substituting Haloalkylated Polymers With Unsaturated Ester, Ether, and Alkylcarboxymethylene Groups," with the named inventors Timothy J. Fuller, Ram S. Narang, Thomas W. Smith, David J. Luca, and Raymond K. Crandall, and European Patent Publication 0,827,026, the disclosures of each of which are totally incorporated herein by reference, disclose a process which comprises reacting a haloalkylated aromatic polymer with a material selected from the group consisting of unsaturated ester salts, alkoxide salts, alkylcarboxylate salts, and mixtures thereof, thereby forming a curable polymer having functional groups corresponding to the selected salt. Another embodiment of the invention is directed to a process for preparing an ink jet printhead with the curable polymer thus prepared.

U.S. Pat. No. 5,738,799, filed Sep. 12, 1996, the disclosure of which is totally incorporated herein by reference, discloses an ink-jet printhead fabrication technique which enables capillary channels for liquid ink to be formed with square or rectangular cross-sections. A sacrificial layer is placed over the main surface of a silicon chip, the sacrificial layer being patterned in the form of the void formed by the desired ink channels. A permanent layer, comprising permanent material, is applied over the sacrificial layer, and, after polishing the two layers to form a uniform surface, the sacrificial layer is removed. Preferred materials for the sacrificial layer include polyimide while preferred materials for the permanent layer include polyarylene ether, although a variety of material combinations are possible.

Copending application U.S. Ser. No. 08/705,914, filed Aug. 29, 1996, entitled "Thermal Ink Jet Printhead With Ink Resistant Heat Sink Coating," with the named inventors Ram S. Narang and Timothy J. Fuller, the disclosure of which is totally incorporated herein by reference, discloses a heat sink for a thermal ink jet printhead having improved resistance to the corrosive effects of ink by coating the surface of the heat sink with an ink resistant film formed by electrophoretically depositing a polymeric material on the heat sink surface. In one described embodiment, a thermal ink jet printer is formed by bonding together a channel plate and a heater plate. Resistors and electrical connections are formed in the surface of the heater plate. The heater plate is bonded to a heat sink comprising a zinc substrate having an electrophoretically deposited polymeric film coating. The film coating provides resistance to the corrosion of higher pH inks. In another embodiment, the coating has conductive fillers dispersed therethrough to enhance the thermal conductivity of the heat sink. In one embodiment, the polymeric material is selected from the group consisting of polyethersulfones, polysulfones, polyamides, polyimides, polyamide-imides, epoxy resins, polyetherimides, polyarylene ether ketones, chloromethylated polyarylene ether ketones, acryloylated polyarylene ether ketones, polystyrene and mixtures thereof.

U.S. Pat. No. 5,843,259, filed Aug. 29, 1996, entitled "Method for Applying an Adhesive Layer to a Substrate Surface," with the named inventors Ram S. Narang, Stephen F. Pond, and Timothy J. Fuller, the disclosure of which is totally incorporated herein by reference, discloses a method for uniformly coating portions of the surface of a substrate which is to be bonded to another substrate. In a described embodiment, the two substrates are channel plates and heater plates which, when bonded together, form a thermal ink jet printhead. The adhesive layer is electrophoretically deposited over a conductive pattern which has been formed on the binding substrate surface. The conductive pattern forms an electrode and is placed in an electrophoretic bath comprising a colloidal emulsion of a preselected polymer adhesive. The other electrode is a metal container in which the solution is placed or a conductive mesh placed within the container. The electrodes are connected across a voltage source and a field is applied. The substrate is placed in contact with the solution, and a small current flow is carefully controlled to create an extremely uniform thin deposition of charged adhesive micelles on the surface of the conductive pattern. The substrate is then removed and can be bonded to a second substrate and cured. In one embodiment, the polymer adhesive is selected from the group consisting of polyamides, polyimides, polyamide-imides, epoxy resins, polyetherimides, polysulfones, polyether sulfones, polyarylene ether ketones, polystyrenes, chloromethylated polyarylene ether ketones, acryloylated polyarylene ether ketones, and mixtures thereof.

Copending application U.S. Ser. No. 08/697,750, filed Aug. 29, 1996, entitled "Electrophoretically Deposited Coating For the Front Face of an Ink Jet Printhead," with the named inventors Ram S. Narang, Stephen F. Pond, and Timothy J. Fuller, the disclosure of which is totally incorporated herein by reference, discloses an electrophoretic deposition technique for improving the hydrophobicity of a metal surface, in one embodiment, the front face of a thermal ink jet printhead. For this example, a thin metal layer is first deposited on the front face. The front face is then lowered into a colloidal bath formed by a fluorocarbon-doped organic system dissolved in a solvent and then dispersed in a non-solvent. An electric field is created and a small amount of current through the bath causes negatively charged particles to be deposited on the surface of the metal coating. By controlling the deposition time and current strength, a very uniform coating of the fluorocarbon compound is formed on the metal coating. The electrophoretic coating process is conducted at room temperature and enables a precisely controlled deposition which is limited only to the front face without intrusion into the front face orifices. In one embodiment, the organic compound is selected from the group consisting of polyimides, polyamides, polyamide-imides, polysulfones, polyarylene ether ketones, polyethersulfones, polytetrafluoroethylenes, polyvinylidene fluorides, polyhexafluoro-propylenes, epoxies, polypentafluorostyrenes, polystyrenes, copolymers thereof, terpolymers thereof, and mixtures thereof.

U.S. Pat. No. 5,939,206, filed Aug. 29, 1996, entitled "Stabilized Graphite Substrates," with the named inventors Gary A. Kneezel, Ram S. Narang, Timothy J. Fuller, and Peter J. John, the disclosure of which is totally incorporated herein by reference, discloses an apparatus which comprises at least one semiconductor chip mounted on a substrate, said substrate comprising a graphite member having electrophoretically deposited thereon a coating of a polymeric material. In one embodiment, the semiconductor chips are thermal ink jet printhead subunits. In one embodiment, the polymeric material is of the general formula

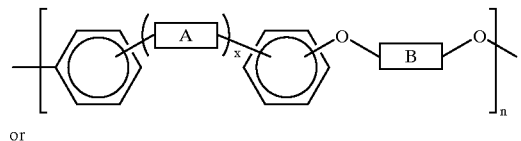

or

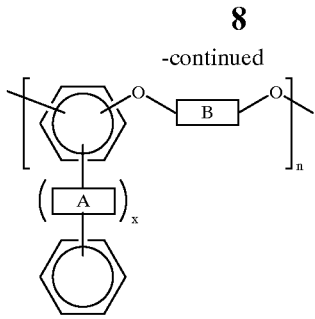

wherein x is an integer of 0 or 1, A is one of several specified groups, such as

B is one of several specified groups, such as

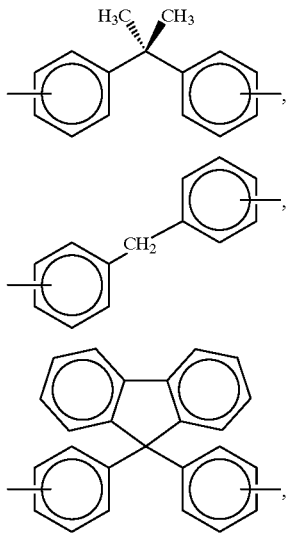

or mixtures thereof, and n is an integer representing the number of repeating monomer units.

U.S. Pat. No. 5,994,425, filed Aug. 29, 1996, entitled "Improved Curable Compositions," with the named inventors Timothy J. Fuller, Ram S. Narang, Thomas W. Smith, David J. Luca, and Ralph A. Mosher, and European Patent Publication 0,827,027, the disclosures of each of which are totally incorporated herein by reference, disclose an improved composition comprising a photopatternable polymer containing at least some monomer repeat units with photosensitivity-imparting substituents, said photopatternable polymer being of the general formula

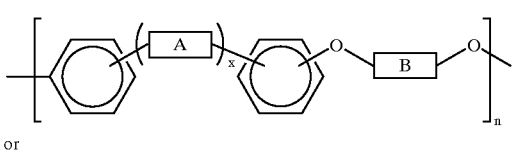

or

-continued

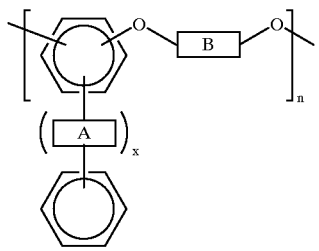

wherein x is an integer of 0 or 1, A is one of several specified groups, such as

B is one of several specified groups, such as

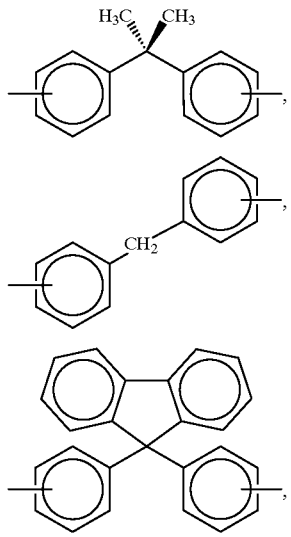

or mixtures thereof, and n is an integer representing the number of repeating monomer units. Also disclosed is a process for preparing a thermal ink jet printhead with the aforementioned polymer and a thermal ink jet printhead containing therein a layer of a crosslinked or chain extended polymer of the above formula.

U.S. Pat. No. 5,849,809, filed Aug. 29, 1996, entitled "Hydroxyalkylated High Performance Curable Polymers," with the named inventors Ram S. Narang and Timothy J. Fuller, now U.S. Pat. No. 5,849,809, copending application U.S. Ser. No. 09/159,426, filed Sep. 23, 1998, entitled "Hydroxyalkylated High Performance Curable Polymers," with the named inventors Ram S. Narang and Timothy J. Fuller, and European Patent Publication 0,827,028, the disclosures of each of which are totally incorporated herein by reference, disclose a composition which comprises (a) a polymer containing at least some monomer repeat units with photosensitivity-imparting substituents which enable crosslinking or chain extension of the polymer upon exposure to actinic radiation, said polymer being of the formula

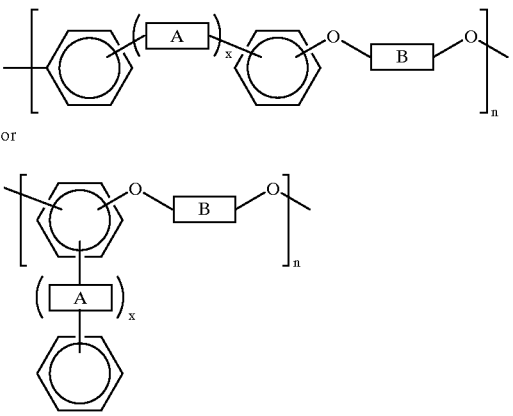

wherein x is an integer of 0 or 1, A is one of several specified groups, such as B is one of several specified groups, such as or mixtures thereof, and n is an integer representing the number of repeating monomer units, wherein said photosensitivity-imparting substituents are hydroxyalkyl groups; (b) at least one member selected from the group consisting of photoinitiators and sensitizers; and (c) an optional solvent. Also disclosed are processes for preparing the above polymers and methods of preparing thermal ink jet printheads containing the above polymers.

U.S. Pat. No. 6,124,372, filed Aug. 29, 1996, entitled "Improved High Performance Polymer Compositions," with the named inventors Thomas W. Smith, Timothy J. Fuller, Ram S. Narang, and David J. Luca, and European Patent Publication 0,827,029, the disclosures of each of which are totally incorporated herein by reference, disclose a composition comprising a polymer with a weight average molecular weight of from about 1,000 to about 65,000, said polymer containing at least some monomer repeat units with a first, photosensitivity-imparting substituent which enables crosslinking or chain extension of the polymer upon exposure to actinic radiation, said polymer also containing a second, thermal sensitivity-imparting substituent which enables further polymerization of the polymer upon exposure to temperatures of about 140° C. and higher, wherein the first substituent is not the same as the second substituent, said polymer being selected from the group consisting of polysulfones, polyphenylenes, polyether sulfones, polyimides, polyamide imides, polyarylene ethers, polyphenylene sulfides, polyarylene ether ketones, phenoxy resins, polycarbonates, polyether imides, polyquinoxalines, polyquinolines, polybenzimidazoles, polybenzoxazoles, polybenzothiazoles, polyoxadiazoles, copolymers thereof, and mixtures thereof.

U.S. Pat. No. 5,889,077, filed Aug. 29, 1996, entitled "Process for Direct Substitution of High Performance Polymers with Unsaturated Ester Groups," with the named inventors Timothy J. Fuller, Ram S. Narang, Thomas W. Smith, David J. Luca, and Raymond K. Crandall, and European Patent Publication 0,827,030, the disclosures of each of which are totally incorporated herein by reference, disclose a process which comprises reacting a polymer of the general formula

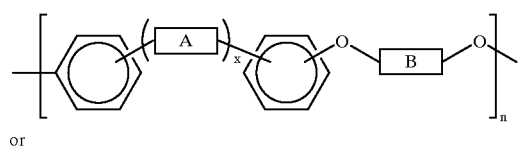

or

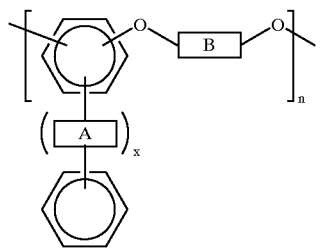

wherein x is an integer of 0 or 1, A is one of several specified groups, such as

B is one of several specified groups, such as

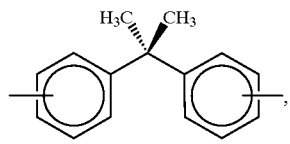

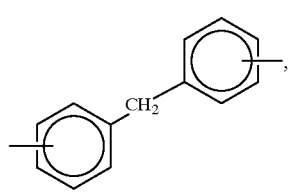

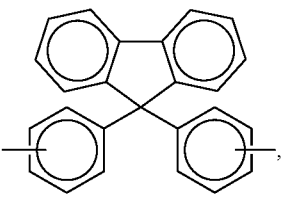

or mixtures thereof, and n is an integer representing the number of repeating monomer units, with (i) a formaldehyde source, and (ii) an unsaturated acid in the presence of an acid catalyst, thereby forming a curable polymer with unsaturated ester groups. Also disclosed is a process for preparing an ink jet printhead with the above polymer.

U.S. Pat. No. 5,958,995, filed Aug. 29, 1996, entitled "Blends Containing Curable Polymers," with the named inventors Ram S. Narang and Timothy J. Fuller, and European Patent Publication 0,827,031, the disclosures of each of which are totally incorporated herein by reference, disclose a composition which comprises a mixture of (A) a first component comprising a polymer, at least some of the monomer repeat units of which have at least one photosensitivity-imparting group thereon, said polymer having a first degree of photosensitivity-imparting group substitution measured in milliequivalents of photosensitivity-imparting group per gram and being of the general formula

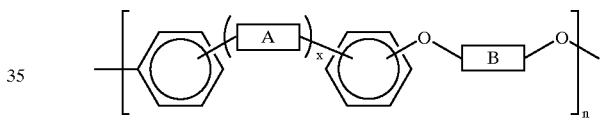

or

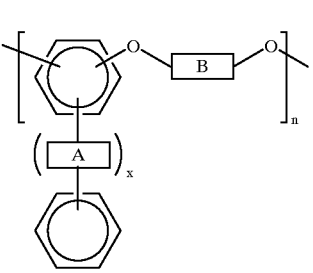

wherein x is an integer of 0 or 1, A is one of several specified groups, such as

B is one of several specified groups, such as

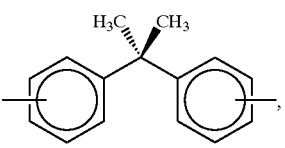

-continued

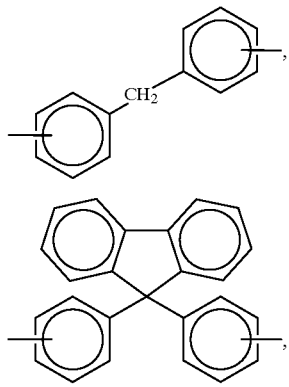

or mixtures thereof, and n is an integer representing the number of repeating monomer units, and (B) a second component which comprises either (1) a polymer having a second degree of photosensitivity-imparting group substitution measured in milliequivalents of photosensitivity-imparting group per gram lower than the first degree of photosensitivity-imparting group substitution, wherein said second degree of photosensitivity-imparting group substitution may be zero, wherein the mixture of the first component and the second component has a third degree of photosensitivity-imparting group substitution measured in milliequivalents of photosensitivity-imparting group per gram which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution measured in milliequivalents of photosensitivity-imparting group per gram, wherein the mixture of the first component and the second component has a fifth degree of photosensitivity-imparting group substitution measured in milliequivalents of photosensitivity-imparting group per gram which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture. Also disclosed is a process for preparing a thermal ink jet printhead with the aforementioned composition.

U.S. Pat. No. 5,945,253, filed Aug. 29, 1996, entitled "High Performance Curable Polymers and Processes for the Preparation Thereof," with the named inventors Ram S. Narang and Timothy J. Fuller, and European Patent Publication 0,827,033, the disclosures of each of which are totally incorporated herein by reference, disclose a composition which comprises a polymer containing at least some monomer repeat units with photosensitivity-imparting substituents which enable crosslinking or chain extension of the polymer upon exposure to actinic radiation, said polymer being of the formula

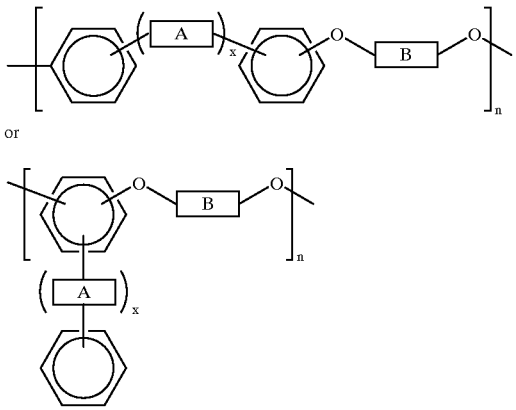

wherein x is an integer of 0 or 1, A is one of several specified groups, such as

B is one of several specified groups, such as

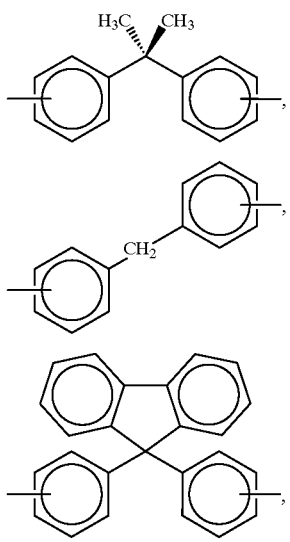

or mixtures thereof, and n is an integer representing the number of repeating monomer units, wherein said photosensitivity-imparting substituents are allyl ether groups, epoxy groups, or mixtures thereof. Also disclosed are a process for preparing a thermal ink jet printhead containing the aforementioned polymers and processes for preparing the aforementioned polymers.

U.S. Pat. No. 5,863,963, filed Aug. 29, 1996, and copending application U.S. Ser. No. 09/163,672, filed Sep. 30, 1998, both entitled "Halomethylated High Performance Curable Polymers," with the named inventors Ram S. Narang and Timothy J. Fuller, the disclosure of which is totally incorporated herein by reference, discloses a process which comprises the steps of (a) providing a polymer containing at least some monomer repeat units with halomethyl group substituents which enable crosslinking or chain extension of the polymer upon exposure to a radiation source which is electron beam radiation, x-ray radiation, or deep ultraviolet radiation, said polymer being of the formula

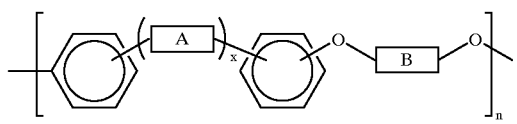

or

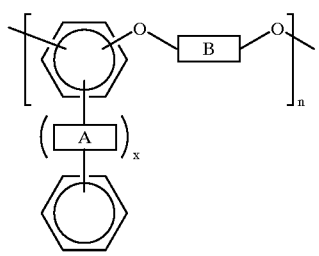

wherein x is an integer of 0 or 1, A is one of several specified groups, such as

B is one of several specified groups, such as

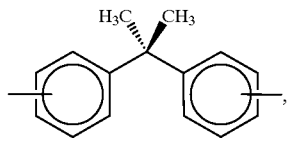

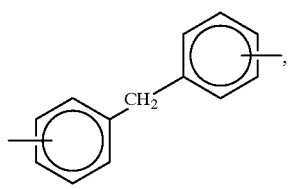

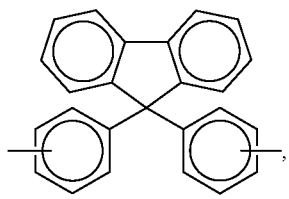

or mixtures thereof, and n is an integer representing the number of repeating monomer units, and (b) causing the polymer to become crosslinked or chain extended through the photosensitivity-imparting groups. Also disclosed is a process for preparing a thermal ink jet printhead by the aforementioned curing process.

U.S. Pat. No. 6,007,877, filed Aug. 29, 1996, entitled "Aqueous Developable High Performance Curable Polymers," with the named inventors Ram S. Narang and Timothy J. Fuller, and European Patent Publication 0,827,032, the disclosures of each of which are totally incorporated herein by reference, disclose a composition which comprises a polymer containing at least some monomer repeat units with water-solubility-imparting substituents and at least some monomer repeat units with photosensitivity-imparting substituents which enable crosslinking or chain extension of the polymer upon exposure to actinic radiation, said polymer being of the formula

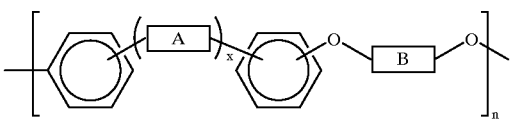

or

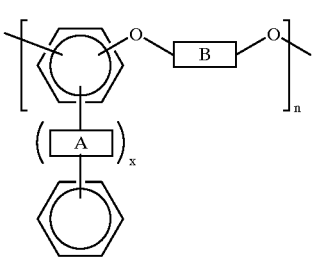

wherein x is an integer of 0 or 1, A is one of several specified groups, such as

B is one of several specified groups, such as

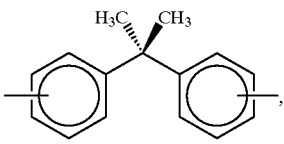

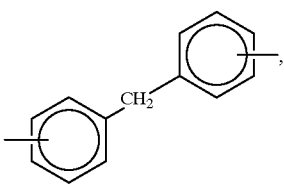

-continued

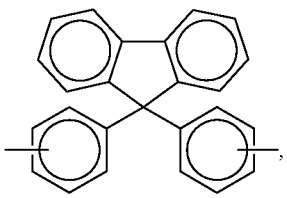

or mixtures thereof, and n is an integer representing the number of repeating monomer units. In one embodiment, a single functional group imparts both photosensitivity and water solubility to the polymer. In another embodiment, a first functional group imparts photosensitivity to the polymer and a second functional group imparts water solubility to the polymer. Also disclosed is a process for preparing a thermal ink jet printhead with the aforementioned polymers.

Copending application U.S. Ser. No. 09/105,501, filed Jun. 26, 1998, entitled "Bonding Process," with the named inventors Lisa A. DeLouise and David J. Luca, the disclosure of which is totally incorporated herein by reference, discloses a process for bonding a first article to a second article which comprises (a) providing a first article comprising a polymer having photosensitivity-imparting substituents; (b) providing a second article comprising metal, plasma nitride, silicon, or glass; (c) applying to at least one of the first article and the second article an adhesion promoter selected from silanes, titanates, or zirconates having (i) alkoxy, aryloxy, or arylalkyloxy functional groups and (ii) functional groups including at least one photosensitive aliphatic >C=C< linkage; (d) placing the first article in contact with the second article; and (e) exposing the first article, second article, and adhesion promoter to radiation, thereby bonding the first article to the second article with the adhesion promote. In one embodiment of the present invention, the adhesion promoter is employed in microelectrical mechanical systems such as thermal ink jet printheads.

Copending application U.S. Ser. No. 09/120,746, filed Jul. 23, 1998, entitled "Improved Thermal Ink Jet Printhead and Process for the Preparation Thereof," with the named inventors Ram S. Narang, Gary A. Kneezel, Bidan Zhang, Almon P. Fisher, and Timothy J. Fuller, the disclosure of which is totally incorporated herein by reference, discloses Disclosed is an ink jet printhead which comprises (i) an upper substrate with a set of parallel grooves for subsequent use as ink channels and a recess for subsequent use as a manifold, the grooves being open at one end for serving as droplet emitting nozzles, and (ii) a lower substrate in which one surface thereof has an array of heating elements and addressing electrodes formed thereon, said lower substrate having an insulative layer deposited on the surface thereof and over the heating elements and addressing electrodes and patterned to form recesses therethrough to expose the heating elements and terminal ends of the addressing electrodes, the upper and lower substrates being aligned, mated, and bonded together to form the printhead with the grooves in the upper substrate being aligned with the heating elements in the lower substrate to form droplet emitting nozzles, said upper substrate comprising a material formed by crosslinking or chain extending a polymer of the formula

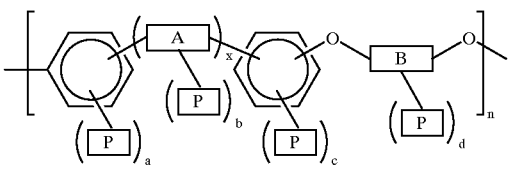

or

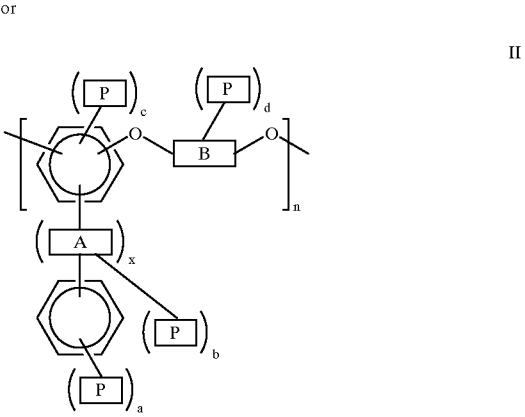

"Poly(arylene ether-co-imidazole)s as Toughness Modifiers for Epoxy Resins," P. Roberts-McDaniel et al., *Polymer Preprints*, Vol. 35(1), p. 543 (1994), the disclosure of which is totally incorporated herein by reference, discloses blends of thermosetting epoxy resins and poly(arylene ether imidazole)s.

"Toughening of Epoxy Resin Networks with Functionalized Engineering Thermoplastics," J. Hedrick et al., in *ACS Advances in Chemistry Series, Rubber Toughened Plastics*, Keith C. Riew, Ed., American Chemical Society (1989), the disclosure of which is totally incorporated herein by reference, discloses a method for toughening epoxy resin thermosets by incorporating therein functionalized engineering thermoplastics as toughening agents.

EP 0 663 411, the disclosure of which is totally incorporated herein by reference, discloses a photoimaging resist ink containing (A) an unsaturated group-having polycarboxylic acid resin which is a reaction product of (c) succinic anhydride with an additive reaction product of (a) an epoxy resin with (b) an unsaturated group-having monocarboxylic acid, wherein (a) the epoxy resin is represented by the formula

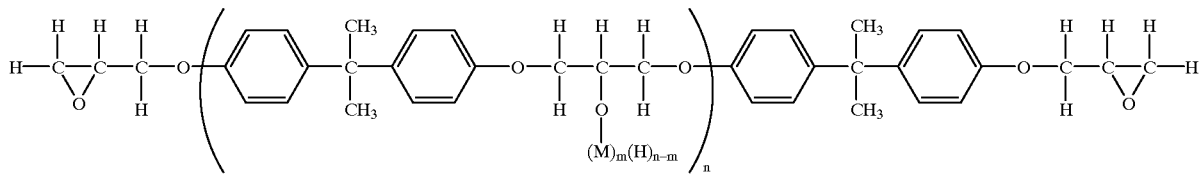

wherein M stands for

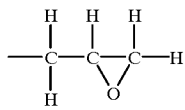

n is at least 1 on the average, and m is 1 to n on the average. In specific embodiments, the resist further contains (B) a photopolymerization initiator, (C) a diluent, and (D) a curing component. In forming a solder resist pattern by exposing a coating film of a resist ink through a patterned film to ultraviolet light and developing the coating film to dissolve away the unexposed portions thereof, the resist ink is excellent in developability and photosensitivity, while the cure product thereof is excellent in flex resistance and folding resistance, heat resistance, and the like. The resist ink is especially suitable as a liquid solder resist ink for flexible printed circuit boards and thin pliable rigid circuit boards.

While known compositions and processes are suitable for their intended purposes, a need remains for improved photoresist compositions. In addition, a need remains for photoresist compositions that are thermally stable, solvent resistant, and chemically resistant subsequent to curing. Further, a need remains for photoresist compositions suitable as interlayer dielectrics in microelectronic devices. Additionally, a need remains for photoresist compositions that are particularly advantageous for use as passivation and pit forming layers in the fabrication of thermal ink jet printheads. There is also a need for photoresist compositions that are hydrolytically stable in acidic and alkaline aqueous environments. In addition, there is a need for photoresist compositions that exhibit stability with respect to thermal and chemical oxidative degradation.

SUMMARY OF THE INVENTION

The present invention is directed to a composition comprising a blend of (a) a thermally reactive polymer selected from the group consisting of resoles, novolacs, thermally reactive polyarylene ethers, and mixtures thereof; and (b) a photoreactive epoxy resin that is photoreactive in the absence of a photocationic initiator. Another embodiment of the present invention is directed to a process which comprises the steps of (a) providing a composition comprising (i) a thermally reactive polymer selected from the group consisting of resoles, novolacs, thermally reactive polyarylene ethers, and mixtures thereof; and (ii) a photoreactive epoxy resin that is photoreactive in the absence of a photocationic initiator; (b) exposing the composition to actinic radiation, thereby causing the photoreactive epoxy resin to become crosslinked or chain extended; and (c) subsequent to step (b), heating the composition to a temperature sufficient to cause crosslinking or chain extension of the thermally reactive polymer. Yet another embodiment of the present invention is directed to a photoexposed and thermally cured composition comprising a substantially homogeneous blend of at least one crosslinked or chain extended thermally reactive polymer selected from the group consisting of resoles, novolacs, thermally reactive polyarylene ethers, and mixtures thereof and at least one crosslinked or chain extended photoreactive epoxy resin that is photoreactive in the absence of a photocationic initiator. Still another embodiment of the present invention is directed to an ink jet printhead which comprises (i) an upper substrate, and (ii) a lower substrate in which one surface thereof has an array of heating elements and addressing electrodes formed thereon, said lower substrate having an insulative layer deposited on the surface thereof and over the heating elements and addressing electrodes and patterned to form recesses therethrough to expose the heating elements and terminal ends of the addressing electrodes, said upper and lower substrates being bonded together to form a thermal ink jet printhead having droplet emitting nozzles defined by the upper substrate, the insulative layer on the lower substrate, and the heating elements in the lower substrate, wherein at least one of said upper substrate and said insulative layer comprises a material formed by crosslinking or chain extending a composition comprising a blend of (a) a thermally reactive polymer selected from the group consisting of resoles, novolacs, thermally reactive polyarylene ethers, and mixtures thereof; and (b) a photoreactive epoxy resin that is photoreactive in the absence of a photocationic initiator. Another embodiment of the present invention is directed to a process for forming an ink jet printhead which comprises: (a) providing a lower substrate in which one surface thereof has an array of heating elements and addressing electrodes having terminal ends formed thereon; (b) depositing onto the surface of the lower substrate having the heating elements and addressing electrodes thereon a layer comprising a photopatternable polymer; (c) exposing the layer to actinic radiation in an imagewise pattern such that the photopatternable polymer in exposed areas becomes crosslinked or chain extended and the photopatternable polymer in unexposed areas does not become crosslinked or chain extended, wherein the unexposed areas correspond to areas of the lower substrate having thereon the heating elements and the terminal ends of the addressing electrodes; (d) removing the photopatternable polymer from the unexposed areas, thereby forming recesses in the layer, said recesses exposing the heating elements and the terminal ends of the addressing electrodes; (e) providing an upper substrate comprising a supporting substrate and, coated thereon, a material formed by crosslinking or chain extending a composition comprising a blend of (i) a thermally reactive polymer selected from the group consisting of resoles, novolacs, thermally reactive polyarylene ethers, and mixtures thereof; and (ii) a photoreactive epoxy resin that is photoreactive in the absence of a photocationic initiator; and (f) bonding the upper substrate to the lower substrate to form a thermal ink jet printhead having droplet emitting nobles defined by the upper substrate, the photopatternable polymer on the lower substrate, and the heating elements in the lower substrate. Yet another embodiment of the present invention is directed to a process which comprises the steps of: (a) depositing a layer comprising a composition comprising a blend of (i) a thermally reactive polymer selected from the group consisting of resoles, novolacs, thermally reactive polyarylene ethers, and mixtures thereof; and (ii) a photoreactive epoxy resin that is photoreactive in the absence of a photocationic initiator onto a lower substrate in which one surface thereof has an array of heating elements and addressing electrodes having terminal ends formed thereon, said polymer being deposited onto the surface having the heating elements and addressing electrodes thereon; (b) exposing the layer to actinic radiation in an imagewise pattern such that the photoreactive epoxy resin in the layer in exposed areas becomes crosslinked or chain extended and the photoreactive epoxy resin in the layer in unexposed areas does not become crosslinked or chain extended, wherein the unexposed areas correspond to areas of the lower substrate having thereon the heating elements and the terminal ends of the addressing electrodes; (c) removing the composition from the unexposed areas, thereby forming recesses in the layer, said recesses exposing the heating elements and the terminal ends of the addressing electrodes; (d) subsequent to step (c), heating the layer to a temperature sufficient to cause crosslinking or chain extension of the thermally reactive polymer of the layer composition; (e) providing an upper substrate; and (f) bonding the upper substrate to the lower substrate to form a thermal ink jet printhead having droplet emitting nozzles defined by the upper substrate, the photo-exposed and thermally cured polymer blend composition on the lower substrate, and the heating elements in the lower substrate.

DETAILED DESCRIPTION OF THE INVENTION

Figure 1:
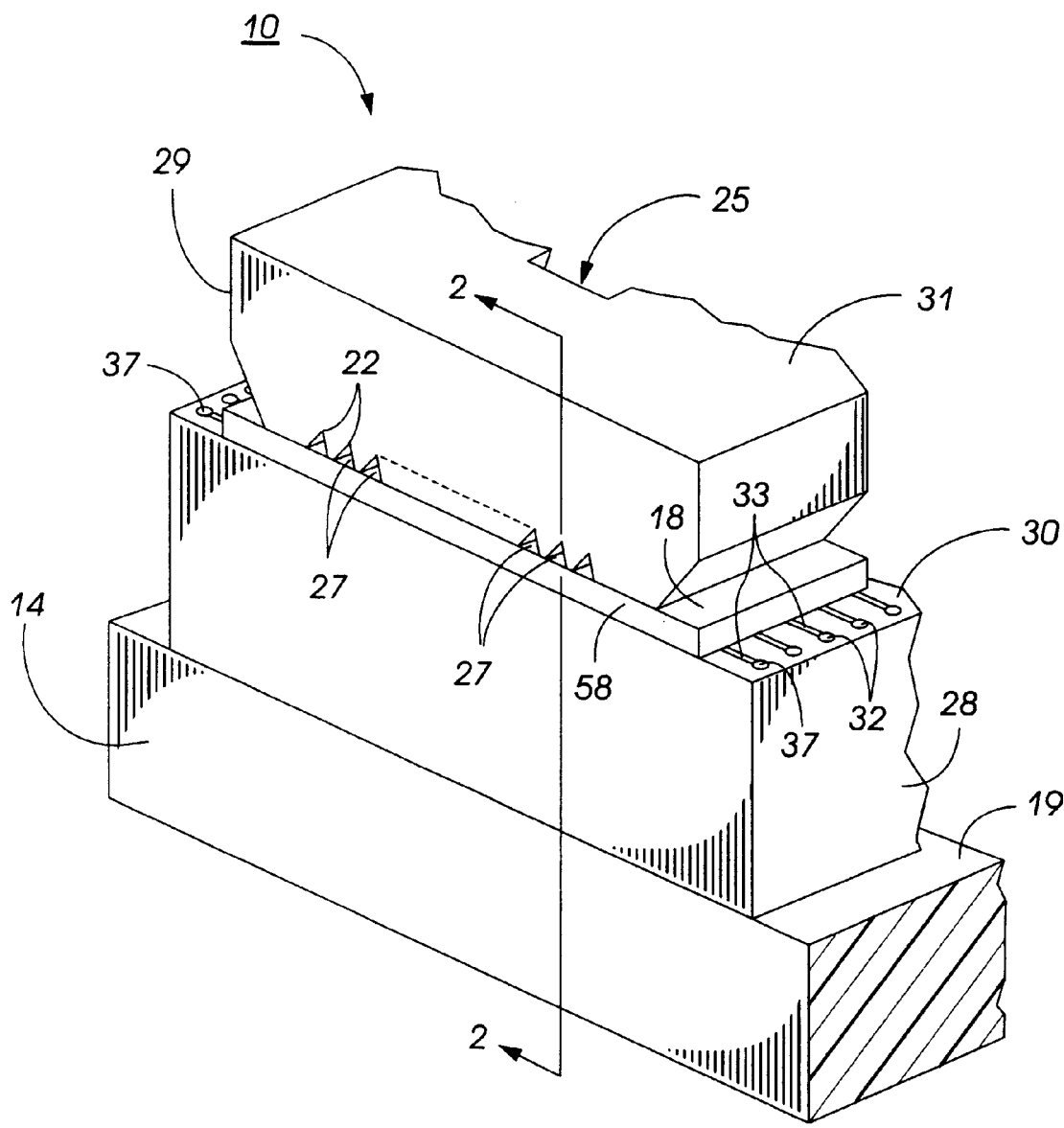
FIG. 1 is an enlarged schematic isometric view of an example of a printhead mounted on a daughter board showing the droplet emitting nozzles.

The blends of the present invention contain a thermally reactive polymer and a photoreactive epoxy resin. By "thermally reactive" is meant a polymer that becomes crosslinked or chain extended upon exposure to heat, typically at temperatures of about 100° C. or greater. The thermally reactive polymer is selected so that it does not crosslink or chain extend upon exposure to actinic radiation at the wavelength used to crosslink and/or chain extend the photoreactive epoxy resin. Suitable thermally reactive polymers include resoles, novolacs, and the like. Phenolic resins such as resoles and novolacs are random branched condensation products of phenol and formaldehyde. Except for linear novolacs made with organometallic catalysts, their structures are ill defined. Malcolm P. Stevens, in *Polymer Chemistry—An Introduction,* 2nd Ed., p. 472 (Oxford University Press 1990), the disclosure of which is totally incorporated herein by reference, gives representative structures of resoles as

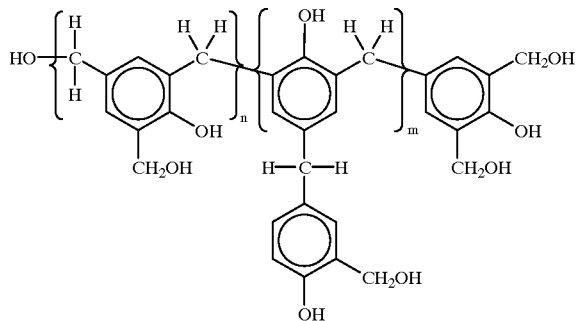

wherein m and n are integers representing the number of repeat monomer units, and representative structures of novolacs as

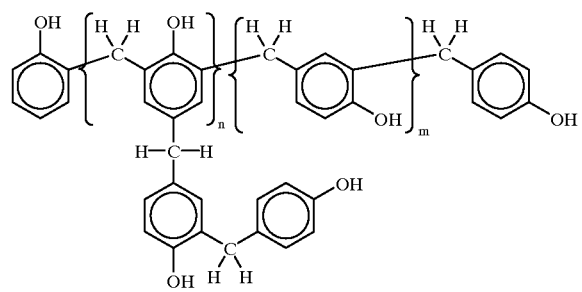

wherein m and n are integers representing the number of repeat monomer units, with typical polymers having from about 8 to about 100 repeat monomer units, although the number of repeat monomer units can be outside of this range. Examples of commercially available suitable resoles and novolacs include novolac(phenol-formaldehyde) resin, resole(phenol-formaldehyde) resin, and the like, commercially available from Monomer-Polymer and Dajac Laboratories, Inc., Trevose, Pa.

Another example of a suitable class of thermally reactive polymers is one having thermally reactive substituents thereon, with the unsubstituted polymer represented by the formula

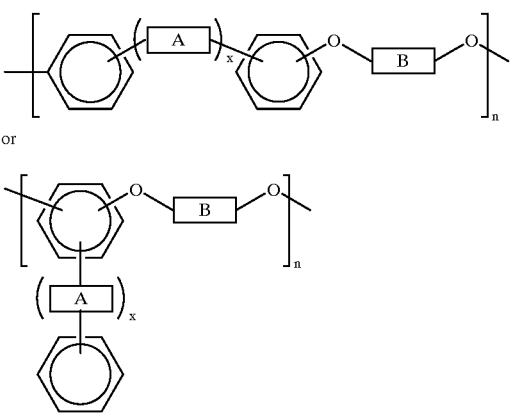

or wherein x is an integer of 0 or 1, A is
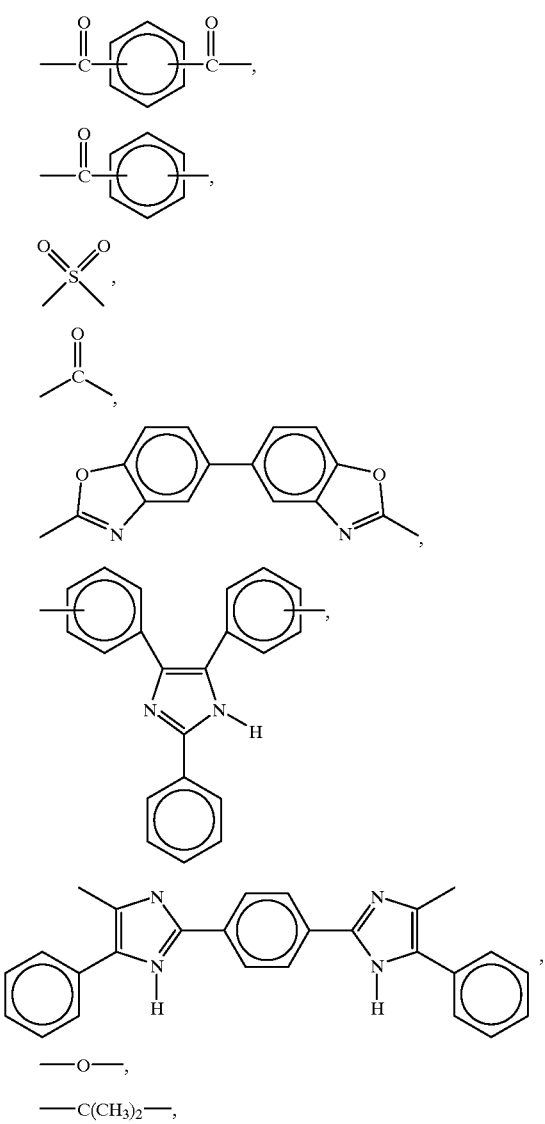
or mixtures thereof, B is
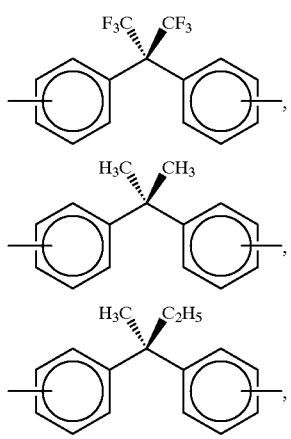
-continued
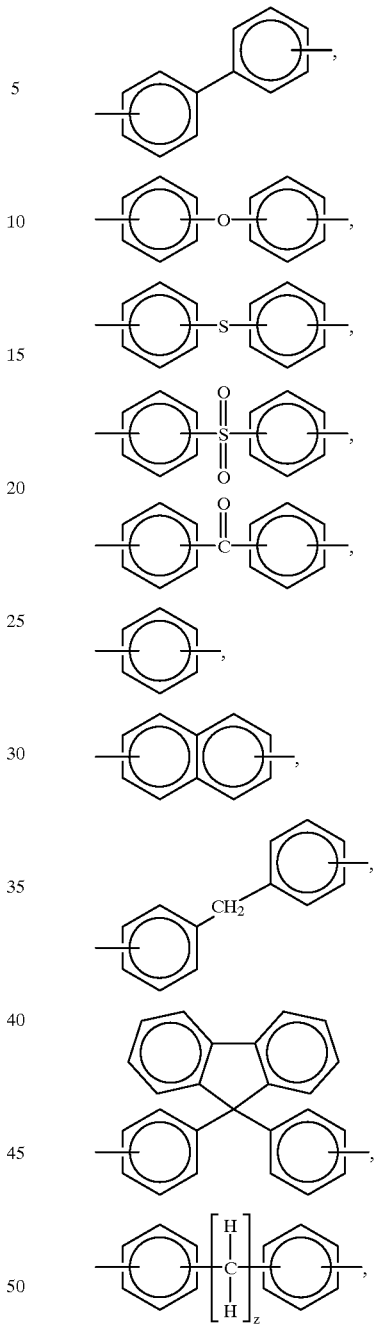
wherein z is an integer of from 2 to about 20, and preferably from 2 to about 10,
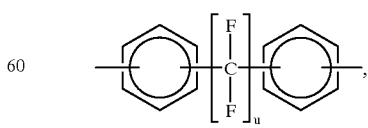
wherein u is an integer of from 1 to about 20, and preferably from 1 to about 10,

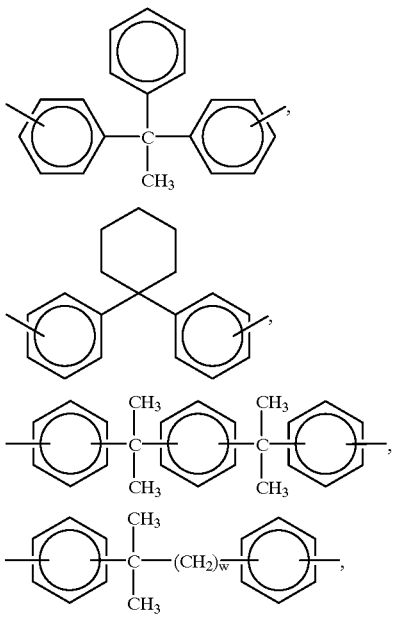

wherein w is an integer of from 1 to about 20, and preferably from 1 to about 10,

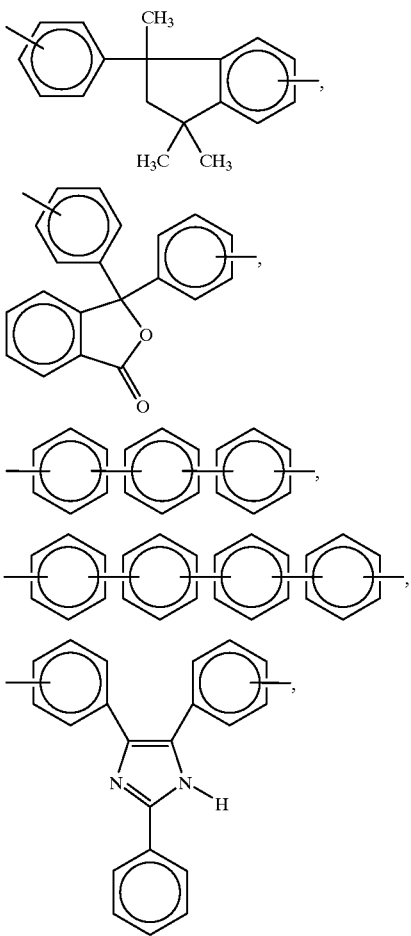

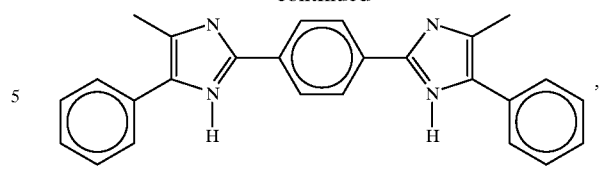

other similar bisphenol derivatives, or mixtures thereof, and n is an integer representing the number of repeating monomer units. The value of n is such that the weight average molecular weight of the material typically is from about 1,000 to about 100,000, preferably from about 1,000 to about 65,000, more preferably from about 1,000 to about 40,000, and even more preferably from about 3,000 to about 25,000, although the weight average molecular weight can be outside these ranges. Preferably, n is an integer of from about 2 to about 70, more preferably from about 5 to about 70, and even more preferably from about 8 to about 50, although the value of n can be outside these ranges. The phenyl groups and the A and/or B groups may also be substituted, although the presence of two or more substituents on the B group ortho to the oxygen groups can render substitution difficult. Substituents can be present on the polymer either prior to or subsequent to the placement of thermal reactivity-imparting functional groups thereon. Substituents can also be placed on the polymer during the process of placement of thermal reactivity-imparting functional groups thereon. Examples of suitable substituents include (but are not limited to) alkyl groups, including saturated, unsaturated, and cyclic alkyl groups, preferably with from 1 to about 6 carbon atoms, substituted alkyl groups, including saturated, unsaturated, and cyclic substituted alkyl groups, preferably with from 1 to about 6 carbon atoms, aryl groups, preferably with from 6 to about 24 carbon atoms, substituted aryl groups, preferably with from 6 to about 24 carbon atoms, arylalkyl groups, preferably with from 7 to about 30 carbon atoms, substituted arylalkyl groups, preferably with from 7 to about 30 carbon atoms, alkoxy groups, preferably with from 1 to about 6 carbon atoms, substituted alkoxy groups, preferably with from 1 to about 6 carbon atoms, aryloxy groups, preferably with from 6 to about 24 carbon atoms, substituted aryloxy groups, preferably with from 6 to about 24 carbon atoms, arylalkyloxy groups, preferably with from 7 to about 30 carbon atoms, substituted arylalkyloxy groups, preferably with from 7 to about 30 carbon atoms, hydroxy groups, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein the substituents on the substituted alkyl groups, substituted aryl groups, substituted arylalkyl groups, substituted alkoxy groups, substituted aryloxy groups, and substituted arylalkyloxy groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein two or more substituents can be joined together to form a ring.

For applications wherein the thermally reactive polymer is to be used as a layer in a thermal ink jet printhead, the polymer preferably has a number average molecular weight of from about 3,000 to about 50,000 Daltons, more preferably from about 10,000 to about 20,000 Daltons, although the molecular weight can be outside this range. The optimum molecular weight is determined by the polydispersity, with polymers of relatively low polydispersities such as from about 2 to about 2.5 having higher molecular weights within the above ranges, and polymers of relatively high polydispersities such as from about 3 to about 7 having lower molecular weights within the above ranges.

Processes for the preparation of these materials are known, and disclosed in, for example, P. M. Hergenrother, *J. Macromol. Sci. Rev. Macromol. Chem.,* C19 (1), 1–34 (1980); P. M. Hergenrother, B. J. Jensen, and S. J. Havens, *Polymer,* 29, 358 (1988); B. J. Jensen and P. M. Hergenrother, "High Performance Polymers," Vol. 1, No. 1) page 31 (1989), "Effect of Molecular Weight on Poly (arylene ether ketone) Properties"; V. Percec and B. C. Auman, *Makromol. Chem.* 185, 2319 (1984); "High Molecular Weight Polymers by Nickel Coupling of Aryl Polychlorides," I. Colon, G. T. Kwaiatkowski, J. of *Polymer Science, Part A, Polymer Chemistry,* 28, 367 (1990); M. Ueda and T. Ito, *Polymer J.,* 23 (4), 297 (1991); "Ethynyl-Terminated Polyarylates: Synthesis and Characterization," S. J. Havens and P. M. Hergenrother, *J. of Polymer Science: Polymer Chemistry Edition,* 22, 3011 (1984); "Ethynyl-Terminated Polysulfones: Synthesis and Characterization," P. M. Hergenrother, *J. of Polymer Science: Polymer Chemistry Edition,* 20, 3131 (1982); K. E. Dukes, M. D. Forbes, A. S. Jeevarajan, A. M. Belu, J. M. DeDimone, R. W. Linton, and V. V. Sheares, *Macromolecules,* 29, 3081 (1996); G. Hougham, G. Tesoro, and J. Shaw, *Polym. Mater. Sci. Eng.,* 61, 369 (1989); V. Percec and B. C. Auman, *Makromol. Chem,* 185, 617 (1984); "Synthesis and characterization of New Fluorescent Poly(arylene ethers)," S. Matsuo, N. Yakoh, S. Chino, M. Mitani, and S. Tagami, *Journal of Polymer Science: Part A: Polymer Chemistry,* 32, 1071 (1994); "Synthesis of a Novel Naphthalene-Based Poly (arylene ether ketone) with High Solubility and Thermal Stability," Mami Ohno, Toshikazu Takata, and Takeshi Endo, *Macromolecules,* 27, 3447 (1994); "Synthesis and Characterization of New Aromatic Poly(ether ketones)," F. W. Mercer, M. T. Mckenzie, G. Merlino, and M. M. Fone, *J. of Applied Polymer Science,* 56, 1397 (1995); H. C. Zhang, T. L. Chen, Y. G. Yuan, Chinese Patent CN 85108751 (1991); "Static and laser light scattering study of novel thermoplastics. 1. Phenolphthalein poly(aryl ether ketone)," C. Wu, S. Bo, M. Siddiq, G. Yang and T. Chen, *Macromolecules,* 29, 2989 (1996); "Synthesis of t-Butyl-Substituted Poly(ether ketone) by Nickel-Catalyzed Coupling Polymerization of Aromatic Dichloride", M. Ueda, Y. Seino, Y. Haneda, M. Yoneda, and J.-I. Sugiyama, *Journal of Polymer Science: Part A: Polymer Chemistry,* 32, 675 (1994); "Reaction Mechanisms: Comb-Like Polymers and Graft Copolymers from Macromers 2. Synthesis, Characterzation and Homopolymerization of a Styrene Macromer of Poly(2,6-dimethyl-1,4-phenylene Oxide)," V. Percec, P. L. Rinaldi, and B. C. Auman, *Polymer Bulletin,* 10, 397 (1983); *Handbook of Polymer Synthesis Part A,* Hans R. Kricheldorf, ed., Marcel Dekker, Inc., New York-Basel-Hong Kong (1992); and "Introduction of Carboxyl Groups into Crosslinked Polystyrene," C. R. Harrison, P. Hodge, J. Kemp, and G. M. Perry, *Die Makromolekulare Chemie,* 176, 267 (1975), the disclosures of each of which are totally incorporated herein by reference. Further background on high performance polymers is disclosed in, for example, U.S. Pat. Nos. 2,822,351; 3,065,205; British Patent 1,060, 546; British Patent 971,227; British Patent 1,078,234; U.S. Pat. No. 4,175,175; N. Yoda and H. Hiramoto, *J. Macromol. Sci.-Chem.,* A21(13 & 14) pp. 1641 (1984) (Toray Industries, Inc., Otsu, Japan; B. Sillion and L. Verdet, "Polyimides and other High-Temperature polymers", edited by M. J. M. Abadie and B. Sillion, Elsevier Science Publishers B. V. (Amsterdam 1991); "Polyimides with Alicyclic Diamines. II. Hydrogen Abstraction and Photocrosslinking Reactions of Benzophenone Type Polyimides," Q. Jin, T. Yamashita, and K. Horie, *J. of Polymer Science: Part A: Polymer Chemistry,* 32, 503 (1994); Probimide™ 300, product bulletin, Ciba-Geigy Microelectronics Chemicals, "Photosensitive Polyimide System"; *High Performance Polymers and Composites,* J. I. Kroschwitz (ed.), John Wiley & Sons (New York 1991); and T. E. Atwood, D. A. Barr, T. A. King, B. Newton, and B. J. Rose, *Polymer,* 29, 358 (1988), the disclosures of each of which are totally incorporated herein by reference. Further information on radiation curing is disclosed in, for example, *Radiation Curing: Science and Technology,* S. Peter Pappas, ed., Plenum Press (New York 1992), the disclosure of which is totally incorporated herein by reference. Polymers of these formulae, the preparation thereof, and the use thereof as photopatternable polymers in thermal ink jet printheads are disclosed in, for example, U.S. Pat. No. 5,739,254, copending application U.S. Ser. No. 08/705,375, filed Aug. 29, 1996, copending application U.S. Ser. No. 08/705,365, filed Aug. 29, 1996, copending application U.S. Ser. No. 08/705,488, filed Aug. 29, 1996, copending application U.S. Ser. No. 08/697,761, filed Aug. 29, 1996, copending application U.S. Ser. No. 08/705,479, filed Aug. 29, 1996, copending application U.S. Ser. No. 08/705,376, filed Aug. 29, 1996, copending application U.S. Ser. No. 08/705,372, filed Aug. 29, 1996, copending application U.S. Ser. No. 08/705,490, filed Aug. 29, 1996, copending application U.S. Ser. No. 08/697,760, filed Aug. 29, 1996, copending application U.S. Ser. No. 08/920,240, filed Aug. 28, 1997, European Patent Publication 0,826,700, European Patent Publication 0,827,027, European Patent Publication 0,827,028, European Patent Publication 0,827, 029, European Patent Publication 0,827,030, European Patent Publication 0,827,026, European Patent Publication 0,827,031, European Patent Publication 0,827,033, and European Patent Publication 0,827,032, the disclosures of each of which are totally incorporated herein by reference.

The thermally reactive polyarylene ether polymers of the present invention contain at least one thermal sensitivity-imparting substituent which enables further crosslinking or chain extension of the polymer upon exposure to temperatures of about 100° C. and higher. Preferably, the thermally reactive polymer has at least two thermal sensitivity-imparting substituents, and more preferably has at least three thermal sensitivity-imparting substituents. In one embodiment, the thermally reactive polymer is of the formula

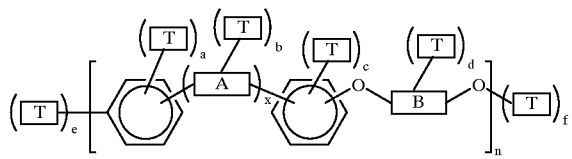

-continued or

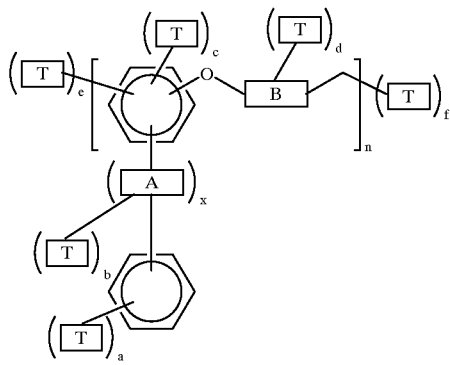

wherein x is an integer of 0 or 1, T is a functional group which imparts thermal sensitivity or reactivity to the polymer, a, b, c, and d are each integers of 0, 1, 2, 3, or 4, and i and j are each integers of 0 or 1, provided that either (1) at least one of a, b, c, and d is equal to or greater than 1 in at least some of the monomer repeat units of the polymer, or (2) at least one of i and j is equal to 1, provided that the entire polymer contains at least 1 thermal sensitivity- or reactivity-imparting group. Examples of suitable thermal sensitivity imparting groups include hydroxymethyl groups, of the formula

halomethyl groups, such as those of the formula

wherein X is a halogen atom, such as chlorine, bromine, or iodine; or
wherein X is a labile ester group, such as paratoluene sulfonate, methane sulfonate, or the like; acyloxymethylene groups, of the formula

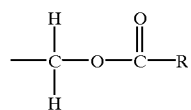

wherein R is a hydrocarbon or a substituted hydrocarbon, such as methyl, ethyl, propyl, or the like; ethynyl groups, such as those of the formula

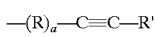

wherein R is an aromatic or substituted aromatic group, such as

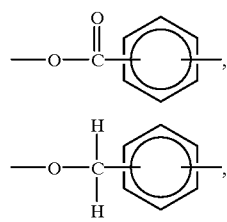

-continued

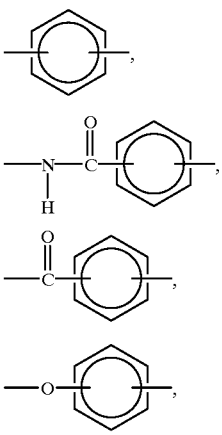

or

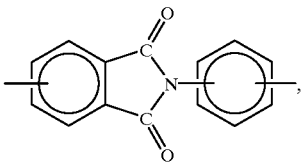

$a$ is an integer of 0 or 1, and R' is a hydrogen atom or a phenyl group; epoxy groups, including those of the formula

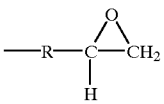

R is an alkyl group, including both saturated, unsaturated, linear, branched, and cyclic alkyl groups, preferably with from 1 to about 30 carbon atoms, more preferably with from 1 to about 11 carbon atoms, even more preferably with from 1 to about 5 carbon atoms, an aryl group, preferably with from 6 to about 24 carbon atoms, more preferably with from 6 to about 18 carbon atoms, or an arylalkyl group, preferably with from 7 to about 30 carbon atoms, more preferably with from 7 to about 19 carbon atoms; benzocyclobutene groups, including those of the formula

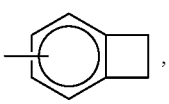

phenolic groups (-φ-OH), provided that the phenolic groups are present in combination with either halomethyl groups or hydroxymethyl groups; the halomethyl groups or hydroxymethyl groups can be present on the same polymer bearing the phenolic groups or on a different polymer, or on a monomeric species present with the phenolic group substituted polymer; maleimide groups, such as those of the formula

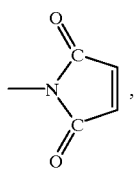

biphenylene groups, such as those of the formula

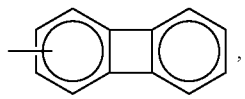

5-norbornene-2,3-dicarboximido (nadimido) groups, such as those of the formula

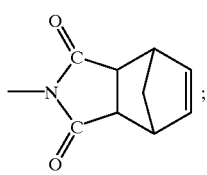

and the like. The methyl-substituted thermal sensitivity-imparting groups, such as hydroxymethyl, halomethyl, and methyl ester, may be present in combinations of two or more of these groups and/or in combination with phenolic groups; similarly, the ethynyl groups, epoxy groups, benzocyclobutene groups, maleimide groups, biphenylene groups, nadimido groups, and the like, may be present in combinations of two or more of these groups. While methyl-substituted thermal sensitivity-imparting groups can be present in combination with the other thermal sensitivity-imparting groups, such combinations generally are not preferred because these two classes of substituents are usually thermally reactive at different temperatures.

The thermal sensitivity imparting groups can be present either as terminal end groups on the polymer or as groups which are pendant from one or more monomer repeat units within the polymer chain. When the thermal sensitivity imparting groups are present as terminal end groups, one or both polymer ends can be terminated with the thermal sensitivity imparting group (or more, if the polymer is branched and has more than two termini). When the thermal sensitivity imparting groups are substituents on one or more monomer repeat units of the polymer, any desired or suitable degree of substitution can be employed. Preferably, the degree of substitution is from about 0.1 to about 4 thermal sensitivity imparting groups per repeat monomer unit, and more preferably from about 1 to about 2 thermal sensitivity imparting groups per repeat monomer unit, although the degree of substitution can be outside these ranges. Optimal degrees of substitution generally depend on the molecular weight of the polymer, with higher molecular weight polymers requiring lower degrees of substitution than lower molecular weight polymers.

The thermal sensitivity imparting groups can be placed on the polymer by any suitable or desired synthetic method. Processes for putting the above mentioned thermal sensitivity imparting groups on polymers are disclosed in, for example, "Polyimides," C. E. Sroog, *Prog. Polym. Sci,* Vol. 16, 561–694 (1991); F. E. Arnold and L. S. Tan, *Symposium on Recent Advances in Polyimides and Other High Performance Polymers,* Reno, Nev. (July 1987); L. S. Tan and F. E. Arnold, *J. Polym. Sci. Part A,* 26, 1819 (1988); U.S. Pat. Nos. 4,973,636; and 4,927,907; the disclosures of each of which are totally incorporated herein by reference.

Suitable processes for halomethylating polymers include reaction of the polymers with formaldehyde and hydrochloric acid, bischloromethyl ether, chloromethyl methyl ether, octylchloromethyl ether, or the like, generally in the presence of a Lewis acid catalyst. Bromination of a methyl group on the polymer can also be accomplished with elemental bromine via a free radical process initiated by, for example, a peroxide initiator or light. Halogen atoms can be substituted for other halogens already on a halomethyl group by, for example, reaction with the appropriate hydrohalic acid or halide salt. Methods for the halomethylation of polymers are also disclosed in, for example, "Chloromethylation of Condensation Polymers Containing an Oxy-1,4-Phenylene Backbone," W. H. Daly et al., *Polymer Preprints,* Vol. 20, No. 1, 835 (1979), the disclosure of which is totally incorporated herein by reference.

One specific process suitable for halomethylating the polymer entails reacting the polymer with an acetyl halide, such as acetyl chloride, and dimethoxymethane in the presence of a halogen-containing Lewis acid catalyst, such as those of the general formula $$M^{n\oplus}X_n$$

wherein n is an integer of 1, 2, 3, 4, or 5, M represents a boron atom or a metal atom, such as tin, aluminum, zinc, antimony, iron (III), gallium, indium, arsenic, mercury, copper, platinum, palladium, or the like, and X represents a halogen atom, such as fluorine, chlorine, bromine, or iodine, with specific examples including $SnCl_4$, $AlCl_3$, $ZnCl_2$, $AlBr_3$, $BF_3$, $SbF_5$, $FeI_3$, $GaBr_3$, $InCl_3$, $AsI_5$, $HgBr_2$, $CuCl$, $PdCl_2$, $PtBr_2$, or the like. Care must be taken to avoid cross-linking of the halomethylated polymer. Typically, the reactants are present in relative amounts by weight of about 35.3 parts acetyl halide, about 37 parts dimethoxymethane, about 1.2 parts methanol, about 0.3 parts Lewis acid catalyst, about 446 parts 1,1,2,2-tetrachloroethane, and about 10 to 20 parts polymer. 1,1,2,2-tetrachloroethane is a suitable reaction solvent. Dichloromethane is low boiling, and consequently the reaction is slow in this solvent unless suitable pressure equipment is used.

The general reaction scheme is as follows:

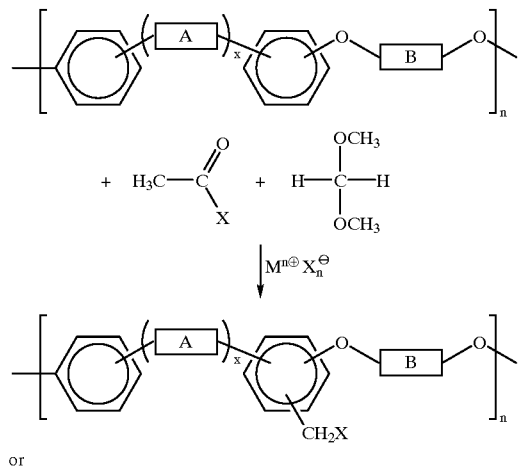

or

-continued

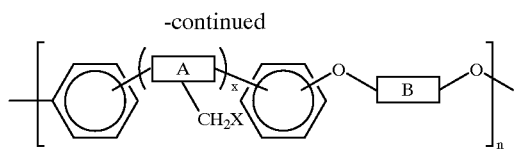

or

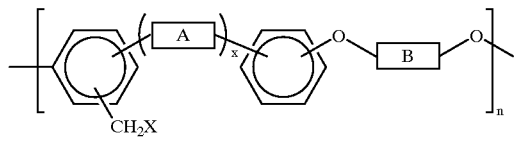

or

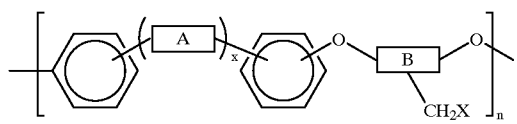

The resulting material is of the general formula

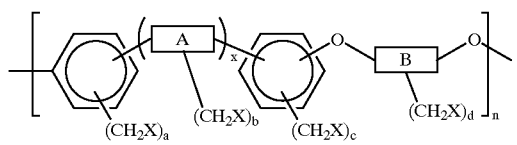

wherein X is a halogen atom, such as fluorine, chlorine, bromine, or iodine, a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units. Substitution is generally random, although the substituent often indicates a preference for the B group, and any given monomer repeat unit may have no halomethyl substituents, one halomethyl substituent, or two or more halomethyl substituents.

Typical reaction temperatures are from about 60 to about 120° C., and preferably from about 80 to about 110° C., although the temperature can be outside these ranges. Typical reaction times are from about 1 to about 10 hours, and preferably from about 2 to about 4 hours, although the time can be outside these ranges. Longer reaction times generally result in higher degrees of halomethylation.

The polymer can be hydroxymethylated at one or more sites, as follows:

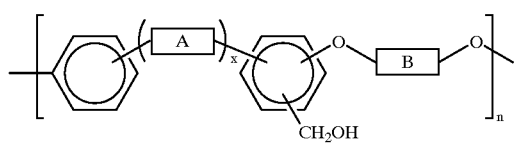

or

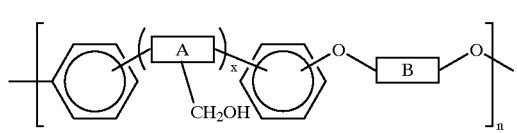

or

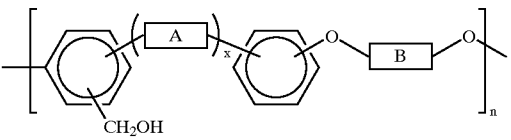

or

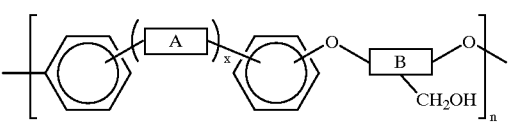

The hydroxymethylation of a polymer of the above formula can be accomplished by reacting the polymer in solution with formaldehyde or paraformaldehyde and a base, such as sodium hydroxide, potassium hydroxide, calcium hydroxide, ammonium hydroxide, tetramethylammonium hydroxide, or the like. The polymer is dissolved in a suitable solvent, such as 1,1,2,2-tetrachloroethane or the like, and is allowed to react with the formaldehyde or paraformaldehyde. Examples of solvents suitable for the reaction include 1,1,2,2-tetrachloroethane, as well as methylene chloride, provided a suitable pressure reactor is used. Typically, the reactants are present in relative amounts by weight of about 44.5 parts paraformaldehyde or 37 parts formaldehyde, about 1 part base, about 200 parts 1,1,2,2-tetrachloroethane, and about 100 parts polymer.

The general reaction scheme is as follows:

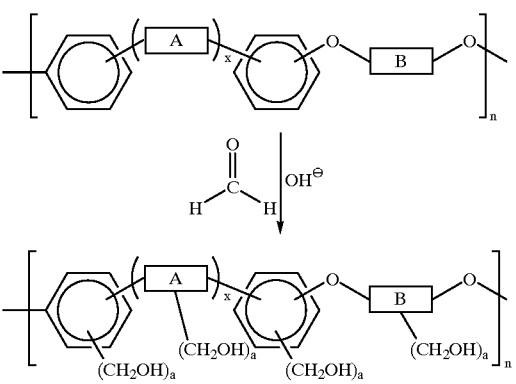

wherein a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units. Substitution is generally random, although the substituent often indicates a preference for the B group, and a particular preference for the sites ortho to oxygen on the B group, and any given monomer repeat unit may have no hydroxymethyl substituents, one hydroxymethyl substituent, or two or more hydroxymethyl substituents. Most commonly, each aromatic ring will have either no hydroxymethyl groups or one hydroxymethyl group.

Typical reaction temperatures are from about 50 to about 125° C., and preferably from about 85 to about 110° C., although the temperature can be outside these ranges. Typical reaction times are from about 4 to about 24 hours, and preferably from about 4 to about 6 hours, although the time can be outside these ranges. Longer reaction times generally result in higher degrees of hydroxymethylation.

Polymers of the above formula can also be hydroxymethylated by first preparing the halomethylated derivative and then replacing at least some of the halomethyl groups with hydroxymethyl groups. For example, the halomethylated polymer can be hydroxymethylated by alkaline hydrolysis of the halomethylated polymer. The hydroxy groups replace the halide atoms in the halomethyl groups on the polymer; accordingly, the number of carbon atoms in the halomethyl group generally corresponds to the number of carbon atoms in the hydroxymethyl group. Examples of suitable reactants include sodium hydroxide, potassium hydroxide, calcium hydroxide, ammonium hydroxide, tetraalkyl ammonium hydroxides, such as tetrabutyl ammonium hydroxide, and the like. Examples of solvents suitable for the reaction include 1,1,2,2-tetrachloroethane, methylene chloride, and water. Typically, the reactants are present in relative amounts with respect to each other by weight of about 13.8 parts halomethylated polymer, about 50 parts solvent, and about 30.6 parts base (containing 23 parts tetrabutylammonium hydroxide in water). After a clear solution is obtained, 30 milliliters of sodium hydroxide (50 percent aqueous solution) is added. After 16 hours at about 25° C., the organic layer is washed with water, dried over magnesium sulfate, and poured into methanol (1 gallon) to precipitate the polymer.

The general reaction scheme, illustrated below for the chloromethylated polymer, is as follows:

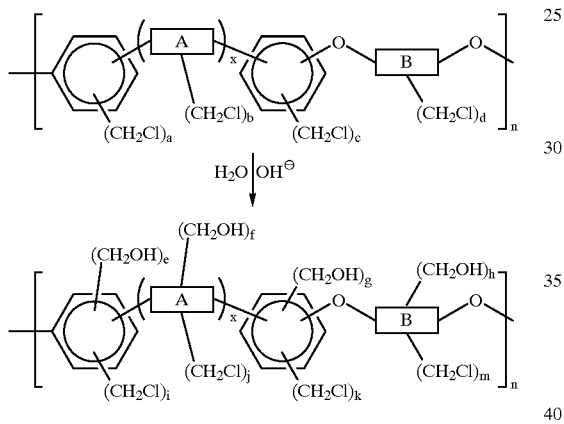

wherein a, b, c, d, e, f, g, h, i, j, k, and m are each integers of 0, 1, 2, 3, or 4, provided that the sum of i+e is no greater than 4, the sum of j+f is no greater than 4, the sum of k+g is no greater than 4, and the sum of m+h is no greater than 4, provided that at least one of a, b, c, and d is equal to or greater than 1 in at least some of the monomer repeat units of the polymer, and provided that at least one of e, f, g, and h is equal to at least 1 in at least some of the monomer repeat units of the polymer, and n is an integer representing the number of repeating monomer units.

Some or all of the halomethyl groups can be replaced with hydroxymethyl substituents. Longer reaction times generally lead to greater degrees of substitution of halomethyl groups with hydroxymethyl substituents.

Typical reaction temperatures are from about 25 to about 120° C., and preferably from about 25 to about 50° C., although the temperature can be outside this range. Typical reaction times are from about 1 to about 24 hours, and preferably from about 10 to about 16 hours, although the time can be outside these ranges.

Other procedures for placing thermally curable end groups on aromatic polymers are disclosed in, for example, P. M. Hergenrother, *J. Macromol. Sci. Rev. Macromol. Chem.*, C19 (1), 1–34 (1980); V. Percec and B. C. Auman, *Makromol. Chem.*, 185, 2319 (1984); S. J. Havens, and P. M. Hergenrother, *J. of Polymer Science: Polymer Chemistry Edition*, 22, 3011 (1984); P. M. Hergenrother, *J. of Polymer Science: Polymer Chemistry Edition*, 20, 3131 (1982); V. Percec, P. L. Rinaldi, and B. C. Auman, *Polymer Bulletin*, 10, 215 (1983); "Functional Polymers and Sequential Copolymers by Phase Transfer Catalysis, 2. Synthesis and Characterization of Aromatic Poly(ether sulfones Containing Vinylbenzyl and Ethynylbenzyl Chain Ends," V. Percec and B. C. Auman, *Makromol. Chem.* 185, 1867 (1984); "Functional Polymers and Sequential Copolymers by Phase Transfer Catalysis, 6. On the Phase Transfer Catalyzed Williamson Polyetherification as a New Method for the Preparation of Alternating Block copolymers," V. Percec, B. Auman, and P. L. Rinaldi, *Polymer Bulletin*, 10, 391 (1983); "Functional Polymers and Sequential Copolymers by Phase Transfer Catalysis, 3 Synthesis and Characterization of Aromatic Poly(ether sulfone)s and Poly(oxy-2,6-dimethyl-1,4-phenylene) Containing Pendant Vinyl Groups," V. Percec and B. C. Auman, *Makromol. Chem.*, 185, 2319 (1984); and "Phase Transfer Catalysis, Functional Polymers and Sequential Copolymers by PTC,5. Synthesis and Characterization of Polyformals of Polyether Sulfones," *Polymer Bulletin*, 10, 385 (1983); the disclosures of each of which are totally incorporated herein by reference.

In all of the above reactions and substitutions illustrated herein for the polymer of the formula

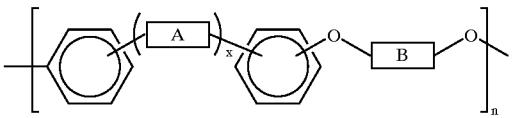

it is to be understood that analogous reactions and substitutions will occur for the polymer of the formula

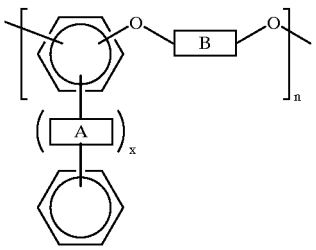

The blends of the present invention also contain a photoreactive epoxy resin. The photoreactive epoxy resin is generally a polymer having epoxy groups on the terminal end groups thereof and having acrylic, cinnamoyl, chalcone, or other suitable α,β-unsaturated functional groups within the polymer chain or pendant to the polymer chain. Epoxy groups can also be pendant from the polymer chain. The α,β-unsaturated functional groups provide sites for crosslinking or chain extension upon exposure to actinic radiation, particularly when free radical photoinitiating molecular species are incorporated in the composition. When photocationic initiators are present in the composition, pendant and terminal epoxy groups alone can provide the requisite photoactive functionality for crosslinking or chain extension. Radiation which activates crosslinking or chain extension can be of any desired source and any desired wavelength, including (but not limited to) visible light, infrared light, ultraviolet light, electron beam radiation, x-ray radiation, or the like. Most epoxy resins are photoreactive in the presence of cationic initiators, wherein the initiator generates a cation upon exposure to actinic radiation and the cation then attacks the epoxy group to effect polymerization. For the purposes of the present invention, however, the term "photoreactive epoxy resin" encompasses only those epoxy resins that are photoreactive even in the absence of photocationic initiators. Photocationic initiators may, if desired, be used in the present invention, but they are not required. Photoreactive epoxy resins frequently contain unsaturated groups therein. One example of a suitable photoreactive epoxy resin is a chalcone/bis-phenol-A epoxy resin, such as those of the formula

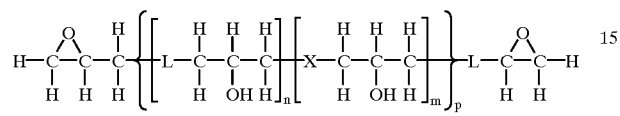

wherein L is

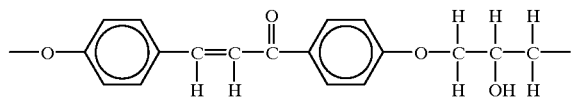

X is

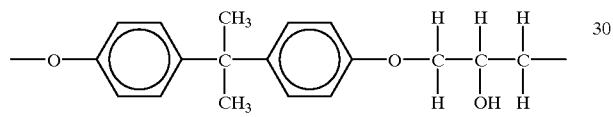

n is an integer representing the number of repeat glycidyl chalcone monomer units, and typically is from 0 to about 30, preferably from about 1 to about 10, although the value of n can be outside of these ranges, m is an integer representing the number of repeat glycidyl bis-phenol monomer units, and typically is from 0 to about 30, preferably from about 1 to about 10, although the value of m can be outside of these ranges, and p is an integer of 0 or 1. Epoxy resins of this formula are commercially available as, for example, PROBIMER® 52, from Ciba Specialty Chemicals, Los Angeles, Calif. Other suitable photoreactive epoxy resins include bis-phenol epoxy acrylates, including those of the general formula wherein n is an integer representing the number of repeat monomer units, typically being from 0 to about 30, and preferably from about 1 to about 30, although the value of n can be outside of these ranges, each R, independently of the others, is —CH₃ or —CF₃, and each R₁, independently of the others, is —H or

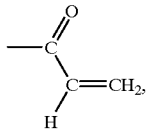

epoxy novolac acrylates, including those of the general formula

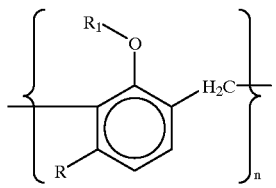

wherein n is an integer representing the number of repeat monomer units, preferably of from about 10 to about 100, although the value of n can be outside of this range, each R, independently of the others, is —H or —CH₃, and each R₁, independently of the others, is

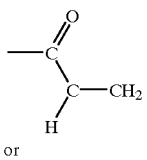

or

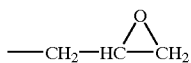

provided that at least one of the R₁ groups is

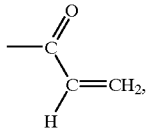

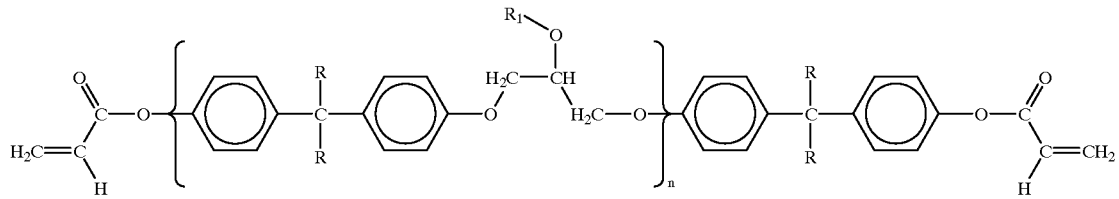

and the like, either alone or in combination with each other or with resins such as simple bis-phenol epoxy resins, including those of the general formula

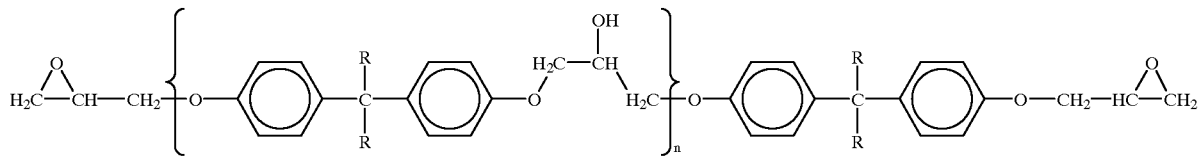

wherein n is an integer representing the number of repeat monomer units, typically from 0 to about 30, and preferably from about 1 to about 30, although the value of n can be outside of these ranges, and each R, independently of the others, is —CH₃ or —CF₃, simple epoxy novolac resins, including those of the formula

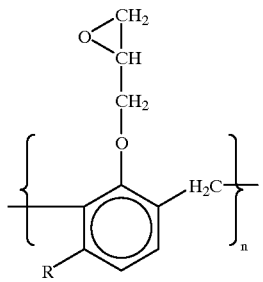

wherein R is —H or —CH₃; the simple epoxy novolac resins are also photosensitive in the presence of photocationic initiators. Ciba-Geigy's Plastics Division, Hawthorne, N.Y., supplies many epoxy resins containing only epoxy functionality; these resins can be used as blend components with the photofunctional epoxy resins in the present invention. Suitable resins include bis-phenol-A epoxy resins, such as the Araldite® liquid epoxy resins CY-225, CY-501,0 and CY-2600 Y, epoxy phenol novolac resins, such as PY-307, EPN-1138, and EPN-1139, epoxy resins based on hydantoin hetercyclic nitrogen-containing five membered ring structures, such as Aracast® XU AY 238, and bis-phenol-F epoxies such as GY-281.

Suitable photoreactive epoxy resins typically have epoxy equivalent weights of from about 100 to about 4,000, and preferably from about 100 to about 400, although the level of epoxy functionalization can be outside of these ranges.

Epoxy resins suitable for the present invention are available from commercial sources. Photoreactive epoxy resins with in-chain α,β-unsaturated functional groups are typified by Probimer-52, a chalcone/bis-phenol-A epoxy resin obtained from Ciba Specialty Chemicals, Los Angeles, Calif. Bis-phenol epoxy acrylates and are typified by the CN-104 and CN-120 difunctional epoxy acrylates available from Sartomer Co. Inc., Exton, Pa. Sartomer also supplies an epoxy novolac acrylate/trimethylol triacrylate blend which provides a suitable photoreactive component for the present invention. Other suitable resins available from Sartomer include CN-104A80, CN-104B80, CN-104C75, CN-104D80, CN-120A60, CN-120A75, CN-120B80, CN-120C80, CN-120C60, CN-120D80, CN-120E50, and CN-120S80, epoxidized soy bean oil acrylates, including CN-111, and epoxy novolac acrylates, including CN-112C60.

Suitable photoreactive epoxy resins typically are of a molecular weight of less than about 10,000, preferably from about 100 to about 4,000, and more preferably from about 1,000 to about 4,000, although the weight average molecular weight can be outside of these ranges.

The blend of thermally reactive polymer and photoreactive epoxy resin contains these two ingredients in any suitable, desired, or effective relative amounts. Typically, the blend contains the thermally reactive polymer in an amount of from about 50 to about 90 percent by weight, and preferably from about 50 to about 80 percent by weight, and typically contains the photoreactive epoxy resin in an amount of from about 10 to about 50 percent by weight, and preferably from about 20 to about 50 percent by weight, although the relative amounts can be outside of these ranges.

The photoresist blends of the present invention are cured in a two-stage process which entails (a) exposing the blend to actinic radiation, thereby causing the photoreactive epoxy resin to become crosslinked or chain extended; and (b) subsequent to step (a), heating the blend to a temperature of at least 100° C., thereby causing crosslinking or chain extension of the thermally reactive polymer.

The photoexposure cure step can be carried out by uniform exposure of the blend to actinic radiation at wavelengths and/or energy levels capable of causing crosslinking or chain extension of the photoreactive epoxy resin. Alternatively, the blend can be imagewise exposed to radiation at a wavelength and/or at an energy level to which the photoreactive epoxy resin sensitive.

The temperature selected for the thermal cure step generally depends on the thermal sensitivity imparting group which is present on the thermally reactive polymer. For example, ethynyl groups preferably are cured at temperatures of from about 150 to about 300° C. Halomethyl groups preferably are cured at temperatures of from about 150 to about 260° C. Hydroxymethyl groups preferably are cured at temperatures of from about 150 to about 250° C. Phenylethynyl phenyl groups preferably are cured at temperatures of greater than about 250° C. Epoxy groups preferably are cured at temperatures of about 150° C. Maleimide groups preferably are cured at temperatures of from about 200 to about 300° C. Benzocyclobutene groups preferably are cured at temperatures of over about 200° C. 5-Norbornene-2,3-dicarboximido groups preferably are cured at temperatures of from about 200 to about 300° C. Phenolic groups in the presence of hydroxymethyl or halomethyl groups preferably are cured at temperatures of from about 150 to about 210° C. Methyl ester groups preferably are cured at temperatures of from about 150 to about 250° C. Curing temperatures usually do not exceed about 400° C., although higher temperatures can be employed provided that decomposition of the polymer does not occur. Higher temperature cures preferably take place in an oxygen-excluded environment.

Typically, a photoresist composition will contain the blend of photoreactive epoxy resin and thermally reactive polymer, an optional solvent for the polymers in the blend, an optional sensitizer, and an optional photoinitiator. Solvents may be particularly desirable when the uncrosslinked photopatternable polymers have a high $T_g$. The solvent and polymer blend typically are present in relative amounts of from 20 to about 80 percent by weight solvent and from about 20 to 80 percent polymer blend, although the relative amounts can be outside these ranges.

Sensitizers absorb light energy and facilitate the transfer of energy to unsaturated bonds which can then react to crosslink or chain extend the resin. Sensitizers frequently expand the useful energy wavelength range for photoexposure, and typically are aromatic light absorbing chromophores. Sensitizers can also lead to the formation of photoinitiators, which can be free radical or ionic. When present, the optional sensitizer and the photopatternable polymer typically are present in relative amounts of from about 0.1 to about 20 percent by weight sensitizer and from about 80 to about 99.9 percent by weight photopatternable polymer, and preferably are present in relative amounts of from about 1 to about 10 percent by weight sensitizer and from about 90 to about 99 percent by weight photopatternable polymer, although the relative amounts can be outside these ranges.

Photoinitiators generally generate ions or free radicals which initiate polymerization upon exposure to actinic radiation. When present, the optional photoinitiator and the photopatternable polymer typically are present in relative amounts of from about 0.1 to about 20 percent by weight photoinitiator and from about 80 to about 99.9 percent by weight photopatternable polymer, and preferably are present in relative amounts of from about 1 to about 10 percent by weight photoinitiator and from about 90 to about 99 percent by weight photopatternable polymer, although the relative amounts can be outside these ranges.

A single material can also function as both a sensitizer and a photoinitiator.

Examples of specific sensitizers and photoinitiators include hydrogen-extracting triplet sensitizers such as Michler's ketone (Aldrich Chemical Co.), Darocure 1173, Darocure 4265, Irgacure 184, Irgacure 261, and Irgacure 907 (available from Ciba-Geigy, Ardsley, N.Y.), and mixtures thereof, preferably in combination with a photofragmentation initiator, such as acetophenone derivatives, hydroxyalkylphenones, acyl phosphine oxides, and the like, unless there is already a phenone moiety in the polymer backbone, in which situation the photofragmentation initiator may be used but is not necessary. Further background material on initiators is disclosed in, for example, Ober et al., *J.M.S.—Pure Appl. Chem.,* A30 (12), 877–897 (1993); G. E. Green, B. P. Stark, and S. A. Zahir, "Photocrosslinkable Resin Systems," *J. Macro. Sci.—Revs. Macro. Chem.,* C21 (2), 187 (1981); H. F. Gruber, "Photoinitiators for Free Radical Polymerization," *Prog. Polym. Sci.,* Vol. 17, 953 (1992); Johann G. Kloosterboer, "Network Formation by Chain Crosslinking Photopolymerization and Its Applications in Electronics," *Advances in Polymer Science,* 89, Springer-Verlag Berlin Heidelberg (1988); and "Diaryliodonium Salts as Thermal Initiators of Cationic Polymerization," J. V. Crivello, T. P. Lockhart, and J. L. Lee, *J. of Polymer Science: Polymer Chemistry Edition,* 21, 97 (1983), the disclosures of each of which are totally incorporated herein by reference. Sensitizers are available from, for example, Aldrich Chemical Co., Milwaukee, Wis., and Pfaltz and Bauer, Waterberry, Conn. Benzophenone and its derivatives can function as photosensitizers. Triphenylsulfonium and diphenyl iodonium salts are examples of typical cationic photoinitiators.

Inhibitors may also optionally be present in the photoresist containing the photopatternable polymer. Examples of suitable inhibitors include MEHQ, a methyl ether of hydroquinone, of the formula

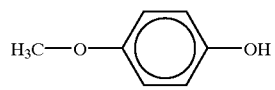

t-butylcatechol, of the formula

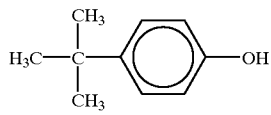

hydroquinone, of the formula

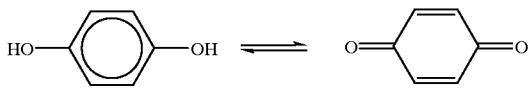

and the like, the inhibitor typically present in an amount of from about 500 to about 1,500 parts per million by weight of a photoresist solution containing about 40 percent by weight polymer solids, although the amount can be outside this range.

Further information regarding photoresist compositions is disclosed in, for example, J. J. Zupancic, D. C. Blazej, T. C. Baker, and E. A. Dinkel, *Polymer Preprints,* 32, (2), 178 (1991); "High Performance Electron Negative Resist, Chloromethylated Polystyrene. A Study on Molecular Parameters," S. Imamura, T. Tamamura, and K. Harada,*J. of Applied Polymer Science,* 27, 937 (1982); "Chloromethylated Polystyrene as a Dry Etching-Resistant Negative Resist for Submicron Technology", S. Imamura, *J. Electrochem. Soc.: Solid-state Science and Technology,* 126(9), 1628 (1979); "UV curing of composites based on modified unsaturated polyesters," W. Shi and B. Ranby, J. of Applied Polymer Science, Vol. 51, 1129 (1994); "Cinnamates VI. Light-Sensitive Polymers with Pendant o-,m- and p-hydroxycinnamate Moieties," F. Scigalski, M. Toczek, and J. Paczkowski, *Polymer,* 35, 692 (1994); and "Radiation-cured Polyurethane Methacrylate Pressure-sensitive Adhesives," G. Ansell and C. Butler, *Polymer,* 35 (9), 2001 (1994), the disclosures of each of which are totally incorporated herein by reference.

In one embodiment, a heater wafer with a phosphosilicate glass layer is spin coated with a solution of Z6020 adhesion promoter (about 0.01 weight percent in about 95 parts methanol and about 5 parts water, available from Dow Corning Co., Midland, Mich.) at about 3,000 revolutions per minute for about 10 seconds and dried at about 100° C. for from about 1 to about 2 minutes. The wafer is then allowed to cool to ambient temperature (about 25° C.) for about 5 minutes before spin coating the photoresist containing the photopatternable polymer blend onto the wafer at from about 1,000 to about 3,000 revolutions per minute for from about 30 to about 60 seconds. The resist solution is made by dissolving a blend containing about 75/25 by weight of a thermally sensitive polymer, such as a polyarylene ether ketone with about 1.5 chloromethyl groups per repeat unit and a weight average molecular weight of about 20,000, and a photoreactive epoxy resin, such as Probimer®52 (commercial material obtained as a 2-methoxyethanol/2-ethoxyethanol acetate solution, subsequently precipitated in methanol, isolated, and dried) in γ-butyrolactone at about 40 weight percent solids with about 1 percent by weight of the amine synergist dimethylamino benzoate. The film is heated (soft baked) in an oven for from about 10 to about 15 minutes at about 70° C. After cooling to ambient temperature over about 5 minutes, the film is covered with a mask and exposed to about 365 nanometer ultraviolet light, providing an exposure of greater than about 2,000 millijoules per square centimeter. The film is then developed with a developer containing about 60:40 weight percent chloroform/cyclohexane, washed with a solution containing about 90:10 weight percent hexanes/cyclohexane, and dried at about 70° C. for about 2 minutes. The processed wafer is transferred to an oven with controlled atmosphere (either argon or nitrogen) at about 25° C., and the oven temperature is raised from about 25° C. to about 90° C. at about 2° C. per minute. The temperature is maintained at about 90° C. for about 2 hours and then increased to about 260° C. at about 2° C. per minute. The oven temperature is maintained at about 260° C. for about 2 hours, and the oven is then turned off and the temperature allowed to cool gradually to ambient temperature. If a second layer is spin coated onto the first layer, the maximum temperature in the heat cure of the first developed layer will generally be reduced to about 150° C. A second, perhaps thicker, layer is deposited by repeating the above procedure and curing to about 260° C. This process is intended to be a guide in that the procedures used can be outside of the above specific conditions, depending on the film thickness, the blended photoresist composition, the molecular weight of photoresist resin components, the amine synergist selection, the use of ancillary α-cleavage photoinitiators, or the like. Films at from about 10 to about 20 microns in thickness have been developed cleanly at a resolution of about 600 dots per inch.

When the polymer blend is cured, the resulting material is an interpenetrating network of the two polymers. The initial blend is homogeneous, and when the epoxy resin is subjected to actinic radiation, it crosslinks and traps the thermally sensitive polymer therein. The subsequent thermal cure then consolidates the matrix.

The polymer blends of the present invention can be used as components in ink jet printheads. The printheads of the present invention can be of any suitable configuration. An example of a suitable configuration, suitable in this instance for thermal ink jet printing, is illustrated schematically in FIG. 1, which depicts an enlarged, schematic isometric view of the front face 29 of a printhead 10 showing the array of droplet emitting nozzles 27. Referring also to FIG. 2, discussed later, the lower electrically insulating substrate or heating element plate 28 has the heating elements 34 and addressing electrodes 33 patterned on surface 30 thereof, while the upper substrate or channel plate 31 has parallel grooves 20 which extend in one direction and penetrate through the upper substrate front face edge 29. The other end of grooves 20 terminate at slanted wall 21, the floor 41 of the internal recess 24 which is used as the ink supply manifold for the capillary filled ink channels 20, has an opening 25 therethrough for use as an ink fill hole. The surface of the channel plate with the grooves are aligned and bonded to the heater plate 28, so that a respective one of the plurality of heating elements 34 is positioned in each channel, formed by the grooves and the lower substrate or heater plate. Alternatively (not shown), the ink channels can be formed in the lower electrically insulating substrate or heating element plate 28 with the heating elements 34 and addressing electrodes 33 patterned on surface 30 thereof, wherein the insulating substrate or heating element 28 has patterned channels thereon of sufficient depth to define the desired size of ink channels, and the upper substrate 31 is flat and without grooves therein. In this embodiment, the upper substrate 31 can be bonded to insulating substrate or heating plate 28 with no need to align or mate upper substrate 31 with heating plate 28.

Ink enters the manifold formed by the recess 24 and the lower substrate 28 through the fill hole 25 and by capillary action, fills the channels 20 by flowing through an elongated recess 38 formed in the thick film insulative layer 18. The ink at each nozzle forms a meniscus, the surface tension of which prevents the ink from weeping therefrom. The addressing electrodes 33 on the lower substrate or channel plate 28 terminate at terminals 32. The upper substrate or channel plate 31 is smaller than that of the lower substrate in order that the electrode terminals 32 are exposed and available for wire bonding to the electrodes on the daughter board 19, on which the printhead 10 is permanently mounted. Layer 18, discussed later, is a thick film passivation layer sandwiched between the upper and lower substrates. This layer is etched to expose the heating elements, thus placing them in a pit, and is etched to form the elongated recess to enable ink flow between the manifold 24 and the ink channels 20. In addition, the thick film insulative layer is etched to expose the electrode terminals.

Figure 2:
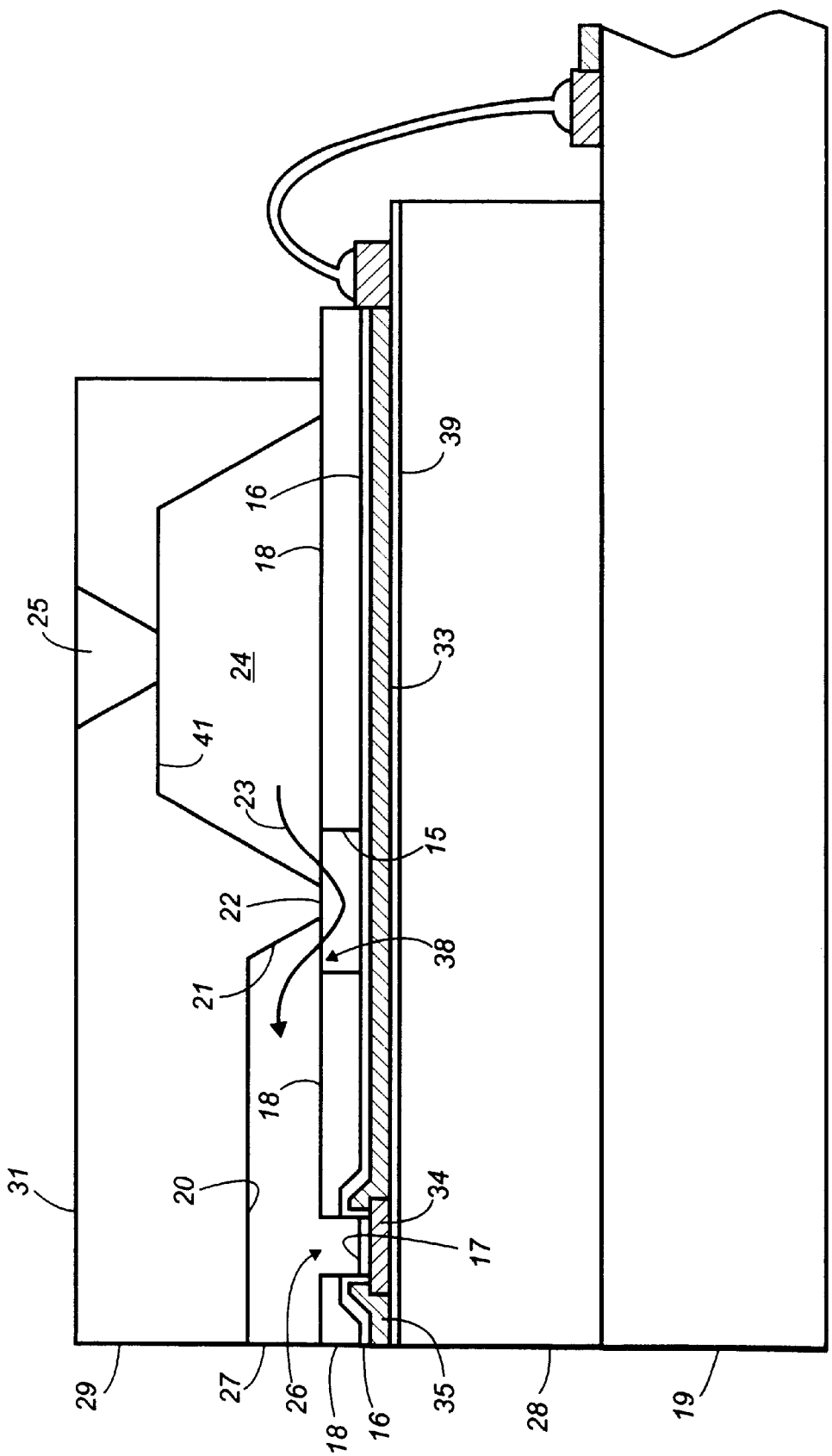
FIG. 2 is an enlarged cross-sectional view of FIG. 1 as viewed along the line 2—2 thereof and showing the electrode passivation and ink flow path between the manifold and the ink channels.

A cross sectional view of FIG. 1 is taken along view line 2—2 through one channel and shown as FIG. 2 to show how the ink flows from the manifold 24 and around the end 21 of the groove 20 as depicted by arrow 23. As is disclosed in U.S. Pat. Nos. 4,638,337, 4,601,777, and U.S. Pat. No. Re. 32,572, the disclosures of each of which are totally incorporated herein by reference, a plurality of sets of bubble generating heating elements 34 and their addressing electrodes 33 can be patterned on the polished surface of a single side polished (100) silicon wafer. Prior to patterning, the multiple sets of printhead electrodes 33, the resistive material that serves as the heating elements 34, and the common return 35, the polished surface of the water is coated with an underglaze layer 39 such as silicon dioxide, having a typical thickness of from about 5,000 Angstroms to about 2 microns, although the thickness can be outside this range. The resistive material can be a doped polycrystalline silicon, which can be deposited by chemical vapor deposition (CVD) or any other well known resistive material such as zirconium boride ($ZrB_2$). The common return and the addressing electrodes are typically aluminum leads deposited on the underglaze and over the edges of the heating elements. The common return ends or terminals 37 and addressing electrode terminals 32 are positioned at predetermined locations to allow clearance for wire bonding to the electrodes (not shown) of the daughter board 19, after the channel plate 31 is attached to make a printhead. The common return 35 and the addressing electrodes 33 are deposited to a thickness typically of from about 0.5 to about 3 microns, although the thickness can be outside this range, with the preferred thickness being 1.5 microns.

If polysilicon heating elements are used, they may be subsequently oxidized in steam or oxygen at a relatively high temperature, typically about 1,100 C., although the temperature can be above or below this value, for a period of time typically of from about 50 to about 80 minutes, although the time period can be outside this range, prior to the deposition of the aluminum leads, in order to convert a small portion of the polysilicon to $SiO_2$. In such cases, the heating elements are thermally oxidized to achieve an overglaze (not shown) of $SiO_2$ with a thickness typically of from about 500 Angstroms to about 1 micron, although the thickness can be outside this range, which has good integrity with substantially no pinholes.

In one embodiment, polysilicon heating elements are used and an optional silicon dioxide thermal oxide layer 17 is grown from the polysilicon in high temperature steam. The thermal oxide layer is typically grown to a thickness of from about 0.5 to about 1 micron, although the thickness can be outside this range, to protect and insulate the heating elements from the conductive ink. The thermal oxide is removed at the edges of the polysilicon heating elements for attachment of the addressing electrodes and common return, which are then patterned and deposited. If a resistive material such as zirconium boride is used for the heating elements, then other suitable well known insulative materials can be used for the protective layer thereover. Before electrode passivation, a tantalum (Ta) layer (not shown) can be optionally deposited, typically to a thickness of about 1 micron, although the thickness can be above or below this value, on the heating element protective layer 17 for added protection thereof against the cavitational forces generated by the collapsing ink vapor bubbles during printhead operation. The tantalum layer is etched off all but the protective layer 17 directly over the heating elements using, for example, $CF_4/O_2$ plasma etching. For polysilicon heating elements, the aluminum common return and addressing electrodes typically are deposited on the underglaze layer and over the opposing edges of the polysilicon heating elements which have been cleared of oxide for the attachment of the common return and electrodes.

For electrode passivation, a film 16 is deposited over the entire wafer surface, including the plurality of sets of heating elements and addressing electrodes. The passivation film 16 provides an ion barrier which will protect the exposed electrodes from the ink. Examples of suitable ion barrier materials for passivation film 16 include polyimide, plasma nitride, phosphorous doped silicon dioxide, materials disclosed hereinafter as being suitable for insulative layer 18, and the like, as well as any combinations thereof. An effective ion barrier layer is generally achieved when its thickness is from about 1000 Angstroms to about 10 microns, although the thickness can be outside this range. In 300 dpi printheads, passivation layer 16 preferably has a thickness of about 3 microns, although the thickness can be above or below this value. In 600 dpi printheads, the thickness of passivation layer 16 preferably is such that the combined thickness of layer 16 and layer 18 is about 25 microns, although the thickness can be above or below this value. The passivation film or layer 16 is etched off of the terminal ends of the common return and addressing electrodes for wire bonding later with the daughter board electrodes. This etching of the silicon dioxide film can be by either the wet or dry etching method. Alternatively, the electrode passivation can be by plasma deposited silicon nitride ($Si_3N_4$).

Next, a thick film type insulative layer 18 is formed on the passivation layer 16, typically having a thickness of from about 10 to about 100 microns and preferably in the range of from about 25 to about 50 microns, although the thickness can be outside these ranges. When upper substrate 31 is flat and without grooves therein, layer 18 is of sufficient thickness that, when the portions thereof covering the heating elements are removed to form recesses 26, the resulting recesses 26 are of a size to enable formation of ink channels of the desired dimensions when flat upper substrate 31 is bonded to heating plate 28. Layer 18 can be made of any suitable or desired photopatternable material, such as Riston®, Vacrel®, Probimer®, polyimides, including (but not limited to) those disclosed in, for example, U.S. Pat. No. 5,773,553, the disclosure of which is totally incorporated herein by reference, photoactive polyarylene ether-type materials, or the like. Preferably, layer 18 is formulated with a photoresist polymer blend of the present invention. Preferably, in 300 dpi printheads, layer 18 preferably has a thickness of about 40 microns, and in 600 dpi printheads, layer 18 preferably has a thickness of from about 20 to about 22 microns, although other thicknesses can be employed. The insulative layer 18 is photolithographically processed to enable etching and removal of those portions of the layer 18 over each heating element (forming recesses 26), the elongated recess 38 for providing ink passage from the manifold 24 to the ink channels 20, and over each electrode terminal 32, 37. The elongated recess 38 is formed by the removal of this portion of the thick film layer 18. Thus, the passivation layer 16 alone protects the electrodes 33 from exposure to the ink in this elongated recess 38.

Figure 3:
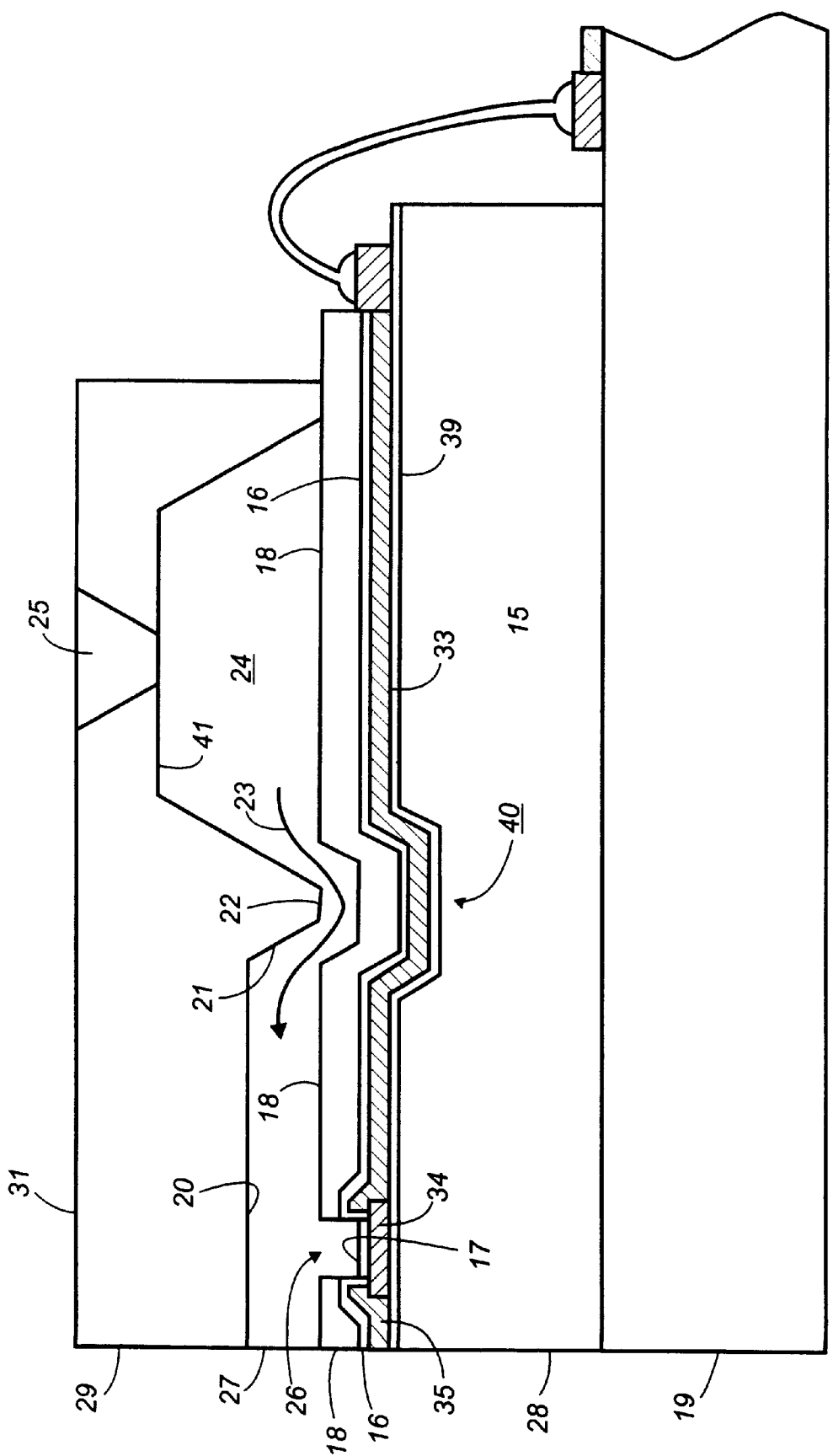
FIG. 3 is an enlarged cross-sectional view of an alternate embodiment of the printhead in FIG. 1 as viewed along the line 2—2 thereof.

FIG. 3 is a similar view to that of FIG. 2 with a shallow anisotropically etched groove 40 in the heater plate, which is silicon, prior to formation of the underglaze 39 and patterning of the heating elements 34, electrodes 33 and common return 35. This recess 40 permits the use of only the thick film insulative layer 18 and eliminates the need for the usual electrode passivating layer 16. Since the thick film layer 18 is impervious to water and relatively thick (typically from about 20 to about 40 microns, although the thickness can be outside of this range), contamination introduced into the circuitry will be much less than with only the relatively thin passivation layer 16 well known in the art. The heater plate is a fairly hostile environment for integrated circuits. Commercial ink generally entails a low attention to purity. As a result, the active part of the heater plate will be at elevated temperature adjacent to a contaminated aqueous ink solution which undoubtedly abounds with mobile ions. In addition, it is generally desirable to run the heater plate at a voltage of from about 30 to about 50 volts, so that there will be a substantial field present. Thus, the thick film insulative layer 18 provides improved protection for the active devices and provides improved protection, resulting in longer operating lifetime for the heater plate.

When a plurality of lower substrates 28 are produced from a single silicon wafer, at a convenient point after the underglaze is deposited, at least two alignment markings (not shown) preferably are photolithographically produced at predetermined locations on the lower substrates 28 which make up the silicon wafer when channel plate 31 has grooves therein defining the ink channels. These alignment markings are used for alignment of the plurality of upper substrates 31 containing the ink channels. The surface of the single sided wafer containing the plurality of sets of heating elements is bonded to the surface of the wafer containing the plurality of ink channel containing upper substrates subsequent to alignment. No alignment or alignment markings are needed when upper substrate 31 is flat and without grooves therein.

In one embodiment of the present invention, by methods similar to those disclosed in U.S. Pat. Nos. 4,601,777 and 4,638,337, the disclosures of each of which are totally incorporated herein by reference, the channel plate is formed from, for example, a two side polished, (100) silicon wafer to produce a plurality of upper substrates 31 for the printhead. After the wafer is chemically cleaned, a layer is deposited on both sides. This layer can be of a material such as pyrolytic CVD silicon nitride, or of a polymer blend of the present invention. Using photolithographic techniques as described hereinabove with respect to layer 18, a via for fill hole 25 for each of the plurality of channel plates 31 and at least two vias for alignment openings (not shown) at predetermined locations are formed on one wafer side. The layer is removed from the patterned vias representing the fill holes and alignment openings; when the layer is of a material such as silicon nitride, it can be plasma etched to remove it; when the layer is of one of the polymer blends of the present invention, it can be photoexposed and removed. A potassium hydroxide (KOH) anisotropic etch can be used to etch the fill holes and alignment openings. In this case, the [111] planes of the (100) wafer typically make an angle of about 54.7 degrees with the surface of the wafer. The fill holes are small square surface patterns, typically of about 20 mils (500 microns) per side, although the dimensions can be above or below this value, and the alignment openings typically are from about 60 to about 80 mils (1.5 to 3 millimeters) square, although the dimensions can be outside this range. Thus, the alignment openings are etched entirely through the 20 mil (0.5 millimeter) thick wafer, while the fill holes are etched to a terminating apex at about halfway through to three-quarters through the wafer. The relatively small square fill hole is invariant to further size increase with continued etching so that the etching of the alignment openings and fill holes are not significantly time constrained. When upper substrate 31 is flat and has no grooves therein, no formation of ink channels or alignment holes are required; said upper substrate can, for example, comprise a layer formed by uniformly exposing to actinic radiation a polymer blend of the present invention, said layer being deposited on a supporting substrate of any suitable or desired material, such as a silicon wafer, a plastic substrate of, for example, polymethyl methacrylate or MYLAR®, or the like. When upper substrate 31 has channels or grooves therein, said upper substrate can, for example, comprise a layer formed by imagewise exposing to actinic radiation a polymer blend of the present invention, said layer being deposited on a supporting substrate of any suitable or desired material.

Next, the opposite side of the wafer is photolithographically patterned, using the previously etched alignment holes as a reference to form the relatively large rectangular recesses 24 and sets of elongated, parallel channel recesses that will eventually become the ink manifolds and channels of the printheads. The free standing channel plate 31 can then be bonded to the heater plate 28.

The surface 22 of the wafer containing the manifold and channel recesses are portions of the original wafer surface on which an adhesive, such as a thermosetting epoxy, will be applied later for bonding it to the substrate containing the plurality of sets of heating elements. The adhesive is applied in a manner such that it does not run or spread into the grooves, if present, or other recesses. The alignment markings can be used with, for example, a vacuum chuck mask aligner to align the channel wafer on the heating element and addressing electrode wafer. The two wafers are accurately mated and can be tacked together by partial curing of the adhesive. Alternatively, the heating element and channel wafers can be given precisely diced edges and then manually or automatically aligned in a precision jig. Alignment can also be performed with an infrared aligner-bonder, with an infrared microscope using infrared opaque markings on each wafer to be aligned, or the like. The two wafers can then be cured in an oven or laminator to bond them together permanently. The channel wafer can then be milled to produce individual upper substrates. A final dicing cut, which produces end face 29, opens one end of the elongated groove 20 producing nozzles 27. The other ends of the channel groove 20 remain closed by end 21. However, the alignment and bonding of the channel plate to the heater plate places the ends 21 of channels 20 directly over elongated recess 38 in the thick film insulative layer 18 as shown in FIG. 2 or directly above the recess 40 as shown in FIG. 3 enabling the flow of ink into the channels from the manifold as depicted by arrows 23. The plurality of individual printheads produced by the final dicing are bonded to the daughter board and the printhead electrode terminals are wire bonded to the daughter board electrodes.

The printhead illustrated in FIGS. 1 through 3 constitutes a specific embodiment of the present invention. Any other suitable printhead configuration comprising ink-bearing channels terminating in nozzles on the printhead surface can also be employed with the materials disclosed herein to form a printhead of the present invention.

Specific embodiments of the invention will now be described in detail. These examples are intended to be illustrative, and the invention is not limited to the materials, conditions, or process parameters set forth in these embodiments. All parts and percentages are by weight unless otherwise indicated.

EXAMPLE I

A polyarylene ether ketone of the formula

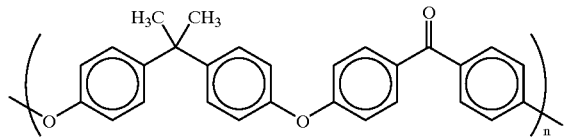

wherein n is between about 6 and about 30 (hereinafter referred to as poly(4-CPK-BPA)) was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis. 50 grams), bis-phenol A (Aldrich 23,965-8, 48.96 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 24 hours of heating at 175° C. with continuous stirring, an aliquot of the reaction product that had been precipitated into methanol was analyzed by gel permeation chromatography (gpc) (elution solvent was tetrahydrofuran) with the following results: $M_n$ 4464, $M_{peak}$ 7583, $M_w$ 7927, $M_z$ 12,331, and $M_{z+1}$ 16,980. After 48 hours at 175° C. with continuous stirring, the reaction mixture was filtered to remove potassium carbonate and precipitated into methanol (2 gallons). The polymer (poly(4-CPK-BPA)) was isolated in 86% yield after filtration and drying in vacuo. GPC analysis was as follows: $M_n$ 5347, $M_{peak}$ 16,126, $M_w$ 15,596, $M_z$ 29,209, and $M_{z+1}$ 42,710. The glass transition temperature of the polymer was about 120±10° C. as determined using differential scanning calorimetry at a heating rate of 20° C. per minute. Solution cast films from methylene chloride were clear, tough, and flexible. As a result of the stoichiometries used in the reaction, it is believed that this polymer had end groups derived from bis-phenol A.

EXAMPLE II

A polyarylene ether ketone of the formula

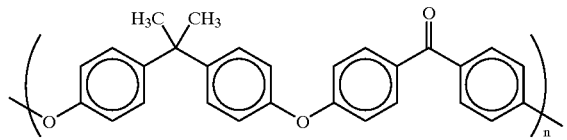

wherein n is between about 2 and about 30 (hereinafter referred to as poly(4-CPK-BPA)) was prepared as follows. A 5 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis. 250 grams), bis-phenol A (Aldrich 23,965-8, 244.8 grams), potassium carbonate (327.8 grams), anhydrous N,N-dimethylacetamide (1,500 milliliters), and toluene (275 milliliters) were added to the flask and heated to 175° C. (oil bath temperature) while the volatile toluene component was collected and removed. After 48 hours of heating at 175° C. with continuous stirring, the reaction mixture was filtered to remove insoluble salts, and the resultant solution was added to methanol (5 gallons) to precipitate the polymer. The polymer was isolated by filtration, and the wet filter cake was washed with water (3 gallons) and then with methanol (3 gallons). The yield was 360 grams of vacuum dried product. The molecular weight of the polymer was determined by gel permeation chromatography (gpc) (elution solvent was tetrahydrofuran) with the following results: $M_n$ 3,601, $M_{peak}$ 5,377, $M_w$ 4,311, $M_z$ 8,702, and $M_{z+1}$ 12,951. The glass transition temperature of the polymer was between 125 and 155° C. as determined using differential scanning calorimetry at a heating rate of 20° C. per minute dependent on molecular weight. Solution cast films from methylene chloride were clear, tough, and flexible. As a result of the stoichiometries used in the reaction, it is believed that this polymer had end groups derived from bis-phenol A.

EXAMPLE III

A solution of chloromethyl ether in methyl acetate was made by adding 282.68 grams (256 milliliters) of acetyl chloride to a mixture of dimethoxy methane (313.6 grams, 366.8 milliliters) and methanol (10 milliliters) in a 5 liter 3-neck round-bottom flask equipped with a mechanical stirrer, argon inlet, reflux condenser, and addition funnel. The solution was diluted with 1,066.8 milliliters of 1,1,2,2-tetrachloroethane and then tin tetrachloride (2.4 milliliters) was added via a gas-tight syringe along with 1,1,2,2-tetrachloroethane (133.2 milliliters) using an addition funnel. The reaction solution was heated to 500° C. Thereafter, a solution of poly(4-CPK-BPA) prepared as described in Example II (160.8 grams) in 1,000 milliliters of tetrachloroethane was added rapidly. The reaction mixture was then heated to reflux with an oil bath set at 110° C. After four hours reflux with continuous stirring, heating was discontinued and the mixture was allowed to cool to 25° C. The reaction mixture was transferred in stages to a 2 liter round bottom flask and concentrated using a rotary evaporator with gentle heating up to 50° C. while reduced pressure was maintained with a vacuum pump trapped with liquid nitrogen. The concentrate was added to methanol (4 gallons) to precipitate the polymer using a Waring blender. The polymer was isolated by filtration and vacuum dried to yield 200 grams of poly(4-CPK-BPA) with 1.5 chloromethyl groups per repeat unit as identified using $^1$H NMR spectroscopy. When the same reaction was carried out for 1, 2, 3, and 4 hours, the amount of chloromethyl groups per repeat unit was 0.76, 1.09, 1.294, and 1.496, respectively.

Solvent free polymer was obtained by reprecipitation of the polymer (75 grams) in methylene chloride (500 grams) into methanol (3 gallons) followed by filtration and vacuum drying to yield 70.5 grams (99.6% theoretical yield) of solvent free polymer.

When the reaction was carried out under similar conditions except that 80.4 grams of poly(4-CPK-BPA) was used instead of 160.8 grams and the amounts of the other reagents were the same as indicated above, the polymer is formed with 1.31, 1.50, 1.75, and 2 chloromethyl groups per repeat unit in 1, 2, 3, and 4 hours, respectively, at 110° C. (oil bath temperature).

When 241.2 grams of poly(4-CPK-BPA) was used instead of 160.8 grams with the other reagents fixed, poly(CPK-BPA) was formed with 0.79, 0.90, 0.98, 1.06, 1.22, and 1.38 chloromethyl groups per repeat unit in 1, 2, 3, 4, 5, and 6 hours, respectively, at 110° C. (oil bath temperature).

When 321.6 grams of poly(4-CPK-BPA) was used instead of 160.8 grams with the other reagents fixed, poly(CPK-BPA) was formed with 0.53, 0.59, 0.64, 0.67, 0.77, 0.86, 0.90, and 0.97 chloromethyl groups per repeat unit in 1, 2, 3, 4, 5, 6, 7, and 8 hours, respectively, at 110° C. (oil bath temperature).

EXAMPLE IV

A polyarylene ether ketone of the formula

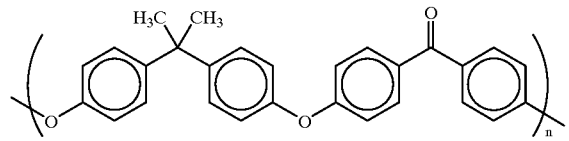

was prepared as described in Example I. A solution of chloromethyl ether in methyl acetate was made by adding 35.3 grams of acetyl chloride to a mixture of dimethoxy methane (45 milliliters) and methanol (1.25 milliliters) in a 500 milliliter 3-neck round-bottom flask equipped with a mechanical stirrer, argon inlet, reflux condenser, and addition funnel. The solution was diluted with 150 milliliters of 1,1,2,2-tetrachloroethane and then tin tetrachloride (0.3 milliliters) was added via syringe. The solution was heated to reflux with an oil bath set at 110° C. Thereafter, a solution of poly(4-CPK-BPA) (10 grams) in 125 milliliters of 1,1,2, 2-tetrachloroethane was added over 8 minutes. After two hours reflux with continuous stirring, heating was discontinued and the mixture was allowed to cool to 25° C. The reaction mixture was transferred to a rotary evaporator with gentle heating at between 50 and 55° C. After 1 hour, when most of the volatiles had been removed, the reaction mixture was added to methanol (each 25 milliliters of solution was added to 0.75 liter of methanol) to precipitate the polymer using a Waring blender. The precipitated polymer was collected by filtration, washed with methanol, and air-dried to yield 13 grams of off-white powder. The polymer had about 1.5 $CH_2Cl$ groups per repeat unit.

EXAMPLE V

A chloromethylated polyarylene ether ketone having 1.5 chloromethyl groups per repeat unit was prepared as described in Example III. A solution containing 10 grams of the chloromethylated polymer in 71 milliliters of N,N-dimethyl acetamide was magnetically stirred with 5.71 grams of sodium acetate (obtained from Aldrich Chemical Co., Milwaukee, Wis.). The reaction was allowed to proceed for one week. The reaction mixture was then centrifuged and the supernate was added to methanol (0.5 gallon) to precipitate the polymer. The polymer was then filtered, washed with water (2 liters), and subsequently washed with methanol (0.5 gallon). Approximately half of the chloromethyl groups were replaced with acetoxymethylene groups, and it is believed that the polymer was of the formula

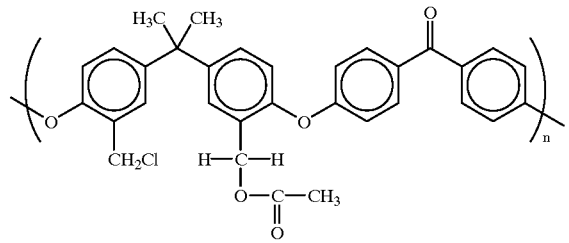

When the process was repeated under similar conditions but allowed to proceed for about 2 weeks, nearly all of the chloromethyl groups were replaced with methylcarboxymethylene groups, and the resulting polymer was believed to be of the formula

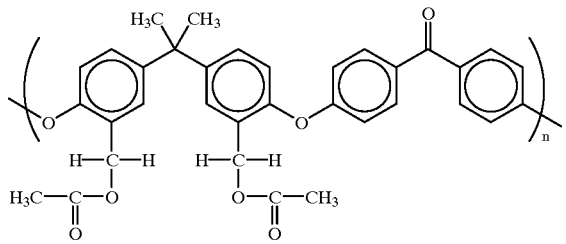

EXAMPLE VI

A chloromethylated polymer having 1.0 chloromethyl groups per repeat unit was prepared as described in Example III. A 1-liter, 3-neck flask equipped with a mechanical stirrer, argon inlet, and addition funnel was charged with 175 milliliters of freshly distilled tetrahydrofuran. Sodium hydride (6 grams), obtained from Aldrich Chemical Co., Milwaukee, Wis. was added, followed by addition of 2-allyl phenol (5 grams) dropwise, resulting in vigorous hydrogen gas evolution. Thereafter, a solution containing 5 grams of the chloromethylated polyarylene ether ketone in 50 milliliters of tetrahydrofuran was added. Stirring at 25° C. was continued for 48 hours. The resulting polymer was filtered and the supernatant fluid was concentrated using a rotary evaporator. The concentrate was then added to methanol to precipitate the polymer, followed by in vacuo drying of the polymer.

The dried polymer (0.2 grams) in methylene chloride (100 milliliters) was then treated with 1 gram of m-chloroperoxybenzoic acid (obtained from Aldrich Chemical Co., Milwaukee, Wis.) and magnetically stirred for 2 hours in a 200 milliliter bottle. The polymer was then added to saturated aqueous sodium bicarbonate (200 milliliters) and the methylene chloride was removed using a rotary evaporator. The resulting epoxidized polymer was filtered, washed with methanol (3 cups), and vacuum dried.

EXAMPLE VII

The process of Example VI was repeated with the exception that 5 grams of allyl alcohol were used instead of the 2-allylphenol. Similar results were obtained.

EXAMPLE VIII

A polyarylene ether ketone of the formula

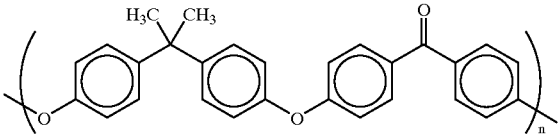

wherein n is between about 2 and about 30 (hereinafter referred to as poly(4-CPK-BPA)) was prepared as follows. A 5-liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis. 250 grams), bis-phenol A (Aldrich 23,965-8, 244.8 grams), potassium carbonate (327.8 grams), anhydrous N,N-dimethylacetamide (1,500 milliliters), and toluene (275 milliliters) were added to the flask and heated to 175° C. (oil bath temperature) while the volatile toluene component was collected and removed. After hours of heating 30 hours at 175° C. with continuous stirring, the reaction mixture was filtered to remove insoluble salts, and the resultant solution was added to methanol (5 gallons) to precipitate the polymer. The polymer was isolated by filtration, and the wet filter cake was washed with water (3 gallons) and then with methanol (3 gallons). The yield was 360 grams of vacuum dried polymer. The molecular weight of the polymer was determined by gel permeation chromatography (gpc) (elution solvent was tetrahydrofuran) with the following results: $M_n$ 2,800, $M_{peak}$ 5,800, $M_w$ 6,500, $M_z$ 12,000 and $M_{z+1}$ 17,700. As a result of the stoichiometries used in the reaction, it is believed that this polymer had end groups derived from bis-phenol A. When the reaction was allowed to proceed for 35, 40, and 48 hours at 175° C., the respective values of $M_n$ of the poly(4-CPK-BPA) formed were 3,000, 3,300, and 4,000.

A solution containing 100 parts by weight of the polyarylene ether ketone thus prepared having a $M_n$ of 2,800, 44.5 parts by weight of paraformaldehyde, 1 part by weight sodium hydroxide, and 1 part by weight tetramethylammonium hydroxide in 200 parts by weight 1,1,2,2-tetrachloroethane was heated at 100° C. Vigorous stirring and heating were continued for 16 hours. The resultant mixture was extracted with water and the organic layer was dried over magnesium sulfate. After precipitation into methanol, the filtered polymer was vacuum dried to yield 100 parts by weight hydroxymethylated polyarylene ether ketone with 1.0 hydroxymethyl group per repeat unit.

EXAMPLE IX

A chloromethylated polyarylene ether ketone having 1.5 chloromethyl groups per repeat unit is prepared as described in Example III. A solution containing 13.8 parts by weight of the chloromethylated polymer, 23 parts by weight tetrabutylammonium hydroxide, 7.6 parts water, and 50 parts by weight methylene chloride is stirred at 25° C. while 30 parts by weight of an aqueous sodium hydroxide solution (50 percent by weight sodium hydroxide) is added. Stirring at 25° C. is continued for 16 hours, at which time the organic layer is separated, washed with water, dried over magnesium sulfate, and added to methanol (1 gallon) using a Waring blender to precipitate the polymer. The filtered polymer is vacuum dried to obtain about 12 parts by weight of the hydroxymethylated polymer containing 1 hydroxymethyl group per repeat unit. Refluxing the reaction mixture results in nearly total replacement of the chloromethyl groups by the hydroxymethyl groups.

EXAMPLE X

A polyarylene ether ketone of the formula

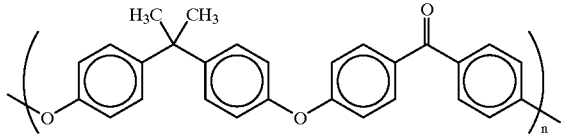

wherein n is between about 6 and about 30 (hereinafter referred to as poly(4-CPK-BPA)) was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis. 53.90 grams), bis-phenol A (Aldrich 23,965-8, 45.42 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 24 hours of heating at 175° C. with continuous stirring, the reaction mixture was filtered to remove potassium carbonate and precipitated into methanol (2 gallons). The polymer (poly (4-CPK-BPA)) was isolated in 86% yield after filtration and drying in vacuo. GPC analysis was as follows: $M_n$ 4,239, $M_{peak}$ 9,164, $M_w$ 10,238, $M_z$ 18,195, and $M_{z+1}$ 25,916. Solution cast films from methylene chloride were clear, tough, and flexible. As a result of the stoichiometries used in the reaction, it is believed that this polymer had end groups derived from 4,4-dichlorobenzophenone.

EXAMPLE XI

A benzophenone-terminated polyarylene ether ketone prepared as described in Example X was chloromethyl substituted as described in Example III, resulting in a benzophenone-terminated, chloromethylated polymer having 0.5 chloromethyl groups per repeat unit.

EXAMPLE XII

A polymer of the formula

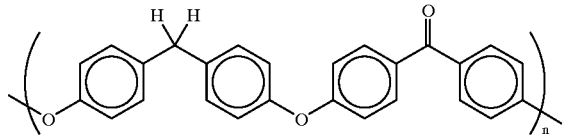

wherein n represents the number of repeating monomer units was prepared as follows. A 500 milliliter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis. 16.32 grams, 0.065 mol), bis(4-hydroxyphenyl)methane (Aldrich, 14.02 grams, 0.07 mol), potassium carbonate (21.41 grams), anhydrous N,N-dimethylacetamide (100 milliliters), and toluene (100 milliliters) were added to the flask and heated to 175° C. (oil bath temperature) while the volatile toluene component was collected and removed. After 48 hours of heating at 175° C. with continuous stirring, the reaction mixture was Filtered and added to methanol to precipitate the polymer, which was collected by filtration, washed with water, and then washed with methanol. The yield of vacuum dried product, poly(4-CPK-BPM), was 24 grams. The polymer dissolved on heating in N-methylpyrrolidinone, N,N-dimethylacetamide, and 1,1,2, 2-tetrachloroethane. The polymer remained soluble after the solution had cooled to 25° C.

EXAMPLE XIII

The polymer poly(4-CPK-BPM), prepared as described in Example XII, was chloromethylated as follows. A solution of chloromethyl methyl ether (6 mmol/milliliter) in methyl acetate was prepared by adding acetyl chloride (35.3 grams) to a mixture of dimethoxymethane (45 milliliters) and methanol (1.25 milliliters). The solution was diluted with 150 milliliters of 1,1,2,2-tetrachloroethane and then tin tetrachloride (0.3 milliliters) was added. After taking the mixture to reflux using an oil bath set at 110° C., a solution of poly(4-CPK-BPM) (10 grams) in 125 milliliters of 1,1, 2,2-tetrachloroethane was added. Reflux was maintained for 2 hours and then 5 milliliters of methanol were added to quench the reaction. The reaction solution was added to 1 gallon of methanol using a Waring blender to precipitate the product, chloromethylated poly(4-CPK-BPM), which was collected by filtration and vacuum dried. The yield was 9.46 grams of poly(4-CPK-BPM) with 2 chloromethyl groups per polymer repeat unit. The polymer had the following structure:

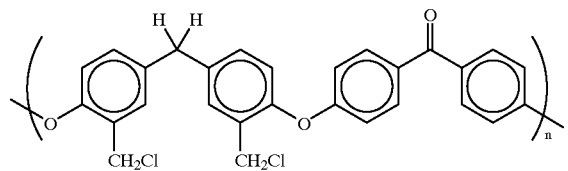

EXAMPLE XIV

A polymer of the formula

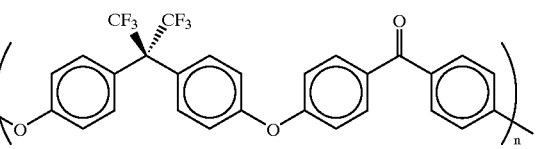

wherein n represents the number of repeating monomer units was prepared as follows. A 500 milliliter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis. 16.32 grams, 0.065 mol), hexafluorobisphenol A (Aldrich, 23.52 grams, 0.07 mol), potassium carbonate (21.41 grams), anhydrous N,N-dimethylacetamide (100 milliliters), and toluene (100 milliliters) were added to the flask and heated to 175° C. (oil bath temperature) while the volatile toluene component was collected and removed. After 48 hours of heating at 175° C. with continuous stirring, the reaction mixture was filtered and added to methanol to precipitate the polymer, which was collected by filtration, washed with water, and then washed with methanol. The yield of vacuum dried product, poly(4-CPK-HFBPA), was 20 grams. The polymer was analyzed by gel permeation chromatography (gpc) (elution solvent was tetrahydrofuran) with the following results: $M_n$ 1,975, $M_{peak}$ 2,281, $M_w$ 3,588, and $M_{z+1}$ 8,918.

EXAMPLE XV

The polymer poly(4-CPK-HFBPA), prepared as described in Example XIV, is chloromethylated by the process described in Example XIII. It is believed that similar results will be obtained.

EXAMPLE XVI

A polymer of the formula

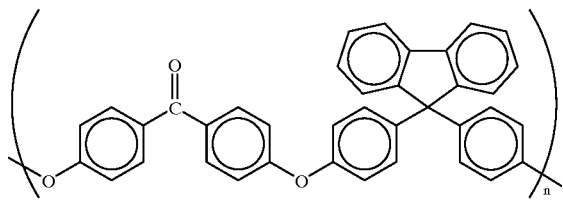

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Difluorobenzophenone (Aldrich Chemical Co., Milwaukee, Wis. 43.47 grams, 0.1992 mol), 9,9'-bis(4-hydroxyphenyl)fluorenone (Ken Seika, Rumson, N.J., 75.06 grams, 0.2145 mol), potassium carbonate (65.56 grams), anhydrous N,N-dimethylacetamide (300 milliliters), and toluene (52 milliliters) were added to the flask and heated to 175° C. (oil bath temperature) while the volatile toluene component was collected and removed. After 5 hours of heating at 175° C. with continuous stirring, the reaction mixture was allowed to cool to 25° C. The solidified mass was treated with acetic acid (vinegar) and extracted with methylene chloride, filtered, and added to methanol to precipitate the polymer, which was collected by filtration, washed with water, and then washed with methanol. The yield of vacuum dried product, poly(4-FPK-FBPA), was 71.7 grams. The polymer was analyzed by gel permeation chromatography (gpc) (elution solvent was tetrahydrofuran) with the following results: $M_n$ 59,100, $M_{peak}$ 144,000, $M_w$ 136,100, $M_z$ 211,350, and $M_{z+1}$ 286,100.

EXAMPLE XVII

A polymer of the formula

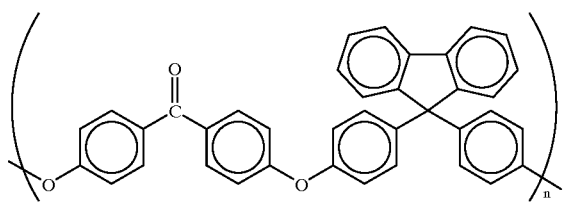

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich Chemical Co., Milwaukee, Wis. 50.02 grams, 0.1992 mol), 9,9'-bis(4-hydroxyphenyl)fluorenone (Ken Seika, Rumson, N.J., 75.04 grams, 0.2145 mol), potassium carbonate (65.56 grams), anhydrous N,N-dimethylacetamide (300 milliliters), and toluene (52 milliliters) were added to the flask and heated to 175° C. (oil both temperature) while the volatile toluene component was collected and removed. After 24 hours of heating at 175° C. with continuous stirring, the reaction mixture was allowed to cool to 25° C. The reaction mixture was filtered and added to methanol to precipitate the polymer, which was collected by filtration, washed with water, and then washed with methanol. The yield of vacuum dried product, poly(4-CPK-FBP), was 60 grams.

EXAMPLE XVIII

The polymer poly(4-CPK-FBP), prepared as described in Example XVII, was chloromethylated as follows. A solution of chloromethyl methyl ether (6 mmol/milliliter) in methyl acetate was prepared by adding acetyl chloride (38.8 grams) to a mixture of dimethoxymethane (45 milliliters) and methanol (1.25 milliliters). The solution was diluted with 100 milliliters of 1,1,2,2-tetrachloroethane and then tin tetrachloride (0.5 milliliters) was added in 50 milliliters of 1,1,2,2-tetrachloroethane. After taking the mixture to reflux using an oil bath set at 100° C., a solution of poly(4-CPK-FBP) (10 grams) in 125 milliliters of 1,1,2,2-tetrachloroethane was added. The reaction temperature was maintained at 100° C. for 1 hour and then 5 milliliters of methanol were added to quench the reaction. The reaction solution was added to 1 gallon of methanol using a Waring blender to precipitate the product, chloromethylated poly(4-CPK-FBP), which was collected by filtration and vacuum dried. The yield was 9.5 grams of poly(4-CPK-FBP) with 1.5 chloromethyl groups per polymer repeat unit. When the reaction was carried out at 110° C. (oil bath set temperature), the polymer gelled within 80 minutes. The polymer had the following structure:

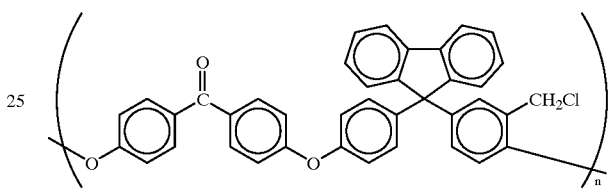

EXAMPLE XIX

A polymer of the formula

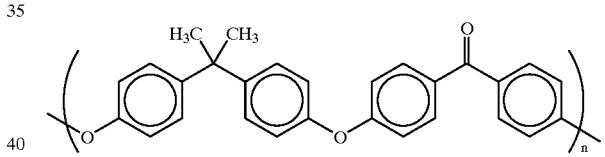

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Difluorobenzophenone (Aldrich Chemical Co., Milwaukee, Wis., 16.59 grams), bisphenol A (Aldrich 14.18 grams, 0.065 mol), potassium carbonate (21.6 grams), anhydrous N,N-dimethylacetamide (100 milliliters), and toluene (30 milliliters) were added to the flask and heated to 175° C. (oil bath temperature) while the volatile toluene component was collected and removed. After 4 hours of heating at 175° C. with continuous stirring, the reaction mixture was allowed to cool to 25° C. The solidified mass was treated with acetic acid (vinegar) and extracted with methylene chloride, filtered, and added to methanol to precipitate the polymer, which was collected by filtration, washed with water, and then washed with methanol. The yield of vacuum dried product, poly(4-FPK-BPA), was 12.22 grams. The polymer was analyzed by gel permeation chromatography (gpc) (elution solvent was tetrahydrofuran) with the following results: $M_n$ 5,158, $M_{peak}$ 15,080, $M_w$ 17,260, and $M_{z+1}$ 39,287. To obtain a lower molecular weight, the reaction can be repeated with a 15 mol % offset in stoichiometry.

EXAMPLE XX

4'-Methylbenzoyl-2,4-dichlorobenzene, of the formula

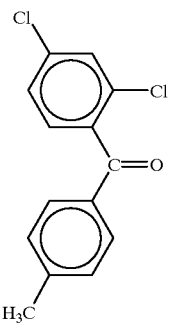

was prepared as follows. To a 2-liter flask equipped with a mechanical stirrer, argon inlet, Dean Stark trap, condenser, and stopper and situated in an oil bath was added toluene (152 grams). The oil bath temperature was raised to 130° C. and 12.5 grams of toluene were removed. There was no indication of water. The flask was removed from the oil bath and allowed to cool to 25° C. 2,4-Dichlorobenzoyl chloride (0.683 mol, 143 grams) was added to form a solution. Thereafter, anhydrous aluminum chloride (0.8175 mol, 109 grams) was added portion-wise over 15 minutes with vigorous gas evolution of hydrochloric acid as determined by odor. The solution turned orange-yellow and then red. The reaction was stirred for 16 hours under argon, and on removing the solvent, a solid lump was obtained. The mass was extracted with methylene chloride (1 liter), which was then dried over potassium carbonate and filtered. The filtrate was concentrated using a rotary evaporator and a vacuum pump to yield an oil which, upon cooling, became a solid crystalline mass. Recrystallization from methanol (1 liter) at −15° C. gave 82.3 grams of 4'-methylbenzoyl-2,4-dichlorobenzene (melting point 55–56° C.) in the first crop, 32 grams of product (from 500 milliliters of methanol) in the second crop, and 16.2 grams of product in the third crop. The total recovered product was 134.7 grams in 65.6% yield.

EXAMPLE XXI

A polymer of the formula

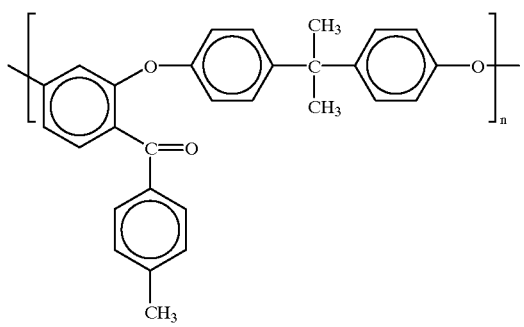

wherein n represents the number of repeating monomer units was prepared as follows. A 250 milliliter, 3-neck round-bottom flask equipped with a Dean-Stark (Barrett) trap, condenser, mechanical stirrer, argon inlet, and stopper was situated in a silicone oil bath. 4'-Methylbenzoyl-2,4-dichlorobenzene (0.0325 mol, 8.6125 grams, prepared as described in Example XX), bis-phenol A (Aldrich 23,965-8, 0.035 mol, 7.99 grams), potassium carbonate (10.7 grams), anhydrous N,N-dimethylacetamide (60 milliliters), and toluene (60 milliliters, 49.1 grams) were added to the flask and heated to 175° C. (oil bath temperature) while the volatile toluene component was collected and removed. After 24 hours of heating at 175° C. with continuous stirring, the reaction product was filtered and the filtrate was added to methanol to precipitate the polymer. The wet polymer cake was isolated by filtration, washed with water, then washed with methanol, and thereafter vacuum dried. The polymer (7.70 grams, 48% yield) was analyzed by gel permeation chromatography (gpc) (elution solvent was tetrahydrofuran) with the following results: $M_n$ 1,898, $M_{peak}$ 2,154, $M_w$ 2,470, $M_z$ 3,220, and $M_{z+1}$ 4,095.

EXAMPLE XXII

Benzoyl-2,4-dichlorobenzene, of the formula

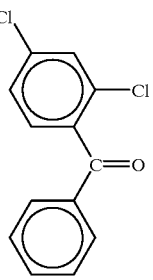

was prepared as follows. To a 2-liter flask equipped with a mechanical stirrer, argon inlet, Dean Stark trap, condenser, stopper and situated in an oil bath was added benzene (200 grams). The oil bath temperature was raised to 100° C. and 19 grams of benzene were removed. There was no indication of water. The flask was removed from the oil bath and allowed to cool to 25° C. 2,4-Dichlorobenzoyl chloride (0.683 mol, 143 grams) was added to form a solution. Thereafter, anhydrous aluminum chloride (0.8175 mol, 109 grams) was added portion-wise over 15 minutes with vigorous gas evolution. Large volumes of hydrochloric acid were evolved as determined by odor. The solution turned orange-yellow and then red. The reaction was stirred for 16 hours under argon and was then added to 1 liter of ice water in a 2-liter beaker. The mixture was stirred until it became white and was then extracted with methylene chloride (1 liter). The methylene chloride layer was dried over sodium bicarbonate and filtered. The filtrate was concentrated using a rotary evaporator and a vacuum pump to yield an oil which, upon cooling, became a solid crystalline mass (154.8 grams). Recrystallization from methanol gave 133.8 grams of benzoyl-2,4-dichlorobenzene as white needles (melting point 41–43° C.) in the first crop.

EXAMPLE XXIII

A polymer of the formula

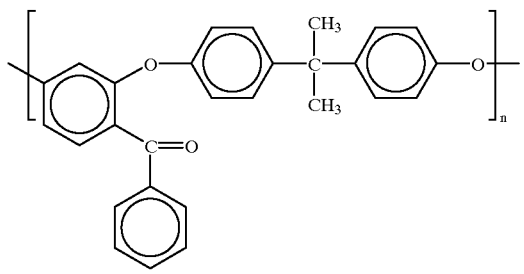

wherein n represents the number of repeating monomer units was prepared by repeating the process of Example XXI except that the 4'-methylbenzoyl-2,4-dichlorobenzene starting material was replaced with 8.16 grams (0.0325 mol) of benzoyl-2,4-dichlorobenzene, prepared as described in Example XXII, and the oil bath was heated to 170° C. for 24 hours.

EXAMPLE XXIV

A polymer of the formula

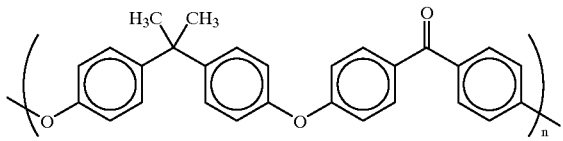

wherein n is about 9 (hereinafter referred to as poly(4-CPK-BPA)) was prepared as follows. A 500 milliliter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 16.32 grams, 0.065 mol), bis-phenol A (Aldrich 23,965–8, 15.98 grams, 0.07 mol), potassium carbonate (21.41 grams), anhydrous N,N-dimethylacetamide (100 milliliters), and toluene (100 milliliters) were added to the flask and heated to 175° C. (oil bath temperature) while the volatile toluene component was collected and removed. After 24 hours of heating at 175° C. with continuous stirring, the reaction mixture was filtered and added to methanol to precipitate a polymer which was collected by filtration, washed with water, and then washed with methanol. The vacuum dried product, poly(4-CPK-BPA), was 10.34 grams that was analyzed by gel permeation chromatography (gpc) (elution solvent was tetrahydrofuran) with the following results: $M_n$ 4464, $M_{peak}$ 7580, $M_w$ 7930, $M_z$ 12,300, and $M_{z+1}$ 16,980. The glass transition temperature of the polymer was 155° C. as determined using differential scanning calorimetry at a heating rate of 20° C. per minute. Solution cast films from methylene chloride were clear, tough, and flexible. As a result of the stoichiometries used in the reaction, it is believed that this polymer had end groups derived from bis-phenol A.

To poly(4-CPK-BPA) (10 grams) thus prepared in chloroform (90 milliliters, extracted with water, dried over Drierite, filtered, and freshly distilled from Drierite) that contained a 50% molar excess of triethylamine (distilled over sodium hydride) was added 4-ethynylbenzoyl chloride (50 mol % excess) in chloroform (10 milliliters) with stirring under argon. After 3 hours, the polymer was added to methanol using a Waring blender to precipitate ethynyl-terminated poly(4-CPK-BPA), which was collected by filtration and was vacuum dried. The polymer was believed to be of the following formula:

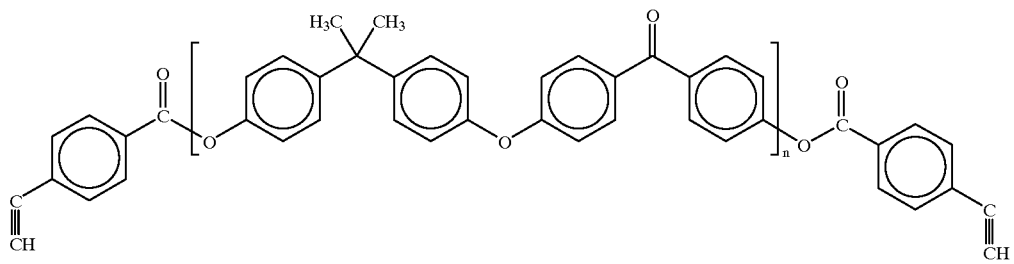

wherein n is about 9.

EXAMPLE XXV

A polymer of the formula

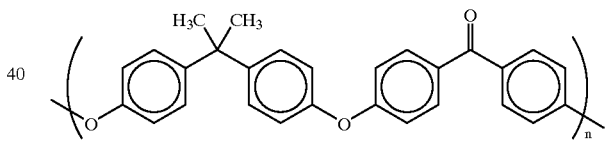

wherein n is about 9 (hereinafter referred to as poly(4-CPK-BPA)) having phenolic end groups is prepared as described in Example XXIV. In a flask equipped with a reflux condenser are placed 0.20 mol of phenol terminated poly(4-CPK-BPA), 0.23 mol of allyl bromide, 0.20 mole of potassium carbonate, and 200 milliliters of N,N-dimethylacetamide. The reaction mixture is heated at 60° C. for 16 hours, cooled, and filtered. The filtrate is added to methanol to precipitate the polymer, poly(4-CPK-BPA) with allyl ether end groups.

To the allyl terminated polymer thus prepared (10 grams) in 200 grams of methylene chloride is added drop-wise m-chloroperoxybenzoic acid (2 equivalents) in 25 grams of methylene chloride over 15 minutes. The reaction solution is magnetically stirred for 16 hours, and then is added to 5% aqueous sodium bicarbonate. The methylene chloride layer is removed using a rotary evaporator, and the polymer that coagulates is dissolved in methylene chloride, precipitated into methanol, filtered and vacuum dried to yield 8 grams of epoxy terminated poly(4-CPK-BPA).

EXAMPLE XXVI

A hydroxy-terminated polyether sulfone is made with a number average molecular weight of 2,800 following the procedure described in V. Percec and B. C. Auman, *Makromol. Chem,* 185, 617 (1984), the disclosure of which is totally incorporated herein by reference. This polymer is chloromethylated as described in V. Percec and B. C. Auman, *Makromol. Chem.,* 185, 2319 (1984), the disclosure of which is totally incorporated herein by reference. The resulting polyether sulfone has 1.5 chloromethyl groups per repeat unit.

EXAMPLE XXVII

Poly(4-CPK-BPA) is made with a number average molecular weight of 2,800 as follows. A 5-liter, 3-neck round-bottom flask equipped with a Dean-Stark (Barrett) trap, condenser, mechanical stirrer, argon inlet, and stopper is situated in a silicone oil bath. 4,4'-Dichlorobenzophenone (Aldrich 11,370, Aldrich Chemical Co., Milwaukee, Wis., 250 grams), bis-phenol A (Aldrich 23,965–8, 244.8 grams), potassium carbonate (327.8 grams), anhydrous N,N-dimethylacetamide (1,500 milliliters), and toluene (275 milliliters) are added to the flask and heated to 175° C. (oil bath temperature) while the volatile toluene component is collected and removed. After hours of heating 30 hours at 175° C. with continuous stirring, the reaction mixture is filtered to remove insoluble salts, and the resultant solution is added to methanol (5 gallons) to precipitate the polymer. The polymer is isolated by filtration, and the wet filter cake is washed with water (3 gallons) and then with methanol (3 gallons). The yield is about 360 grams of vacuum dried polymer. It is believed that if the molecular weight of the polymer is determined by gel permeation chromatography (gpc) (elution solvent was tetrahydrofuran) the following results will be obtained: $M_n$ 2,800, $M_{peak}$ 5,800, $M_w$ 6,500, $M_z$ 12,000 and $M_{z+1}$ 17,700. As a result of the stoichiometries used in the reaction, it is believed that this polymer has end groups derived from bis-phenol A.

The polymer is then chloromethylated as follows. A solution of chloromethyl ether in methyl acetate is made by adding 282.68 grams (256 milliliters) of acetyl chloride to a mixture of dimethoxy methane (313.6 grams, 366.8 milliliters) and methanol (10 milliliters) in a 5-liter 3-neck round-bottom flask equipped with a mechanical stirrer, argon inlet, reflux condenser, and addition funnel. The solution is diluted with 1,066.8 milliliters of 1,1,2,2-tetrachloroethane and then tin tetrachloride (2.4 milliliters) is added via a gas-tight syringe, along with 1,1,2,2-tetrachloroethane (133.2 milliliters) using an addition funnel. The reaction solution is heated to 50° C. and a solution of poly(4-CPK-BPA) (160.8 grams) in 1,1,2,2-tetrachloroethane (1,000 milliliters) is rapidly added. The reaction mixture is then heated to reflux with an oil bath set at 110° C. After four hours reflux with continuous stirring, heating is discontinued and the mixture is allowed to cool to 25° C. The reaction mixture is transferred in stages to a 2 liter round bottom flask and concentrated using a rotary evaporator with gentle heating up to 50° C. and reduced pressure maintained with a vacuum pump trapped with liquid nitrogen. The concentrate is added to methanol (6 gallons) to precipitate the polymer using a Waring blender. The polymer is isolated by filtration and vacuum dried to yield 200 grams of poly(4-CPK-BPA) with 1.5 chloromethyl groups per repeat unit. Solvent free polymer is obtained by reprecipitation of the polymer (75 grams) dissolved in methylene chloride (500 grams) into methanol (3 gallons) followed by filtration and vacuum drying to yield 70.5 grams (99.6% yield) of solvent free polymer. To a solution of the chloromethylated poly(4-CPK-BPA) (192 mmol of chloromethyl groups) in 80 milliliters of dioxane is added 12 grams (46 mmol) of triphenylphosphine. After 15 hours of reflux with mechanical stirring and cooling to 25° C., the polymer solidifies and the mixture is extracted with diethyl ether using a Waring blender. The yellow product is filtered, washed several times with diethyl ether, and vacuum dried. To a solution of triphenylphosphonium chloride salt of chloromethylated poly(4-CPK-BPA) (14 mmol of phosphonium groups) in 200 milliliters of methanol, 2 milliliters of Triton B (40 weight percent aqueous solution) and 11.5 milliliters (140 mmol) of formaldehyde (37 weight percent aqueous solution) are added. The stirred reaction mixture is treated slowly with 36 milliliters of 50 weight percent aqueous sodium hydroxide. A precipitate starts to appear on addition of the first drops of sodium hydroxide solution. After 10 hours of reaction at 25° C., the precipitate is filtered and vacuum dried. The separated polymer is dissolved in methylene chloride, washed several times with water, and then precipitated with methanol. Alternatively, to a solution of solution of 1.8 mmol of phosphonium groups of the triphenylphosphonium chloride salt chloromethylated poly (4-CPK-BPA) in 40 milliliters of methylene chloride at ice-water temperature, 1.6 milliliters (19.5 mmol) of formaldehyde (37 weight percent aqueous solution), and 0.4 milliliters of Triton-B (40 weight percent aqueous solution) is added. The stirred reaction mixture is treated slowly with 5 milliliters (62.5 mmol) of 50 weight percent aqueous sodium hydroxide. After all the hydroxide solution is added, the reaction mixture is allowed to react at 25° C. After 7 hours of reaction, the organic layer is separated, washed with dilute hydrochloric acid, then washed with water, and then precipitated into methanol from chloroform. The polymer has the structure:

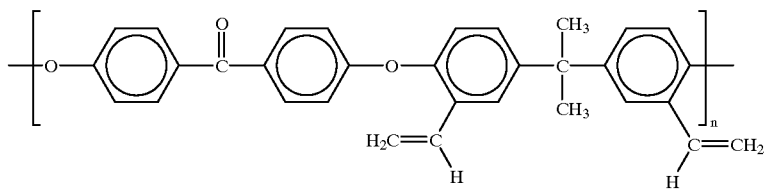

The polymer is then further treated with m-chloroperoxybenzoic acid to form an epoxidized product with the following formula:

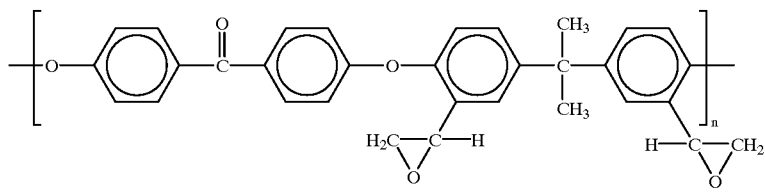

EXAMPLE XXVIII

A solution of poly(4-CPK-BPA) with pendant vinyl groups (prepared as described in Example XXVII, 12.5 mmol of vinyl groups) in 30 milliliters of methylene chloride is cooled in an ice-water bath and titrated with bromine until an orange color persists, indicating addition of bromine across the double bond and conversion of the ethylene groups to 1,2-bromoethyl groups. After 30 minutes of stirring at 25° C., the polymer is precipitated with methanol, filtered, and vacuum dried. To a vigorously stirred mixture of 3 mmol of 1,2-bromoethyl groups of 1,2-dibromoethylated poly(4-CPK-BPA) in 30 milliliters of methylene chloride and 10 milliliters of 50 weight percent aqueous sodium hydroxide at 25° C., 3 grams (9 mmol) of tetrabutylammonium hydroxide are added. An exothermic reaction takes place, indicating generation of NaBr and $H_2O$ and conversion of the 1,2-bromoethyl groups to ethynyl groups. After 1.5 hours of stirring at 25° C., the organic portion is washed with water, dilute hydrochloric acid, then water, and then methanol. The white poly(4-CPK-BPA) is precipitated from methylene chloride into methanol. Alternatively, to a stirred solution at 25° C., 3 mmol of 1,2-dibromoethyl groups of bromoethylated poly(4-CPK-BPA) in 20 milliliters of DMSO, 1.4 grams (12 mmol) of potassium t-butoxide in 5 milliliters of dimethyl sulfoxide is added. The reaction mixture is stirred at 25° C. for 1 hour and then precipitated into methanol, filtered, and vacuum dried. The soluble part of this polymer is extracted with methylene chloride or chloroform and precipitated into methanol. The product has the formula

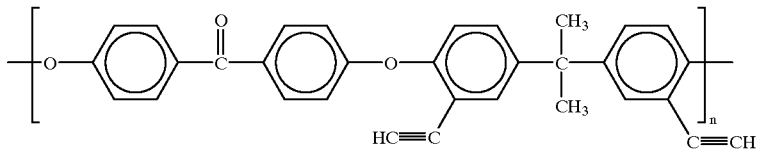

Polymers with the following formulae can also be made by the procedures described hereinabove:

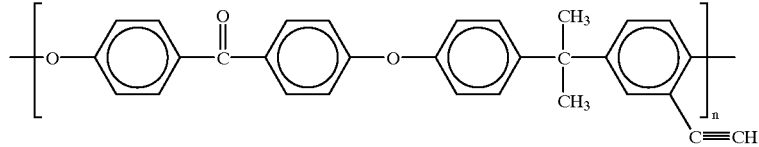

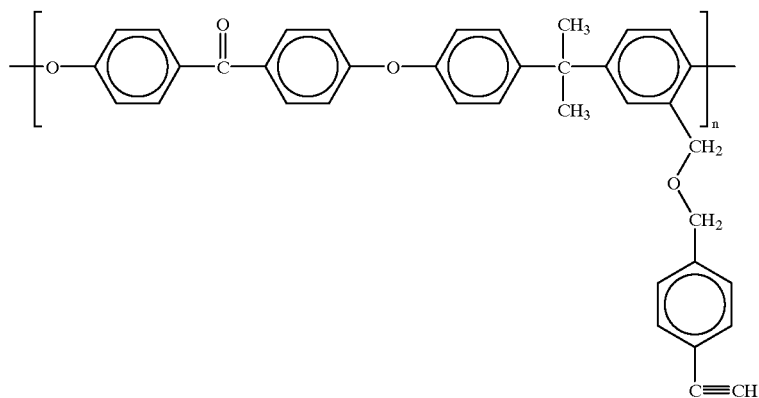

Ethynyl terminated poly(4-CPK-BPA) can be made by substituting poly(4-CPK-BPA) for hydroxy terminated polyether sulfone in the procedures described by V. Percec and B. C. Auman, *Makromol. Chem.*, 185, 1867 (1984), the disclosure of which is totally incorporated herein by reference.

EXAMPLE XXIX 4-bromo-4'-fluorobenzophenone was synthesized by the Friedel-Crafts acylation of fluorobenzene with 4-bromobenzoyl chloride. More specifically, fluorobenzene (117 grams, 1.2 mol) and 4-bromobenzoyl chloride (39.8 grams, 0.18 mol) was charged to a 250 milliliter flask equipped with a mechanical stirrer, $N_2$ inlet, and reflux condenser. The mixture was then cooled to 0° C. and anhydrous $AlCl_3$ (27 grams, 0.20 mol) was added. The mixture was stirred for 15 minutes at 23° C. for 16 hours. The resulting slurry was poured into 2 liters of water acidified with HCl. The organics were extracted with methylene chloride and subsequently dried over $MgSO_4$. The slurry was filtered and the methylene chloride was removed under reduced pressure. Recrystallization from ethanol gave 43.4 grams (86 percent yield) of the desired crystalline product.

4-Fluoro-4'-phenylethynylbenzophenone was synthesized by the cuprous iodide catalyzed coupling of 4-bromo-4'-fluorobenzophenone. More specifically, 4-bromo-4'-fluorobenzophenone (30 grams, 0.11 mol), phenylacetylene (11 grams, 0.11 mol), triphenylphosphine (0.2 gram), cuprous iodide (0.1 gram), bis(triphenylphosphine) palladium dichloride (0.1 gram) and 450 milliliters of triethylamine were charged to a 500 milliliter flask equipped with a mechanical stirrer, $N_2$ inlet, and reflux condenser. The mixture was heated to reflux for 4 hours, cooled to 23° C., and stirred for an additional 16 hours. The mixture was then poured into water acidified with HCl and the precipitate was collected by filtration. Recrystallization from acetone gave 23 grams (75 percent yield) of the desired product.

Phenylethynyl terminated poly(arylene ether) was synthesized in one step by the condensation of bis-phenol-A with difluorobenzophenone and 4-fluoro-4'-phenylethynylbenzophenone in a procedure analogous to that published by R. G. Bryant, B. J. Jensen, and P. M. Hergenrother (Polymer Preprints, 910, 1992) as follows. (Bis-phenol-A and 4,4'-difluorbenzophenone were obtained from Aldrich Chemical Co., Milwaukee, Wis.)

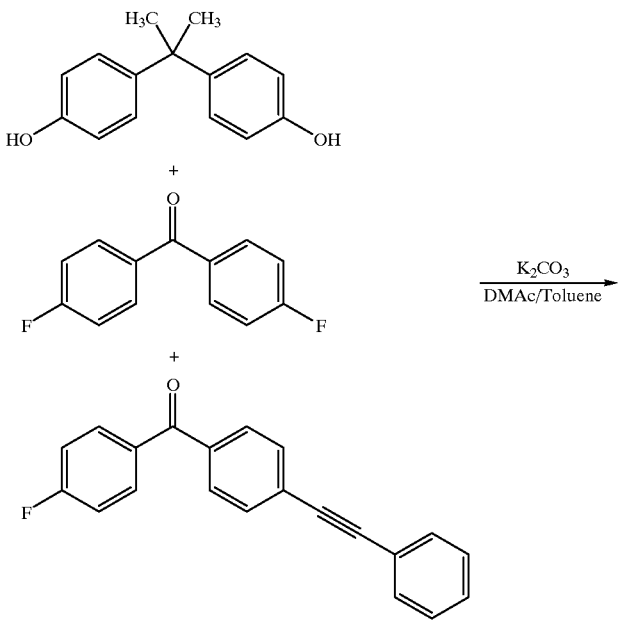

-continued

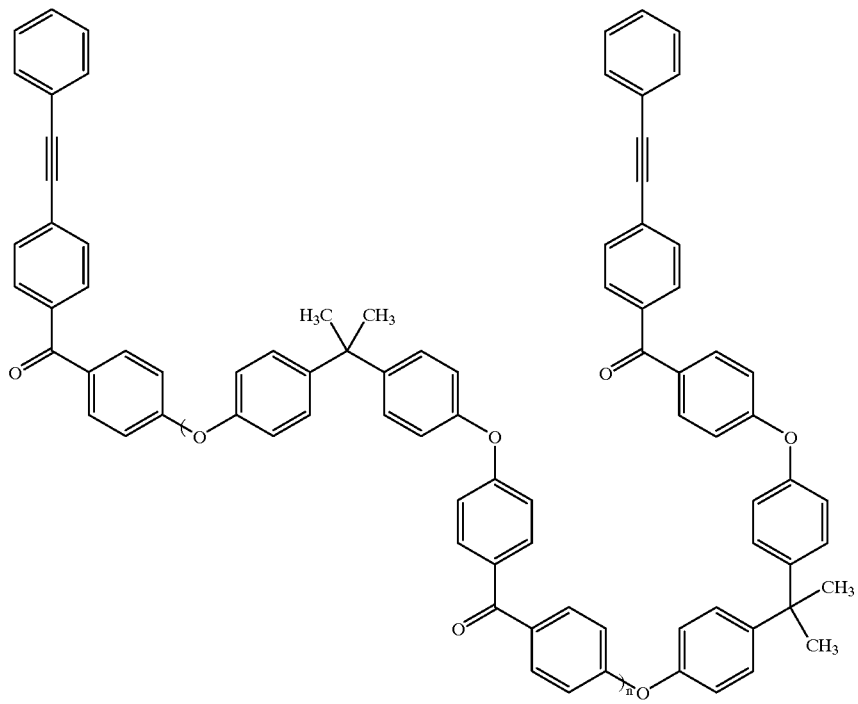

More specifically, bis-phenol-A, difluorobenzophenone, 4-fluoro-4'-phenylethynylbenzophenone, 150 milliliters of N,N-dimethylacetamide, and 20 milliliters of toluene were charged to a 250 milliliter flask equipped with a mechanical stirrer, $N_2$ inlet, Dean-Stark trap, and reflux condenser. The solution was heated to reflux and the toluene/water mixture was removed as an azeotrope. After removal of toluene/water, the reaction mixture was held at 157 to 160° C. for 16 hours. The solution was then cooled to 23° C. and poured into water that had been acidified with HCl. The precipitate was collected by filtration, washed several times with water, and dried in vacuo at 100° C. The polymer was then washed with boiling methanol and dried in vacuo at 120° C. The yield of the polymer was nearly quantitative. The number average molecular weight of the polymer was about 6,000 grams per mole.

EXAMPLE XXX

A heater wafer with a phosphosilicate glass layer is spin coated with a solution of Z6020 adhesion promoter (0.01 weight percent in 95 parts methanol and 5 parts water, available from Dow Corning Co., Midland, Mich.) at 3,000 revolutions per minute for 10 seconds and dried at 100° C. for from 1 to 2 minutes. The wafer is then allowed to cool to ambient temperature (25° C.) for 5 minutes before spin coating the photoresist containing the photopatternable polymer blend onto the wafer at 1,700 revolutions per minute for from 30 to 60 seconds. The resist solution is made by dissolving a blend containing 75/25 by weight polyarylene ether ketone with about 1.5 chloromethyl groups per repeat unit and a weight average molecular weight of 20,000, and Probimer®52 (commercial material obtained as a 2-methoxyethanol/2-ethoxyethanol acetate solution, subsequently precipitated in methanol, isolated, and dried), in γ-butyrolactone at 40 weight percent solids with 1 percent by weight of the amine synergist dimethylamino benzoate. The film is heated (soft baked) in an oven for 15 minutes at 70° C. After cooling to ambient temperature over 5 minutes, the film is covered with a mask and exposed to 365 nanometer ultraviolet light, providing an exposure of 2,500 millijoules per square centimeter. The film is then developed with a developer containing 60:40 weight percent chloroform/cyclohexane, washed with a solution containing 90:10 weight percent hexanes/cyclohexane, and dried at 70° C. for 2 minutes. The processed wafer is transferred to an oven with nitrogen atmosphere at 25° C., and the oven temperature is raised from 25° C. to 90° C. at 2° C. per minute. The temperature is maintained at 90° C. for 2 hours and then increased to 260° C. at 2° C. per minute. The oven temperature is maintained at 260° C. for 2 hours, and the oven is then turned off and the temperature allowed to cool gradually to ambient temperature. Films at 15 microns in thickness have been developed cleanly at a resolution of about 600 dots per inch.

In Examples XXXI through XXXVI, the process for photoexposure and development of the resist is analogous to that described in Example XXX. The specific composition of the resist formulation is detailed in each example. With these various resist formulatons, films 10 to 20 microns in thickness have been developed cleanly at a resolution of 600 dots per inch.

EXAMPLE XXXI

The resist solution is made by dissolving a blend containing 80/20 by weight of polyarylene ether ketone with about 1.5 chloromethyl groups per repeat unit and a weight average molecular weight of 20,000, and epoxy acrylate (Sartomer CN-120), in γ-butyrolactone at 40 weight percent solids with 1 percent by weight of the amine synergist dimethylamino benzoate and 1 percent by weight of an acyl phosphine oxide photoinitiator (Irgacure 1700, obtained from Ciba-Geigy Corporation, Coatings, Radiation Curing and Photography Department, Tarrytown, N.Y.).

EXAMPLE XXXII

The resist solution is made by dissolving a blend containing 50/50 by weight of polyarylene ether ketone with about 1.5 chloromethyl groups per repeat unit and a weight average molecular weight of 20,000, and epoxy novolac acrylate/trimethylol propane triacrylate blend (Sartomer CN112-C60), in γ-butyrolactone at 40 weight percent solids with 1 percent by weight of the amine synergist dimethylamino benzoate and 1 percent by weight of an acyl phosphine oxide photoinitiator (Irgacure 1700, obtained from Ciba-Geigy Corporation, Coatings, Radiation Curing and Photography Department, Tarrytown, N.Y.).

EXAMPLE XXXIII

The resist solution is made by dissolving a blend containing 75/25 by weight of phenylethynyl-terminated poly (arylene ether ketone), and Probimer®52 (commercial material, obtained as a 2-methoxyethanol/2-ethoxyethanol acetate solution, subsequently precipitated in methanol, isolated, and dried), in γ-butyrolactone at 40 weight percent solids with 1 percent by weight of the amine synergist dimethylamino benzoate and 1 percent by weight of an acyl phosphine oxide photoinitiator (Irgacure 1700, obtained from Ciba-Geigy Corporation, Coatings, Radiation Curing and Photography Department, Tarrytown, N.Y.).

EXAMPLE XXXIV

The resist solution is made by dissolving a blend containing 50/50 by weight of phenylethynyl-terminated poly (arylene ether ketone), and an epoxy novolac acrylate/trimethylol propane triacrylate blend (Sartomer CN112C60), in γ-butyrolactone at 40 weight percent solids with 1 percent by weight of the amine synergist dimethylamino benzoate and 1 percent by weight of an acyl phosphine oxide photoinitiator (Irgacure 1700, obtained from Ciba-Geigy Corporation, Coatings, Radiation Curing and Photography Department, Tarrytown, N.Y.).

EXAMPLE XXXV

The resist solution is made by dissolving a blend containing 75/25 by weight of epoxy cresol novolac resin (ECN1299, obtained from Ciba Matrix Resins Polymer Division, Hawthorne, N.J.), and Probimer®52 (commercial material, obtained as a 2-methoxyethanol/2-ethoxyethanol acetate solution, subsequently precipitated in methanol, isolated, and dried), in γ-butyrolactone at 40 weight percent solids with 1 percent by weight of the amine synergist dimethylamino benzoate and 1 percent by weight of an acyl phosphine oxide photoinitiator (Irgacure 1700, obtained from Ciba-Geigy Corporation, Coatings, Radiation Curing and Photography Department, Tarrytown, N.Y.).

EXAMPLE XXXVI

The resist solution is made by dissolving a blend containing 75/25 by weight of novolac resin (obtained from Monomer-Polymer and Dajac Laboratories, Inc., Trevose, Pa.), and Probimer®52 (commercial material, obtained as a 2-methoxyethanol/2-ethoxyethanol acetate solution, subsequently precipitated in methanol, isolated, and dried), in γ-butyrolactone at 40 weight percent solids with 1 percent by weight of the amine synergist dimethylamino benzoate and 1 percent by weight of an acyl phosphine oxide photoinitiator (Irgacure 1700, obtained from Ciba-Geigy Corporation, Coatings, Radiation Curing and Photography Department, Tarrytown, N.Y.).

Other embodiments and modifications of the present invention may occur to those of ordinary skill in the art subsequent to a review of the information presented herein; these embodiments and modifications, as well as equivalents thereof, are also included within the scope of this invention.

What is claimed is:

1. A photoexposed and thermally cured composition consisting essentially of a substantially homogeneous blend of (a) at least one crosslinked or chain extended thermally reactive polymer selected from the group consisting of resoles, novolacs, thermally reactive polyarylene ethers, and mixtures thereof, and (b) at least one crosslinked or chain extended photoreactive epoxy resin that is photoreactive in the absence of a photocationic initiator.

2. A photoexposed and thermally cured composition consisting of a substantially homogeneous blend of (a) at least one crosslinked or chain extended thermally reactive polymer selected from the group consisting of resoles, novolacs, thermally reactive polyarylene ethers, and mixtures thereof, and (b) at least one crosslinked or chain extended photoreactive epoxy resin that is photoreactive in the absence of a photocationic initiator.

3. A photoexposed and thermally cured composition comprising a substantially homogeneous blend of (a) at least one crosslinked or chain extended thermally reactive polymer selected from the group consisting of resoles, novolacs, thermally reactive polyarylene ethers, and mixtures thereof, wherein the thermally reactive polymer has thermal sensitivity imparting groups selected from the group consisting of hydroxymethyl groups, halomethyl groups, acetoxymethylene groups, ethynyl groups, benzocyclobutene groups, mixtures of phenolic groups and halomethyl or hydroxymethyl groups, maleimide groups, biphenylene groups, nadimido groups, and mixtures thereof, and (b) and at least one crosslinked or chain extended photoreactive epoxy resin that is photoreactive in the absence of a photocationic initiator, wherein the photoreactive epoxy resin is of the formula

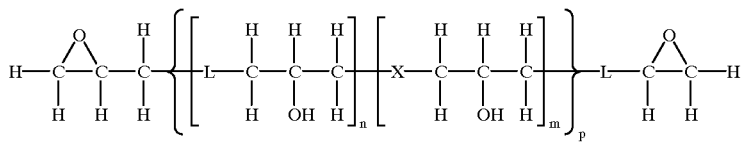

wherein L is

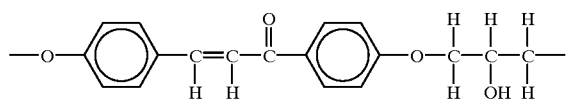

X is

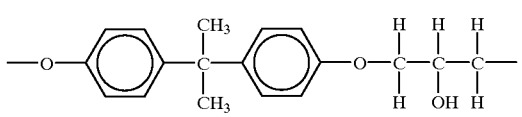

n is an integer representing the number of repeat glycidyl chalcone monomer units, m is an integer representing the number of repeat glycidyl bis-phenol monomer units, and p is an integer of 0 or 1.

4. A composition according to claim 3 wherein the composition is substantially free of cationic photoinitiators.

5. A photoexposed and thermally cured composition comprising a substantially homogeneous blend of (a) at least one crosslinked or chain extended thermally reactive polymer of the general formula

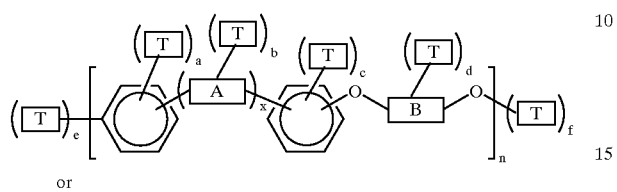

or

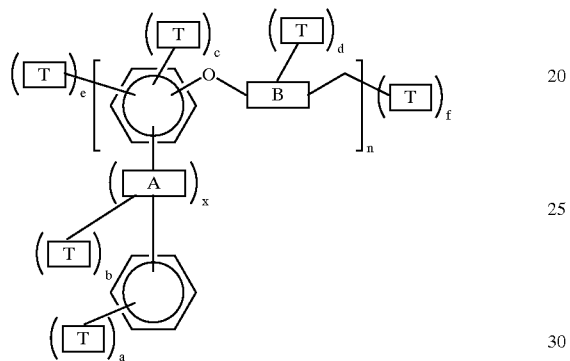

wherein x is an integer of 0 or 1, A is

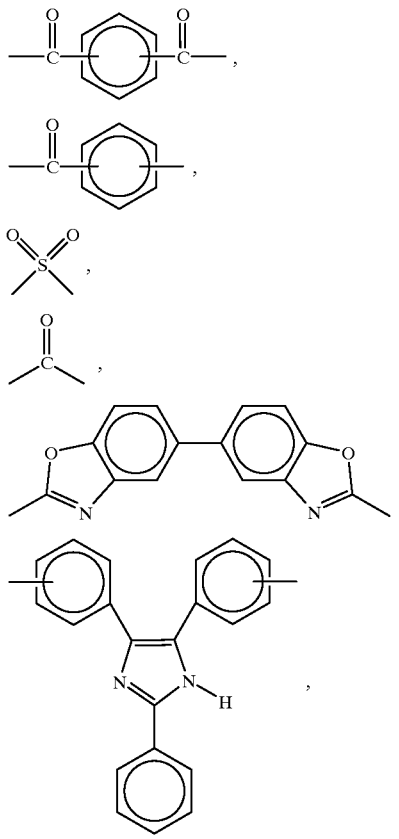

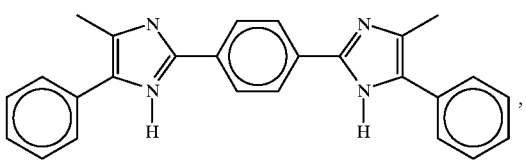

—O—,

—C(CH$_3$)$_2$—, or mixtures thereof, B is

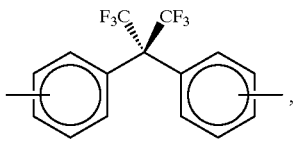

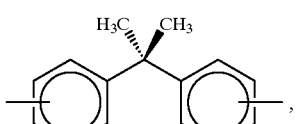

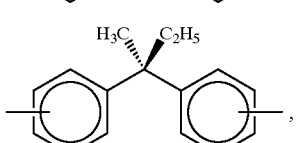

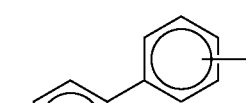

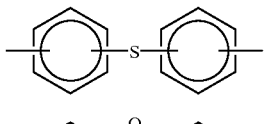

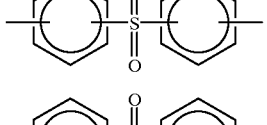

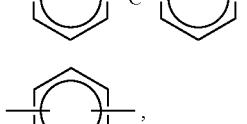

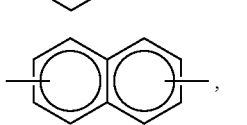

-continued

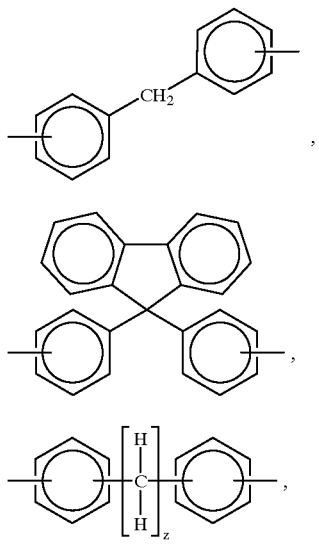

wherein z is an integer of from 2 to about 20,

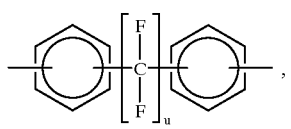

wherein u is an integer of from 1 to about 20,

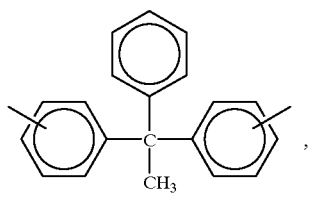

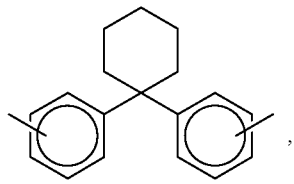

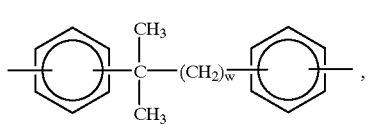

wherein w is an integer of from 1 to about 20,

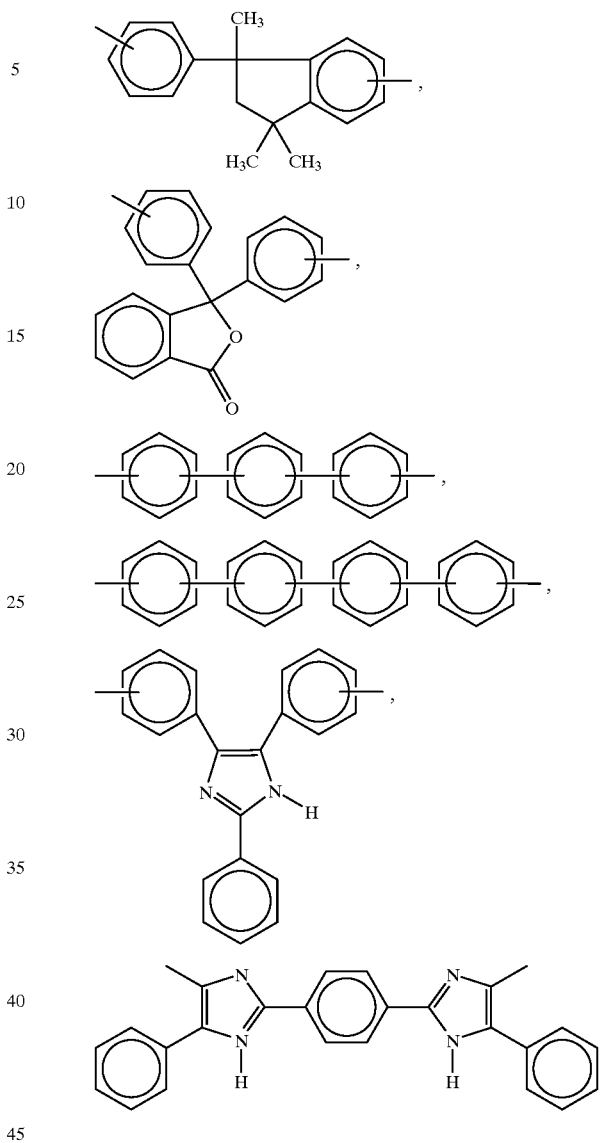

or mixtures thereof, n is an integer representing the number of repeating monomer units, T is a functional group which imparts thermal sensitivity to the polymer, a, b, c, and d are each integers of 0, 1, 2, 3, or 4, and i and j are each integers of 0 or 1, provided that either (1) at least one of a, b, c, and d is equal to or greater than 1 in at least some of the monomer repeat units of the polymer, or (2) at least one of i and j is equal to 1, provided that the entire polymer contains at least 1 thermal sensitivity-imparting group, and (b) and at least one crosslinked or chain extended photoreactive epoxy resin that is photoreactive in the absence of a photocationic initiator.

6. A composition according to claim 5 wherein the photoreactive epoxy resin is selected from the group consisting of (a) those of the general formula

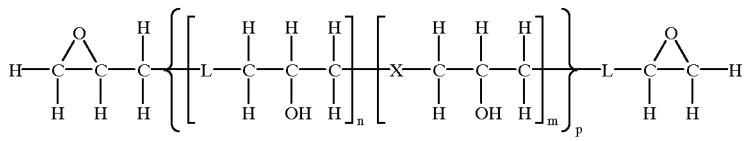

wherein L is

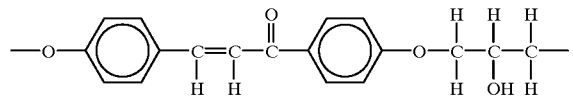

X is

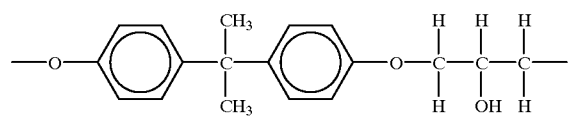

n is an integer representing the number of repeat glycidyl chalcone monomer units, m is an integer representing the number of repeat glycidyl bis-phenol monomer units, and p is an integer of 0 or 1; (b) those of the general formula

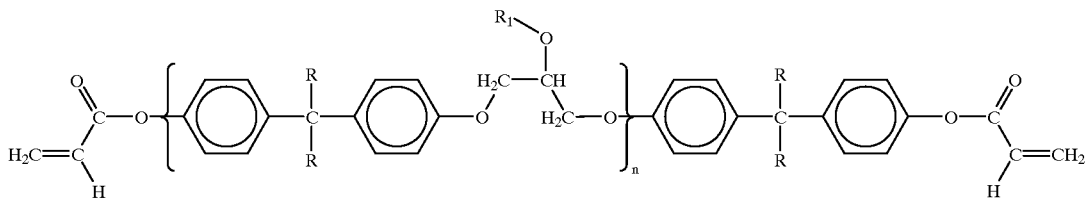

wherein n is an integer representing the number of repeat monomer units, each R, independently of the others, is —$CH_3$ or —$CF_3$, and each $R_1$, independently of the others, is —H or

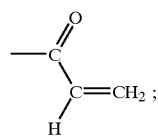

(c) those of the general formula

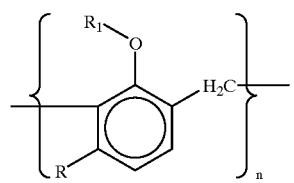

wherein n is an integer representing the number of repeat monomer units, each R, independently of the others, is —H or —$CH_3$, and each $R_1$, independently of the others, is

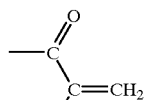

or

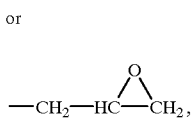

provided that at least one of the $R_1$ groups is

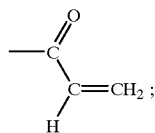

and (d) mixtures thereof.

7. An ink jet printhead which comprises:
(i) an upper substrate, and
(ii) a lower substrate in which one surface thereof has an array of heating elements and addressing electrodes formed thereon, said lower substrate having an insulative layer deposited on the surface thereof and over the heating elements and addressing electrodes and patterned to form recesses therethrough to expose the heating elements and terminal ends of the addressing electrodes, said upper and lower substrates being bonded together to form a thermal ink jet printhead having droplet emitting nozzles defined by the upper substrate, the insulative layer on the lower substrate, and the heating elements in the lower substrate, wherein at least one of said upper substrate and said insulative layer comprises a material formed by crosslinking or chain extending a composition comprising a blend of (a) a thermally reactive polymer selected from the group consisting of resoles, novolacs, thermally reactive polyarylene ethers, and mixtures thereof; and (b) a photoreactive epoxy resin that is photoreactive in the absence of a photocationic initiator.

8. An ink jet printhead according to claim 7 wherein the upper substrate comprises the composition comprising the blend of (a) the thermally reactive polymer selected from the group consisting of resoles, novolacs, thermally reactive polyarylene ethers, and mixtures thereof; and (b) the photoreactive epoxy resin that is photoreactive in the absence of a photocationic initiator.

9. An ink jet printhead according to claim 7 wherein the insulative layer comprises the composition comprising the blend of (a) the thermally reactive polymer selected from the group consisting of resoles, novolacs, thermally reactive polyarylene ethers, and mixtures thereof; and (b) the photoreactive epoxy resin that is photoreactive in the absence of a photocationic initiator.

10. A printhead according to claim 7 wherein the upper substrate has a set of parallel grooves for subsequent use as ink channels and a recess for subsequent use as a manifold, the grooves being open at one end for serving as droplet emitting nozzle, and wherein the upper and lower substrates are aligned, mated, and bonded together to form the printhead with the grooves in the upper substrate being aligned with the heating elements in the lower substrate to form droplet emitting nozzles.

11. A printhead according to claim 7 wherein the upper substrate is substantially flat.

12. A printhead according to claim 3 wherein the thermally reactive polymer has thermal sensitivity imparting groups selected from the group consisting of hydroxymethyl groups, halomethyl groups, acetoxymethylene groups, ethynyl groups, epoxy groups, benzocyclobutene groups, mixtures of phenolic groups and halomethyl or hydroxymethyl groups, maleimide groups, biphenylene groups, nadimido groups, and mixtures thereof.

13. A printhead according to claim 3 wherein the photoreactive epoxy resin has α,β-unsaturated functional groups within the polymer chain or pendant to the polymer chain.

14. A printhead according to claim 7 wherein the photoreactive epoxy resin is selected from the group consisting of (a) those of the general formula

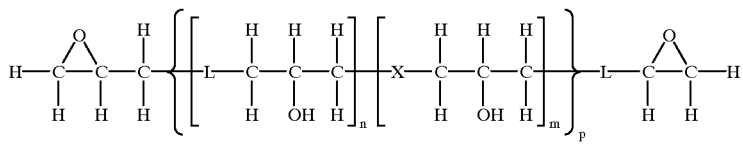

wherein L is

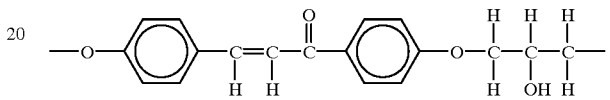

X is

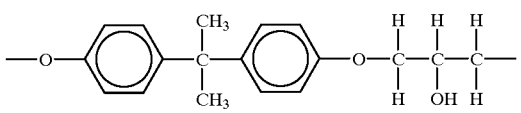

n is an integer representing the number of repeat glycidyl chalcone monomer units, m is an integer representing the number of repeat glycidyl bis-phenol monomer units, and p is an integer of 0 or 1; (b) those of the general formula

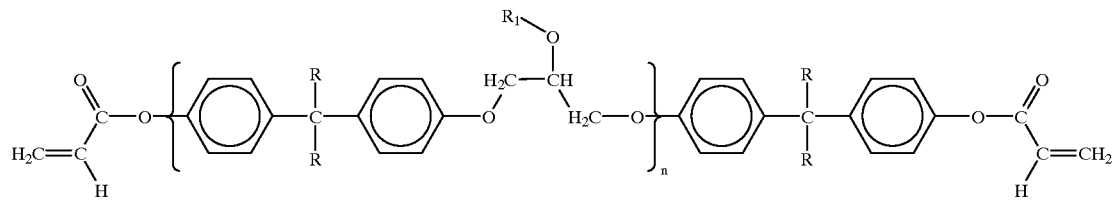

wherein n is an integer representing the number of repeat monomer units, each R, independently of the others, is —CH$_3$ or —CF$_3$, and each R$_1$, independently of the others, is —H or

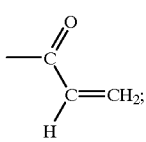

(c) those of the general formula

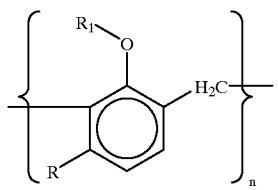

wherein n is an integer representing the number of repeat monomer units, each R, independently of the others, is —H or —CH$_3$, and each R$_1$, independently of the others, is

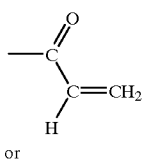

or

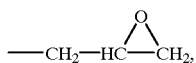

provided that at least one of the R$_1$ groups is

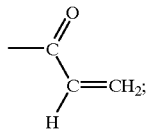

and (d) mixtures thereof.

15. A printhead according to claim 7 wherein the composition is substantially free of cationic photoinitiators.

16. A printhead according to claim 7 wherein the thermally reactive polymer has thermal sensitivity imparting groups selected from the group consisting of hydroxymethyl groups, halomethyl groups, acetoxymethylene groups, ethynyl groups, benzocyclobutene groups, mixtures of phenolic groups and halomethyl or hydroxymethyl groups, maleimide groups, biphenylene groups, nadimido groups, and mixtures thereof.

17. A printhead according to claim 7 wherein the photoreactive epoxy resin is selected from the group consisting of (a) those of the general formula wherein L is

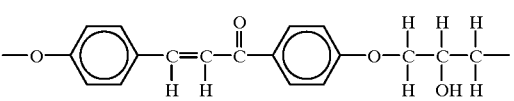

X is

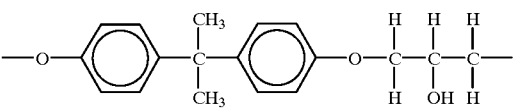

n is an integer representing the number of repeat glycidyl chalcone monomer units, m is an integer representing the number of repeat glycidyl bis-phenol monomer units, and p is an integer of 0 or 1; (b) those of the general formula

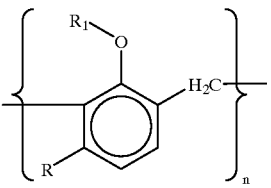

wherein n is an integer representing the number of repeat monomer units, each R, independently of the others, is —H or —CH$_3$, and each R$_1$, independently of the others, is

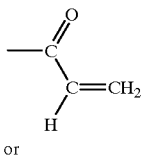

or

—CH$_2$—HC—CH$_2$,

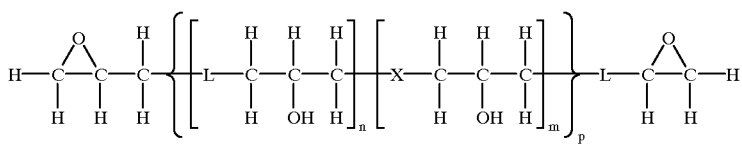

provided that at least one of the $R_1$ groups is

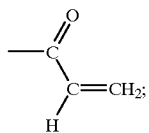

and (c) mixtures thereof.

18. A printhead according to claim 7 wherein the photoreactive epoxy resin is of the general formula

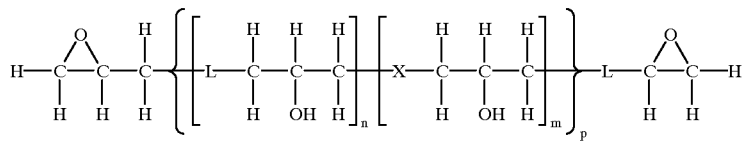

wherein L is

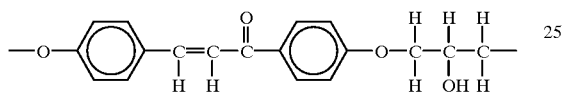

X is

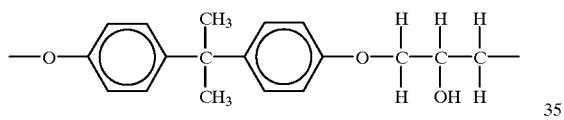

n is an integer representing the number of repeat glycidyl chalcone monomer units, m is an integer representing the number of repeat glycidyl bis-phenol monomer units, and p is an integer of 0 or 1.

19. A printhead according to claim 7 wherein the thermally reactive polymer is of the general formula

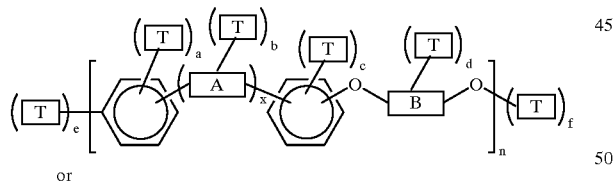

or

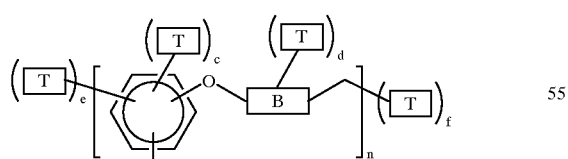

wherein x is an integer of 0 or 1, A is

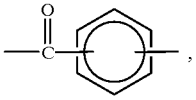

-continued

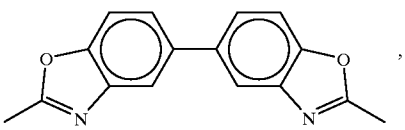

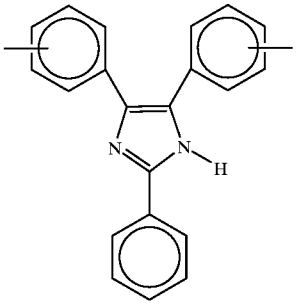

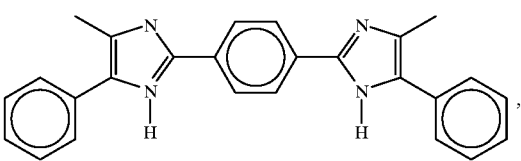

—O—,

—C(CH$_3$)$_2$—, or mixtures thereof, B is

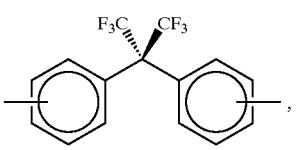

-continued
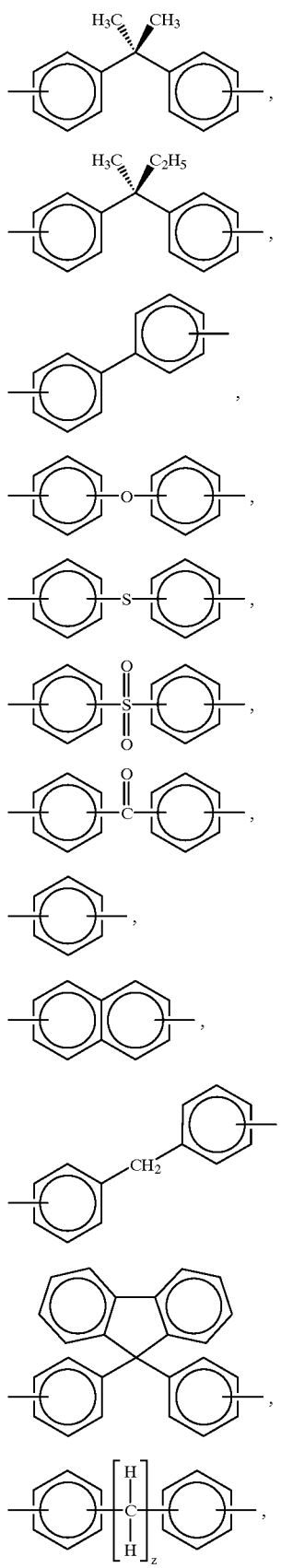
wherein z is an integer of from 2 to about 20,
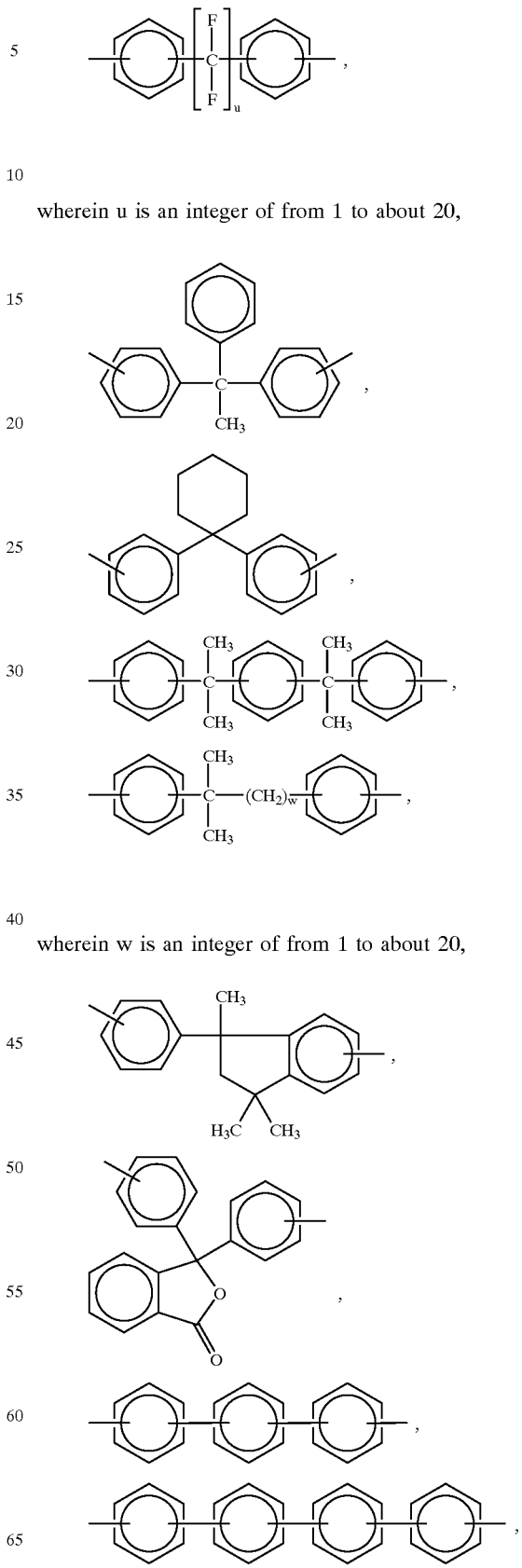
wherein u is an integer of from 1 to about 20,
wherein w is an integer of from 1 to about 20, -continued

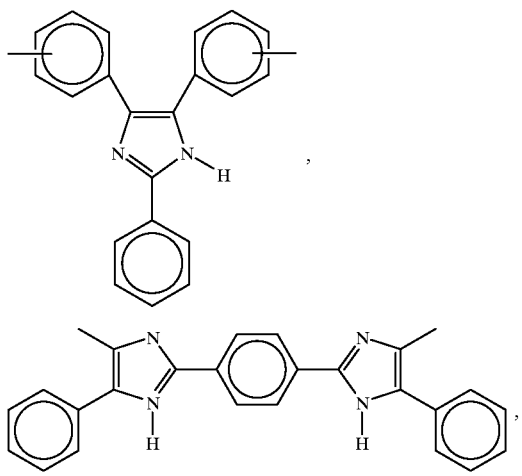

or mixtures thereof, n is an integer representing the number of repeating monomer units, T is a functional group which imparts thermal sensitivity to the polymer, a, b, c, and d are each integers of 0, 1, 2, 3, or 4, and i and j are each integers of 0 or 1, provided that either (1) at least one of a, b, c, and d is equal to or greater than 1 in at least some of the monomer repeat units of the polymer, or (2) at least one of i and j is equal to 1, provided that the entire polymer contains at least 1 thermal sensitivity-imparting group.

20. An ink jet printhead which comprises:

(i) an upper substrate, and (ii) a lower substrate in which one surface thereof has an array of heating elements and addressing electrodes formed thereon, said lower substrate having an insulative layer deposited on the surface thereof and over the heating elements and addressing electrodes and patterned to form recesses therethrough to expose the heating elements and terminal ends of the addressing electrodes, said upper and lower substrates being bonded together to form a thermal ink jet printhead having droplet emitting nozzles defined by the upper substrate, the insulative layer on the lower substrate, and the heating elements in the lower substrate, wherein at least one of said upper substrate and said insulative layer comprises a material formed by crosslinking or chain extending a composition consisting essentially of a blend of (a) a thermally reactive polymer selected from the group consisting of resoles, novolacs, thermally reactive polyarylene ethers, and mixtures thereof; (b) a photoreactive epoxy resin that is photoreactive in the absence of a photocationic initiator; (c) an optional solvent; (d) an optional sensitizer; (e) an optional photoinitiator; and (f) an optional inhibitor.

21. An ink jet printhead which comprises:

(i) an upper substrate, and (ii) a lower substrate in which one surface thereof has an array of heating elements and addressing electrodes formed thereon, said lower substrate having an insulative layer deposited on the surface thereof and over the heating elements and addressing electrodes and patterned to form recesses therethrough to expose the heating elements and terminal ends of the addressing electrodes, said upper and lower substrates being bonded together to form a thermal ink jet printhead having droplet emitting nozzles defined by the upper substrate, the insulative layer on the lower substrate, and the heating elements in the lower substrate, wherein at least one of said upper substrate and said insulative layer comprises a material formed by crosslinking or chain extending a composition consisting of a blend of (a) a thermally reactive polymer selected from the group consisting of resoles, novolacs, thermally reactive polyarylene ethers, and mixtures thereof; (b) a photoreactive epoxy resin that is photoreactive in the absence of a photocationic initiator; (c) an optional solvent; (d) an optional sensitizer; (e) an optional photoinitiator and (f) an optional inhibitor.

* * * * *